United States Patent
Cho et al.

(10) Patent No.: US 11,024,693 B2
(45) Date of Patent: Jun. 1, 2021

(54) FLEXIBLE DISPLAY AND ELECTRONIC DEVICE INCLUDING SAME

(71) Applicant: Samsung Electronics Co., Ltd., Suwon-si (KR)

(72) Inventors: Joung-Min Cho, Seoul (KR); Jong-Kon Bae, Seoul (KR); Kyongrok Kang, Suwon-si (KR); Dong Hun Kim, Seoul (KR); Taesung Kim, Suwon-si (KR); Hyunchang Shin, Seongnam-si (KR); Jungchul An, Yongin-si (KR); Song Hee Jung, Suwon-si (KR); Kwang-Tai Kim, Suwon-si (KR); Hyungsup Byeon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/497,419

(22) PCT Filed: Mar. 14, 2018

(86) PCT No.: PCT/KR2018/002977
§ 371 (c)(1),
(2) Date: Sep. 24, 2019

(87) PCT Pub. No.: WO2018/174459
PCT Pub. Date: Sep. 27, 2018

(65) Prior Publication Data
US 2020/0044003 A1  Feb. 6, 2020

(30) Foreign Application Priority Data
Mar. 24, 2017 (KR) .................. 10-2017-0037811

(51) Int. Cl.
*G06F 3/041* (2006.01)
*H01L 27/32* (2006.01)
(Continued)

(52) U.S. Cl.
CPC ........ *H01L 27/3267* (2013.01); *G06F 3/0416* (2013.01); *G06F 3/0488* (2013.01);
(Continued)

(58) Field of Classification Search
CPC ........................... G06F 1/1641; G06F 1/1652
See application file for complete search history.

(56) References Cited

U.S. PATENT DOCUMENTS 9,793,334 B2 * 10/2017 Park .................. H01L 51/5253
10,714,558 B2 *  7/2020 Kwon ................ H01L 51/5012
(Continued)

FOREIGN PATENT DOCUMENTS

JP        2009031448 A    2/2009
KR   10-2012-0010529 A    2/2012
(Continued)

OTHER PUBLICATIONS

ISA/KR, International Search Report and Written Opinion of the International Searching Authority, International Application No. PCT/KR2018/002977, dated Jun. 25, 2018, 24 pages.

*Primary Examiner* — William Boddie
*Assistant Examiner* — Jeffrey Parker

(57) ABSTRACT

According to an embodiment of the present invention, an electronic device may comprise a housing and a display received in at least a portion of the housing, wherein the display comprises: a flexible substrate; a first light-emitting unit which is disposed on a first area of the substrate, has a first attribute, and includes a plurality of first pixels; and a second light-emitting unit which is disposed on a second area of the substrate, has a second attribute different from the first attribute, and includes a plurality of second pixels. Various other embodiments are also possible.

17 Claims, 29 Drawing Sheets

(51) Int. Cl.
*G06F 3/0488* (2013.01)
*G09G 3/34* (2006.01)
*H01L 51/00* (2006.01)
*H04M 1/02* (2006.01)

(52) U.S. Cl.
CPC ......... *G09G 3/342* (2013.01); *H01L 51/0097* (2013.01); *G06F 2203/04102* (2013.01); *G09G 2360/144* (2013.01); *H01L 27/323* (2013.01); *H04M 1/0268* (2013.01)

(56) References Cited

U.S. PATENT DOCUMENTS

| | | |
|---|---|---|
| 2009/0027306 A1 | 1/2009 | Kawabe |
| 2015/0062525 A1 | 3/2015 | Hirakata |
| 2015/0325804 A1 | 11/2015 | Lindblad |
| 2016/0252933 A1 | 9/2016 | Myers |
| 2016/0360607 A1 | 12/2016 | Li |
| 2017/0011210 A1* | 1/2017 | Cheong .................. G06F 21/32 |
| 2017/0069299 A1 | 3/2017 | Kwak et al. |
| 2019/0212781 A1* | 7/2019 | Fujimoto ............. G06F 1/1641 |

FOREIGN PATENT DOCUMENTS

| | | |
|---|---|---|
| KR | 10-2016-0046874 A | 4/2016 |
| KR | 10-2017-0005019 A | 1/2017 |
| KR | 10-2017-0028193 A | 3/2017 |
| WO | 2016110105 A1 | 7/2016 |

* cited by examiner

FLEXIBLE DISPLAY AND ELECTRONIC DEVICE INCLUDING SAME

CROSS-REFERENCE TO RELATED APPLICATIONS

This application is a 371 National Stage of International Application No. PCT/KR2018/002977, filed Mar. 14, 2018, which claims priority to Korean Patent Application No. 10-2017-0037811, filed Mar. 24, 2017, the disclosures of which are herein incorporated by reference in their entirety.

BACKGROUND

1. Field

Various embodiments of the disclosure relate to a flexible display and an electronic device including the same.

2. Description of Related Art

With the development of computers and the Internet, electronic devices have been provided as information devices in which artificial intelligence and network technology are integrated. As information devices are developed and are becoming more various, a ubiquitous society, in which networks can be accessed and resources can be used conveniently anywhere and at any time, is becoming actualized. Displays for showing information are necessarily mounted on such electronic devices, and thus the display industry holds a critical position in the ubiquitous society.

SUMMARY

With an increasing number of users preferring a large screen, electronic devices having large-sized displays mounted thereon have come to be provided. However, the increasing size of displays increases the size of electronic devices and thus may reduce the portability and usability of the electronic devices. Further, since electronic components for implementing various functions are arranged in an electronic device together with a display, there is a difficulty in installing a display for a larger screen on the electronic device without increasing the size of the electronic device.

Various embodiments of the disclosure may provide a flexible display capable of easily increasing a screen size along the outer surface of an electronic device, and an electronic device including the same.

Various embodiments of the disclosure may provide a flexible display allowing multiple screens to be easily installed along the outer surface of an electronic device, and an electronic device including the same.

Various embodiments of the disclosure may provide a flexible display to be installed at an electronic device in a bending manner or in a wrap-around manner, and an electronic device including the same.

Various embodiments of the disclosure may provide: a flexible display configured to efficiently arrange electronic components (e.g. a display driver IC (DDI)), installed in a non-screen region of the flexible display, in the limited space of an electronic device when the flexible display is installed at the electronic device in a bending manner or in a wrap-around manner; and an electronic device including the same.

According to one embodiment of the disclosure, an electronic device includes: a housing; and a display received in at least a part of the housing, wherein the display may include: a flexible substrate; a first light-emitting unit which is disposed in a first region on the substrate, has a first attribute, and includes multiple first pixels; and a second light-emitting unit which is disposed in a second region on the substrate, has a second attribute different from the first attribute, and includes multiple second pixels.

A flexible display according to various embodiments of the disclosure may make it easy to form multiple screens or increase the screen size while decreasing the size of an electronic device. According to various embodiments of the disclosure, the flexible display may include a non-screen region formed at one side thereof, and electronic components, such as a DDI, arranged in the non-screen region. The flexible display is designed to have a structure in which, when the flexible display is installed at an electronic device, the non-screen region is bent or folded to allow the electronic components to be arranged in the inner space of the electronic device. Therefore, the flexible display makes it possible to easily increase the size of a screen while decreasing the size of the electronic device, and to efficiently arrange the electronic components in a limited space.

BEST MODE FOR CARRYING OUT THE INVENTION

Figure 1:
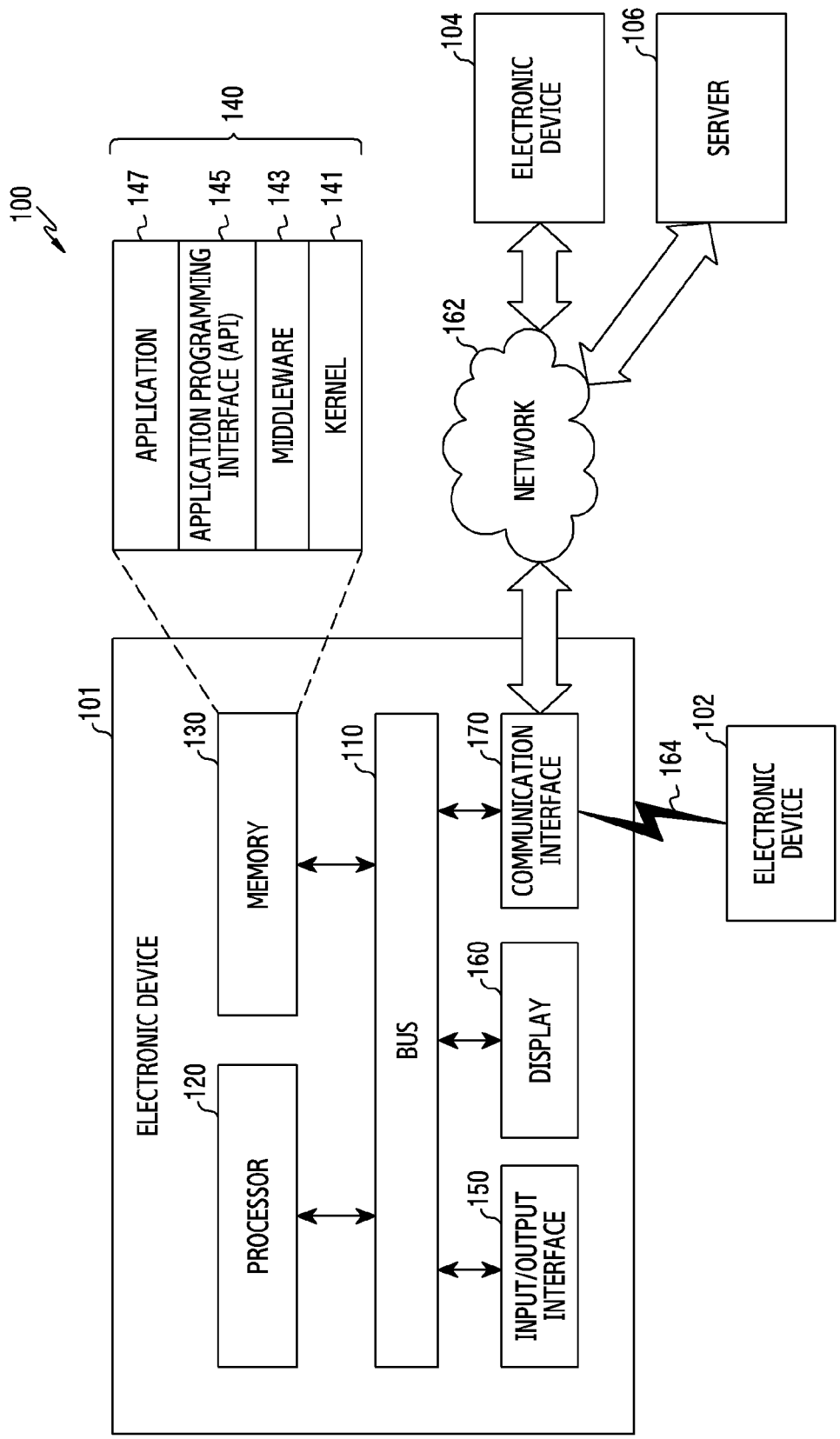
FIG. 1 is a block diagram of a network environment system according to one embodiment.

Hereinafter, various embodiments of the present disclosure are disclosed with reference to the accompanying drawings. However, the present disclosure is not intended to be limited by the various embodiments of the present disclosure to a specific embodiment and it is intended that the present disclosure covers all modifications, equivalents, and/or alternatives of the present disclosure provided they come within the scope of the appended claims and their equivalents. With respect to the descriptions of the accompanying drawings, like reference numerals refer to like elements. The terms of a singular form may include plural forms unless they have a clearly different meaning in the context. As used herein, the expressions "A or B" or "at least one of A and/or B" may include any one of or all possible combinations of items enumerated together in a corresponding one of the expressions. As used herein, such terms as "1st" and "2nd," or "first" and "second" may be used to simply distinguish a corresponding component from another, and does not limit the components in other aspect (e.g., importance or order). It is intended that when a component (for example, a first component) is referred to as being "operatively or communicatively coupled with/to" or "connected to" another component (for example, a second component), the component may be directly connected to the other component or connected through another component (for example, a third component).

The expression "configured to" used in various embodiments of the present disclosure may be interchangeably used with "suitable for," "having the capacity to," "designed to," "adapted to," "made to," or "capable of" according to the situation, for example. The term "configured to" may not necessarily indicate "specifically designed to" in terms of hardware. Instead, the expression "a device configured to" in some situations may indicate that the device and another device or part are "capable of." For example, the expression "a processor configured to perform A, B, and C" may indicate a dedicated processor (for example, an embedded processor) for performing a corresponding operation or a general purpose processor (for example, a central processing unit (CPU) or application processor (AP)) for performing corresponding operations by executing at least one software program stored in a memory device.

An electronic device according to various embodiments of the present disclosure may include at least one of a smartphone, a tablet personal computer (PC), a mobile phone, a video telephone, an electronic book reader, a desktop PC, a laptop PC, a netbook computer, a workstation, a server, a personal digital assistant (PDA), a portable multimedia player (PMP), a Motion Picture Experts Group (MPEG-1 or MPEG-2) Audio Layer 3 (MP3) player, a mobile medical device, a camera, or a wearable device. The wearable device may include at least one of an accessory-type device (e.g., a watch, a ring, a bracelet, an anklet, a necklace, glasses, a contact lens, a head-mounted device (HMD)), a textile- or clothing-integrated-type device (e.g., an electronic apparel), a body-attached-type device (e.g., a skin pad or a tattoo), or a bio-implantable-type device (e.g., an implantable circuit). In some various embodiments of the present disclosure, an electronic device may include at least one of, for example, a television (TV), a digital video/versatile disc (DVD) player, an audio, a refrigerator, an air conditioner, a cleaner, an oven, a microwave oven, a washing machine, an air cleaner, a set-top box, a home automation control panel, a security control panel, a media box (e.g., Samsung HomeSync™, Apple TV™, or Google TV™), a game console (e.g., Xbox™ or PlayStation™), an electronic dictionary, an electronic key, a camcorder, or an electronic picture frame.

In other various embodiments of the present disclosure, an electronic device may include at least one of various medical devices (e.g., various portable medical measurement devices (e.g., a blood glucose measuring device, a heart rate measuring device, a blood pressure measuring device, a body temperature measuring device, or the like), a magnetic resonance angiography (MRA), a magnetic resonance imaging (MRI), a computed tomography (CT), a scanner, an ultrasonic device, or the like), a navigation device, a global navigation satellite system (GNSS), an event data recorder (EDR), a flight data recorder (FDR), a vehicle infotainment device, electronic equipment for vessels (e.g., a navigation system, a gyrocompass, or the like), avionics, a security device, a head unit for a vehicle, an industrial or home robot, a drone, an automatic teller machine (ATM), a point of sales (POS) device of a store, or an Internet of things (IoT) device (e.g., a light bulb, various sensors, an electric or gas meter, a sprinkler, a fire alarm, a thermostat, a streetlamp, a toaster, exercise equipment, a hot water tank, a heater, a boiler, or the like) According to various embodiments of the present disclosure, an electronic device may include at least one of a part of furniture, a building/structure or a vehicle, an electronic board, an electronic signature receiving device, a projector, or a measuring instrument (e.g., a water meter, an electricity meter, a gas meter, a wave meter, or the like). An electronic device may be one or more combinations of the above-mentioned devices. An electronic device according to some various embodiments of the present disclosure may be a flexible device. An electronic device according to an embodiment of the present disclosure is not limited to the above-mentioned devices. The term "user" used herein may refer to a person who uses an electronic device or may refer to a device (e.g., an artificial intelligence electronic device) that uses an electronic device.

An electronic device 101 in a network environment 100 according to various embodiments of the present disclosure will be described with reference to FIG. 1. The electronic device 101 may include a bus 110, a processor 120, a memory 130, an input/output interface 150, a display 160, and a communication interface 170. In various embodiments of the present disclosure, at least one of the foregoing elements may be omitted or another element may be added to the electronic device 101. The bus 110 may include a circuit for connecting the above-mentioned elements 110 to 170 to each other and transferring communications (e.g., control messages and/or data) among the above-mentioned elements. The processor 120 may include at least one of a central processing unit (CPU), an application processor (AP), or a communication processor (CP). The processor 120 may perform data processing or an operation related to communication and/or control of at least one of the other elements of the electronic device 101.

The memory 130 may include a volatile memory and/or a nonvolatile memory. The memory 130 may store instructions or data related to at least one of the other elements of the electronic device 101. According to an embodiment of the present disclosure, the memory 130 may store software and/or a program 140. The program 140 may include, for example, a kernel 141, a middleware 143, an application programming interface (API) 145, and/or an application program (or an application) 147. At least a portion of the kernel 141, the middleware 143, or the API 145 may be referred to as an operating system (OS). The kernel 141 may control or manage system resources (e.g., the bus 110, the processor 120, the memory 130, or the like) used to perform operations or functions of other programs the middleware 143, the API 145, or the application program 147). Furthermore, the kernel 141 may provide an interface for allowing the middleware 143, the API 145, or the application program 147 to access individual elements of the electronic device 101 in order to control or manage the system resources.

The middleware 143 may serve as an intermediary so that API 145 or the application program 147 communicates and exchanges data with the kernel 141. Furthermore, the middleware 143 may handle one or more task requests received from the application program 147 according to a priority order. For example, the middleware 143 may assign at least one application program 147 a priority for using the system resources (e.g., the bus 110, the processor 120, the memory 130, or the like) of the electronic device 101 and may handle the one or more task requests. The API 145, which is an interface for allowing the application 147 to control a function provided by the kernel 141 or the middleware 143, may include, for example, at least one interface or function (e.g., instructions) for file control, window control, image processing, character control, or the like. The input/output interface 150 may serve to transfer an instruction or data input from a user or another external device to (an)other element(s) of the electronic device 101. Furthermore, the input/output interface 150 may output instructions or data received from (an)other element(s) of the electronic device 101 to the user or another external device.

The display 160 may include, for example, a liquid crystal display (LCD), a light-emitting diode (LED) display, an organic light-emitting diode (OLED) display, a microelectromechanical systems (MEMS) display, or an electronic paper display. The display 160 may present various content (e.g., a text, an image, a video, an icon, a symbol, or the like) to the user. The display 160 may include a touch screen, and may receive a touch, gesture, proximity or hovering input from an electronic pen or a part of a body of the user. The communication interface 170 may set communications between the electronic device 101 and an external device (e.g., a first external electronic device 102, a second external electronic device 104, or a server 106). For example, the communication interface 170 may be connected to a network 162 via wireless communications or wired communications so as to communicate with the external device (e.g., the second external electronic device 104 or the server 106).

According to one embodiment, the display 160 may include multiple display panels arranged on one substrate. According to one embodiment, the display 160 may be flexible and may be disposed along at least a part of the exterior of the electronic device 101. For example, the display 160 may include a flexible substrate (e.g. a polyimide (PI) substrate). The display 160 may include a first light-emitting unit (or a first display panel), which is disposed in a first region on the substrate and includes multiple first pixels. The display 160 may include a second light-emitting unit (or a second display panel), which is disposed in the first region on the substrate and includes multiple second pixels. According to various embodiments, the first light-emitting unit may be disposed such that the multiple first pixels have a first resolution. The second light-emitting unit may be disposed such that the multiple second pixels have a second resolution lower than the first resolution. Various embodiments of the display will be described with reference to FIG. 4A and subsequent figures.

The wireless communication may include, for example, cellular communication that uses at least one of LTE, LTE-Advanced (LTE-A), code division multiple access (CDMA), wideband CDMA (WCDMA), universal mobile telecommunications system (UMTS), wireless broadband (WiBro), global system for mobile communications (GSM), or the like. According to an embodiment, the wireless communication may include, for example, at least one of wireless fidelity (Wi-Fi), light fidelity, Bluetooth, Bluetooth low energy (BLE), ZigBee, near field communication (NFC), magnetic secure transmission, radio frequency (RF), and body area network (BAN). According to an embodiment, the wireless communication may include a GNSS. The GNSS may be, for example, a global positioning system (GPS), a global navigation satellite system (Glonass), a Beidou navigation satellite system (hereinafter, referred to as "Beidou"), or Galileo (the European global satellite-based navigation system). Hereinafter, in this document, the term "GPS" may be interchangeable with the term "GNSS". The wired communication may include, for example, at least one of a universal serial bus (USB), a high definition multimedia interface (HDMI), recommended standard 232 (RS-232), power line communication, a plain old telephone service (POTS), or the like. The network 162 may include a telecommunication network, for example, at least one of a computer network (e.g., LAN or WAN), the Internet, and a telephone network.

Each of the first and second external electronic devices 102 and 104 may be of a type that is the same as, or different from, that of the electronic device 101. According to various embodiments, all or a part of operations executed in the electronic device 101 may be performed by another electronic device or a plurality of electronic devices (e.g., the electronic devices 102 and 104, or the server 106). According to an embodiment, when the electronic device 101 has to perform some functions or services automatically or in response to a request, the electronic device 101 may request another device (e.g., the electronic device 102 or 104 or the server 106) to perform at least some functions relating thereto, instead of, or in addition to, performing the functions or services by itself. Another electronic device (e.g., the electronic device 102 or 104, or the server 106) may perform the requested function or additional function, and transfer the result of performing the function to the electronic device 101. The electronic device 101 may provide the received result as it is, or may additionally process the received result to provide the requested functions or services. To this end, for example, cloud computing, distributed computing, or client-server computing technology may be used.

Figure 2:
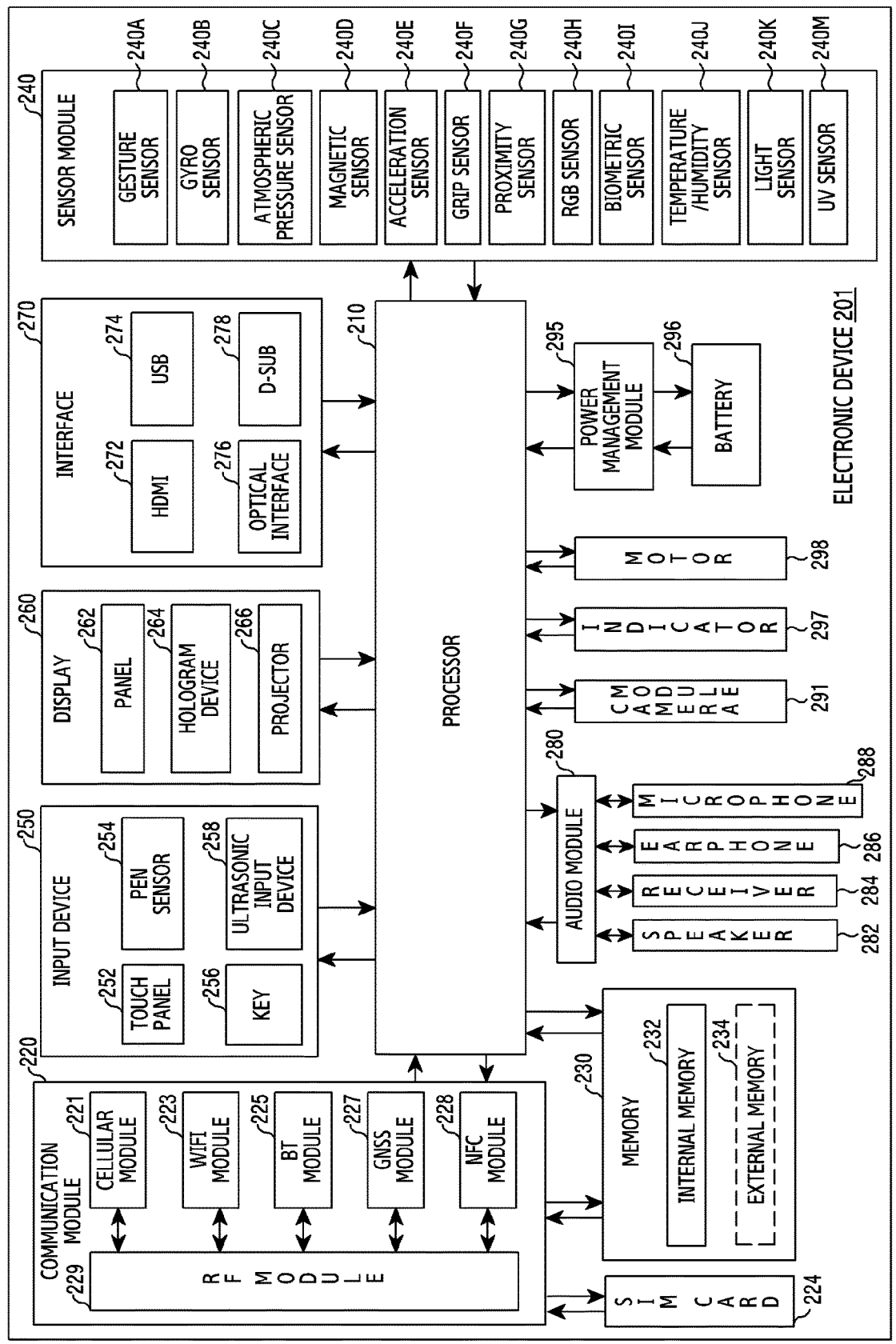
FIG. 2 is a block diagram of an electronic device according to various embodiments.

FIG. 2 is a block diagram illustrating an electronic device according to an embodiment of the present disclosure. An electronic device 201 may include, for example, a part or the entirety of the electronic device 101 illustrated in FIG. 1. The electronic device 201 may include at least one processor (e.g., AP) 210, a communication module 220, a subscriber identification module (SIM) 224, a memory 230, a sensor module 240, an input device 250, a display 260, an interface 270, an audio module 280, a camera module 291, a power management module 295, a battery 296, an indicator 297, and a motor 298.

The processor 210 may run an operating system or an application program so as to control a plurality of hardware or software elements connected to the processor 210, and may process various data and perform operations. The processor 210 may be implemented with, for example, a system on chip (SoC). According to an embodiment of the present disclosure, the processor 210 may further include a graphic processing unit (GPU) and/or an image signal processor. The processor 210 may include at least a portion (e.g., a cellular module 221) of the elements illustrated in FIG. 2. The processor 210 may load, on a volatile memory, an instruction or data received from at least one of other elements (e.g., a nonvolatile memory) to process the instruction or data, and may store various data in a nonvolatile memory.

The communication module 220 may have a configuration that is the same as or similar to that of the communication interface 170 of FIG. 1. The communication module 220 may include, for example, a cellular module 221, a Wi-Fi module 223, a Bluetooth module 225, a GNSS module 227, a NFC module 228, and a radio frequency (RF) module 229. The cellular module 221 may provide, for example, a voice call service, a video call service, a text message service, or an Internet service through a communication network. The cellular module 221 may identify and authenticate the electronic device 201 in the communication network using the subscriber identification module 224 (e.g., a SIM card). The cellular module 221 may perform at least a part of functions that may be provided by the processor 210. The cellular module 221 may include a communication processor (CP). According to some various embodiments of the present disclosure, at least a part (e.g., two or more) of the cellular module 221, the Wi-Fi module 223, the Bluetooth module 225, the GNSS module 227, and the NFC module 228 may be included in a single integrated chip (IC) or IC package. The RF module 229 may transmit/receive, for example, communication signals (e.g., RF signals). The RF module 229 may include, for example, a transceiver, a power amp module (PAM), a frequency filter, a low noise amplifier (LNA), an antenna, or the like. According to another embodiment of the present disclosure, at least one of the cellular module 221, the Wi-Fi module 223, the Bluetooth module 225, the GNSS module 227, or the NFC module 228 may transmit/receive RF signals through a separate RF module. The SIM 224 may include, for example, an embedded SIM and/or a card containing the subscriber identity module, and may include unique identification information (e.g., an integrated circuit card identifier (ICCID)) or subscriber information (e.g., international mobile subscriber identity (IMSI)).

The memory 230 (e.g., the memory 130) may include, for example, an internal memory 232 or an external memory 234. The internal memory 232 may include at least one of a volatile memory (e.g., a dynamic RAM (DRAM), a static RAM (SRAM), a synchronous dynamic RAM (SDRAM), or the like), a nonvolatile memory (e.g., a one-time programmable ROM (OTPROM), a programmable ROM (PROM), an erasable and programmable ROM (EPROM), an electrically erasable and programmable ROM (EEPROM), a mask ROM, a flash ROM, a flash memory (e.g., a NAND flash memory, a NOR flash memory, or the like)), a hard drive, or a solid state drive (SSD). The external memory 234 may include a flash drive such as a compact flash (CF), a secure digital (SD), a Micro-SD, a Mini-SD, an extreme digital (xD), a MultiMediaCard (MMC), a memory stick, or the like. The external memory 234 may be operatively and/or physically connected to the electronic device 201 through various interfaces.

The sensor module 240 may, for example, measure physical quantity or detect an operation state of the electronic device 201 so as to convert measured or detected information into an electrical signal. The sensor module 240 may include, for example, at least one of a gesture sensor 240A, a gyro sensor 240B, an atmospheric pressure sensor 240C, a magnetic sensor 240D, an acceleration sensor 240E, a grip sensor 240F, a proximity sensor 240G, a RGB sensor 240H, a biometric sensor 240I, a temperature/humidity sensor 240J, an illuminance sensor 240K, or an ultraviolet (UV) sensor 240M. Additionally or alternatively, the sensor module 240 may include, for example, an olfactory sensor (E-nose sensor), an electromyography (EMG) sensor, an electroencephalogram (EEG) sensor, an electrocardiogram (ECG) sensor, an infrared (IR) sensor, an iris recognition sensor, and/or a fingerprint sensor. The sensor module 240 may further include a control circuit for controlling at least one sensor included therein. In some various embodiments of the present disclosure, the electronic device 201 may further include a processor configured to control the sensor module 240 as a part of the processor 210 or separately, so that the sensor module 240 is controlled while the processor 210 is in a sleep state.

The input device 250 may include, for example, a touch panel 252, a (digital) pen sensor 254, a key 256, or an ultrasonic input device 258. The touch panel 252 may employ at least one of capacitive, resistive, infrared, and ultraviolet sensing methods. The touch panel 252 may further include a control circuit. The touch panel 252 may further include a tactile layer so as to provide a haptic feedback to a user. The (digital) pen sensor 254 may include, for example, a sheet for recognition which is a part of a touch panel or is separate. The key 256 may include, for example, a physical button, an optical button, or a keypad. The ultrasonic input device 258 may sense ultrasonic waves generated by an input tool through a microphone 288 so as to identify data corresponding to the ultrasonic, waves sensed.

The display 260 (e.g., the display 160) may include a panel 262, a hologram device 264, a projector 266, and/or a control circuit for controlling the same. The panel 262 may be implemented to be, for example, flexible, transparent, or wearable. The panel 262, together with the touch panel 252, may be configured as one or more modules. According to an embodiment, the panel 262 may include a pressure sensor (or a force sensor) which may measure a strength of pressure of a user's touch. The pressure sensor may be implemented to be integrated with the touch panel 252 or may be implemented as one or more sensors separate from the touch panel 252. The hologram device 264 may show a three-dimensional image in the air using light interference. The projector 266 may display an image by projecting light onto a screen. The screen may be located, for example, inside or outside the electronic device 201. The interface 270 may include, for example, an HDMI 272, a USB 274, an optical interface 276, or a D-subminiature (D-sub) 278. The interface 270 may be included in, for example, the communication interface 170 illustrated in FIG. 1. Additionally or alternatively, the interface 270 may include, for example, a mobile high-definition link (MHL) interface, a secure digital (SD) card/multi-media card (MMC) interface, or an infrared data association (IrDA) standard interface.

According to one embodiment, the panel 262 may include multiple display regions arranged on one substrate. According to one embodiment, the panel 262 may be flexible and may be disposed along at least a part of the exterior of the electronic device 201. For example, the panel 262 may include a flexible substrate (e.g. a polyimide substrate). The panel 262 may include a first light-emitting unit which is disposed in a first region on the substrate and includes multiple first pixels. The panel 262 may include a second light-emitting unit which is disposed in the first region on the substrate and includes multiple second pixels. According to various embodiments, the first light-emitting unit may be disposed such that the multiple first pixels have a first resolution. The second light-emitting unit may be disposed such that the multiple second pixels have a second resolution lower than the first resolution.

According to one embodiment, the first light-emitting unit or the second light-emitting unit may be a light-emitting-type display panel. For example, the first light-emitting unit or the second light emitting unit may include a plasma display panel (PDP), an electroluminescent display (ELD), a limit-emitting diode (LED), an organic light-emitting diode (OLED), an active matrix organic light-emitting diode (AMOLED), a passive matrix organic light-emitting diode (PMOLED), a flat panel display (FED), or a vacuum fluorescent display (VFD).

According to various embodiments, the first light-emitting unit or the second light-emitting unit may be a light-receiving type display panel. For example, the first light-emitting unit or the second light-emitting unit may include a liquid crystal display (LCD) or an electrochromic display (ECD).

According to various embodiments, the first light-emitting unit or the second light-emitting unit may be E-paper.

According to one embodiment, the first light-emitting unit may be identical to or different from the second light-emitting unit as to the type thereof. For example, each of the first light-emitting unit and the second light-emitting unit may include an AMOLED. For example, the first light-emitting unit may include an AMOLED, and the second light-emitting unit may include a PMOLED. For example, the first light-emitting unit may include an BLED (e.g, an AMOLED or a PMOLED), and the second light-emitting unit may include an LCD. For example, the first light-emitting unit may include an OLED (e.g. an AMOLED or a PMOLED), and the second light-emitting unit may include E-paper.

According to various embodiments, the first light-emitting unit may include a display panel having a first attribute (e.g. including an attribute of a high resolution), and the second light-emitting unit may include a display panel having a second attribute (e.g. a resolution lower than the resolution included in the first attribute). For example, the first light-emitting unit may include an AMOLED having a first attribute (e.g. an attribute of a high resolution), and the second light-emitting unit may include a PMOLED having a second attribute (e.g., a resolution lower than the resolution included in the first attribute).

Various embodiments of the panel 262 (e.g. a flexible display) will be described with reference to FIG. 4A and subsequent figures.

The audio module 280 may convert, for example, sound into an electrical signal, and vice versa. At least some elements of the audio module 280 may be included, for example, in the input/output interface 145 illustrated in FIG. 1. The audio module 280 may process sound information that is input or output via, for example, a speaker 282, a receiver 284, earphones 286, the microphone 288, or the like. The camera module 291 is a device for shooting an image or a video, and may include one or more image sensors (e.g., a front side sensor or a back side sensor), a lens, an image signal processor (ISP), or a flash (e.g., an LED or xenon lamp). The power management module 295 may manage, for example, the power of the electronic device 201. According to an embodiment, the power management module 295 may include a power management integrated circuit (PMIC), a charger IC, or a battery or fuel gauge. The PMIC may use a wired and/or wireless charging method. The wireless charging method may include, for example, a magnetic resonance method, a magnetic induction method, an electromagnetic wave method, or the like. Additional circuits (e.g., a coil loop, a resonance circuit, a rectifier, or the like) for wireless charging may be further included. A battery gauge may measure, for example, the amount of charge remaining in the battery 296 and a voltage, current, or temperature while charging. The battery 296 may include, for example, a rechargeable battery and/or a solar battery.

The indicator 297 may display a predetermined state of the electronic device 201 or a part of the electronic device 201 (e.g., the processor 210), such as a boot-up state, a message state, a charging state, or the like. The motor 298 may convert an electrical signal into a mechanical vibration and may generate a vibration, haptic effect, or the like. The electronic device 201 may include a mobile TV support device (e.g., a GPU) that can process media data according to a standard, such as digital multimedia broadcasting (DMB), digital video broadcasting (DVB), mediaFlo™, or the like. Each of the above-described elements described in the disclosure may be configured with one or more components, and the names of the corresponding elements may be different according to an electronic device type. In various embodiments, an electronic device (e.g., the electronic device 201) may omit some elements or may further include additional elements, or some of the elements of the electronic device may be combined with each other to configure one entity, wherein the entity may identically perform the functions of the corresponding elements prior to the combination.

As used herein, the term "module" may include a unit implemented in hardware, software, or firmware, and may interchangeably be used with other terms, for example, logic, logic block, part, or circuitry. The "module" may be a single integral component, or a minimum unit or part thereof, adapted to perform one or more functions. The "module" may be implemented mechanically or electronically, and may include, for example, at least one of an application-specific integrated circuit (ASIC) chip, a field-programmable gate array (FPGA), and a programmable-logic device for performing some operations, which are known or will be developed. According to various embodiments, at least some of the devices (for example, modules or functions thereof) or the method (for example, operations)

according to the disclosure may be implemented by a command stored in a computer-readable storage medium (e.g., the memory 130) in a programming module form. When the command is executed by processors, the processors may perform a function corresponding to the command. A computer-readable recording medium may include a hard disk, a floppy disk, a magnetic medium (e.g., a magnetic tape), an optical medium (e.g., CD-ROM, digital versatile disc (DVD)), a magneto-optical medium (e.g., a floptical disk), or a hardware device (e.g., a ROM, a RAM, a flash memory, or the like). The program instructions may include machine language codes generated by compilers and high-level language codes that can be executed by computers using interpreters. A module or a program module according to various embodiments of the present disclosure may include at least one of the above-mentioned elements, or some elements may be omitted or other additional elements may be added. Operations performed by the module, the program module or other elements according to various embodiments of the present disclosure may be performed in a sequential, parallel, iterative or heuristic way. Furthermore, some operations may be performed in another order or may be omitted, or other operations may be added.

Figure 3:
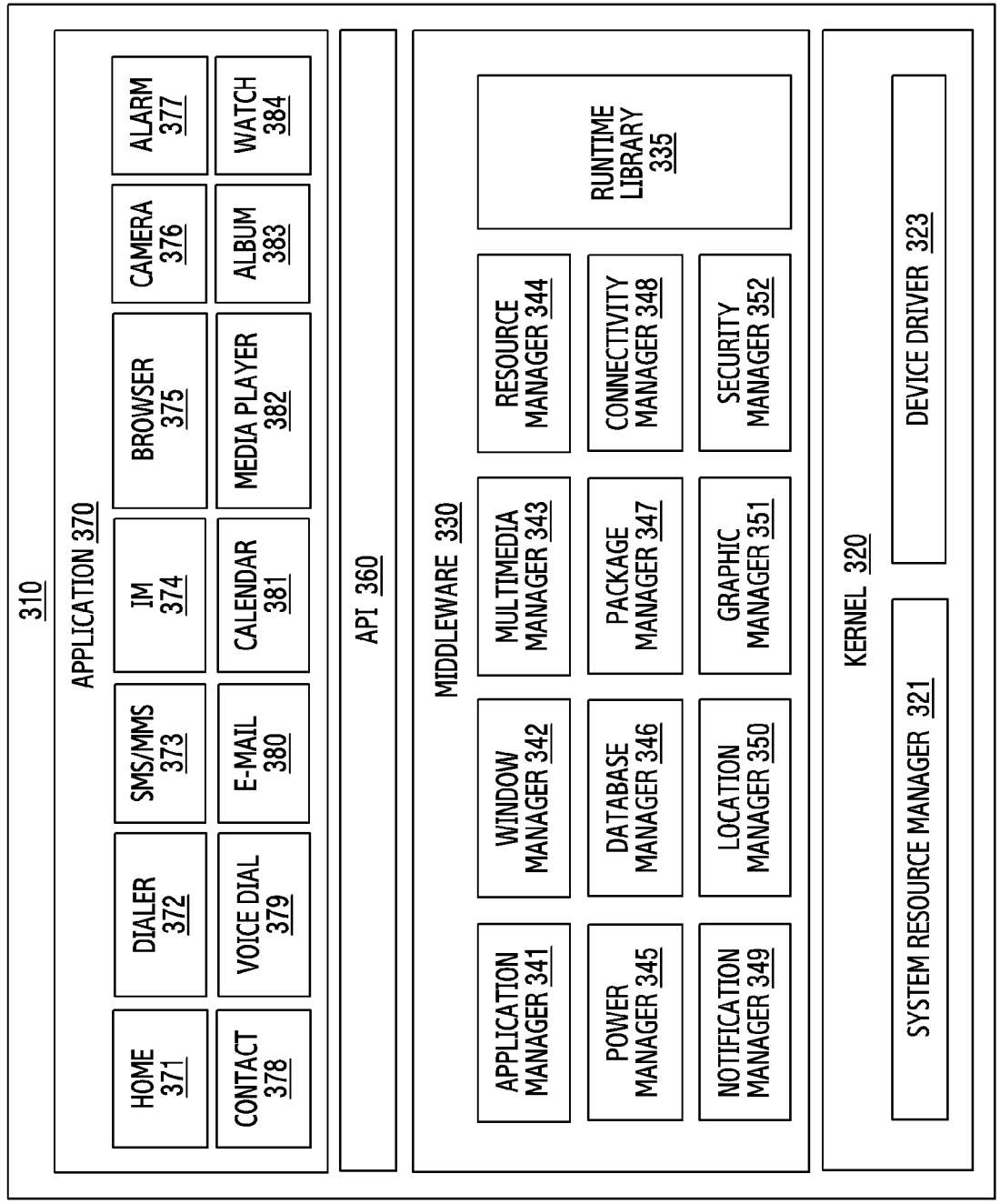
FIG. 3 a block diagram of a program module according to various embodiments.

FIG. 3 is a block diagram of a program module according to various embodiments. According to an embodiment, a program module 310 (e.g., the program 140) may include an operating system that controls resources relating to an electronic device (e.g., the electronic device 101) and/or various applications (e.g., the application programs 147) that are driven on the operating system. The operating system may include, for example, Android™, iOS™, Windows™, Symbian™, Tizen™, or Bada™. Referring to FIG. 3, the program module 310 may include a kernel 320 (e.g., the kernel 141), middleware 330 (e.g., the middleware 143), an API 360 (e.g., the API 145), and/or applications 370 (e.g., the application programs 147). At least part of the program module 310 may be preloaded on the electronic device, or may be downloaded from an external electronic device (e.g., the electronic device 102 or 104, or the server 106).

The kernel 320 may include, for example, a system resource manager 321 and/or a device driver 323. The system resource manager 321 may control, assign, or retrieve system resources. According to an embodiment of the disclosure, the system resource manager 321 may include a process manager, a memory manager, a file system manager, or the like. The device driver 323 may include, for example, a display driver, a camera driver, a Bluetooth driver, a shared memory driver, a USB driver, a keypad driver, a Wi-Fi driver, an audio driver, or an inter-process communication (IPC) driver. The middleware 330 may provide, for example, a function required by the applications 370 in common, or may provide various functions to the applications 370 via the API 360 so that the applications 370 can use limited system resources within the electronic device. According to an embodiment, the middleware 330 may include at least one of a runtime library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, and a security manager 352.

The runtime library 335 may include, for example, a library module that a compiler uses in order to add a new function via a programming language while the applications 370 are being executed. The runtime library 335 may manage input/output, manage memory, or process an arithmetic function. The application manager 341 may manage, for example, the life cycle of the application 370. The window manager 342 may manage GUI resources used for a screen. The multimedia manager 343 may identify formats required for reproducing various media files and may encode or decode a media file using a codec suitable for the corresponding format. The resource manager 344 may manage the source codes of the applications 370 or the space of memory. The power manager 345 may manage, for example, the capacity or power of a battery, and may provide power information required for operating an electronic device. According to an embodiment, the power manager 345 may interoperate with a basic input/output system (BIOS). The database manager 346 may, for example, generate, search, or change databases to be used by the application 370. The package manager 347 may manage the installation or updating of an application that is distributed in the form of a package file.

The connectivity manager 348 may manage, for example, wireless connection. The notification manager 349 may provide an event to a user, for example, an arrival message, an appointment, a proximity notification, and the like. The location manager 350 may manage, for example, the location information of the electronic device. The graphic manager 351 may manage a graphic effect to be provided to a user and a user interface relating to the graphic effect. The security manager 352 may provide, for example, system security or user authentication. According to an embodiment, the middleware 330 may include a telephony manager for managing a voice or video call function of the electronic device or a middleware module that is capable of making a combination of the functions of the above-described elements. According to an embodiment, the middleware 330 may provide a module specialized for each type of operation system. Also, the middleware 330 may dynamically delete some of the existing elements, or may add new elements. The API 360 is, for example, a set of API programming functions, and may be provided in different configurations depending on an operating system. For example, in the case of Android or iOS, one API set may be provided for each platform, and in the case of Tizen, two or more API sets may be provided for each platform.

The applications 370 may include applications that provide, for example, home 371, a dialer 372, SIMS/MMS 373, instant messaging (IM) 374, a browser 375, a camera 376, an alarm 377, contacts 378, a voice dial 379, an e-mail 380, a calendar 381, a media player 382, an album 383, a watch 384, health care (e.g., measuring exercise quantity or blood glucose environment information (e.g., atmospheric pressure, humidity, or temperature information), and the like. According to an embodiment, the applications 370 may include an information exchange application that can support exchanging of information between the electronic device and an external electronic device. The information exchange application may include, for example, a notification relay application for relaying predetermined information to an external electronic device, or a device management application for managing an external electronic device. For example, the notification relay application may relay notification information generated in another application of the electronic device to an external electronic device, or may receive notification information from an external electronic device to provide the received notification information to a user. The device management application, for example, may install, delete, or update functions of an external electronic device that communicates with the electronic device (e.g., turning on/off the external electronic device itself (or some elements thereof) or adjusting the brightness (or resolution) of a display) or applications executed in the external electronic device. According to an embodiment, the applications 370 may include applications (e.g., a healthcare application of a mobile medical appliance) that are designated according to the attributes of an external electronic device. According to an embodiment, the applications 370 may include applications received from an external electronic device. At least part of the program module 310 may be implemented (e.g., executed) as software, firmware, hardware (e.g., the processor 210) or a combination of two or more thereof, and may include a module, a program, a routine, an instruction set, or a process for performing one or more functions.

As used herein, the term "module" may include a unit implemented in hardware, software, or firmware, and may interchangeably be used with other terms, for example, logic, logic block, part, or circuitry. The "module" may be a single integral component, or a minimum unit or part thereof, adapted to perform one or more functions. The "module" may be implemented mechanically or electronically, and may include, for example, at least one of an application-specific integrated circuit (ASIC) chip, a field-programmable gate array (FPGA), and a programmable-logic device for performing some operations, which are known or will be developed. According to various embodiments, at least some of the devices (for example, modules or functions thereof) or the method (for example, operations) according to the disclosure may be implemented by a command stored in a computer-readable storage medium (e.g., the memory 130) in a programming module form. When the command is executed by processors (e.g., the processor 120), the processors may perform a function corresponding to the command. A computer-readable recording medium may include a hard disk, a floppy disk, a magnetic medium (e.g., a magnetic tape), an optical medium (e.g., CD-ROM, digital versatile disc (DVD)), a magneto-optical medium (e.g., a floptical disk), or a hardware device (e.g., a ROM, a RAM, a flash memory, or the like). The program instructions may include machine language codes generated by compilers and high-level language codes that can be executed by computers using interpreters. A module or a program module according to various embodiments of the present disclosure may include at least one of the above-mentioned elements, or some elements may be omitted or other additional elements may be added. Operations performed by the module, the program module or other elements according to various embodiments of the present disclosure may be performed in a sequential, parallel, iterative or heuristic way. Furthermore, some operations may be performed in another order or may be omitted, or other operations may be added.

Figure 4A:
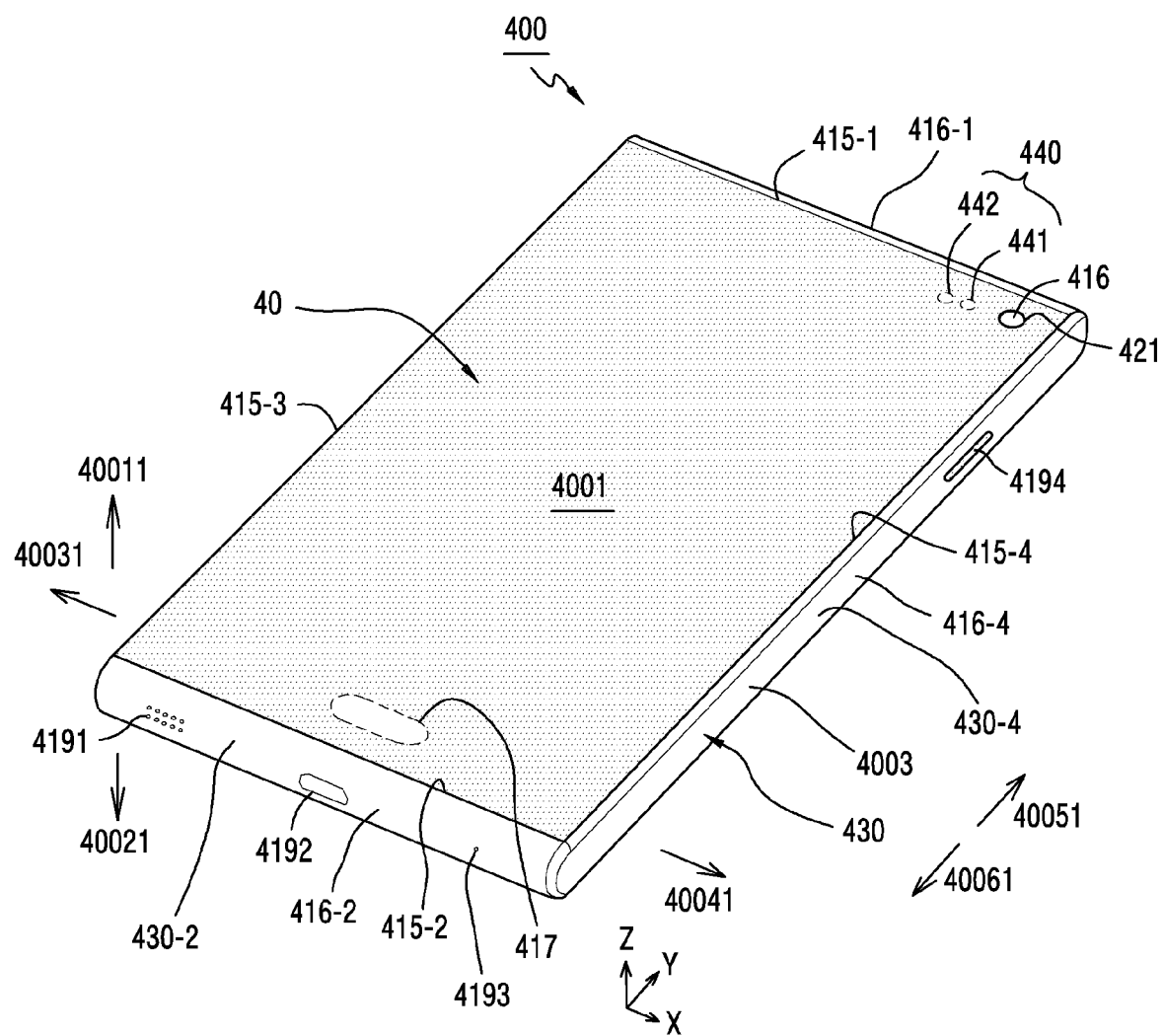
FIGS. 4A and 4B illustrate an electronic device including a flexible display according to one embodiment of the disclosure.
Figure 4B:
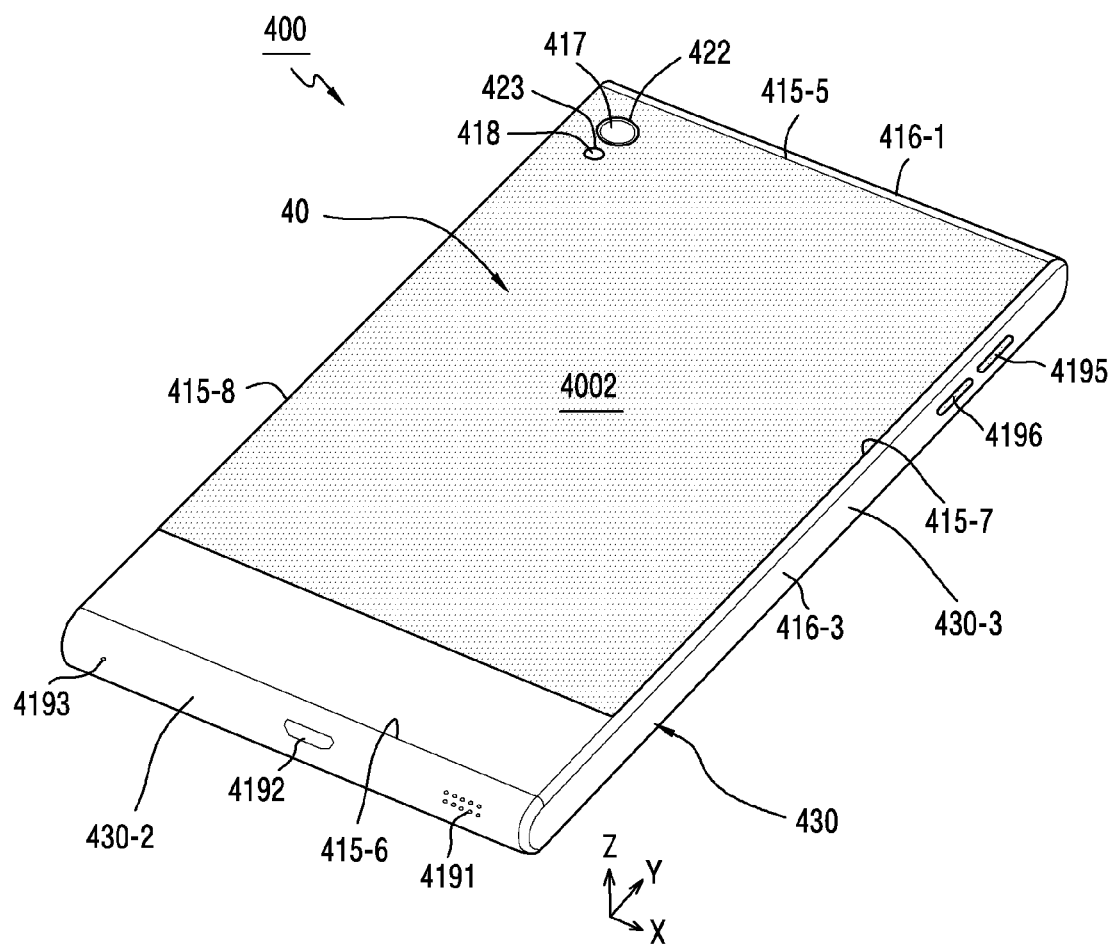
Figure 4C:
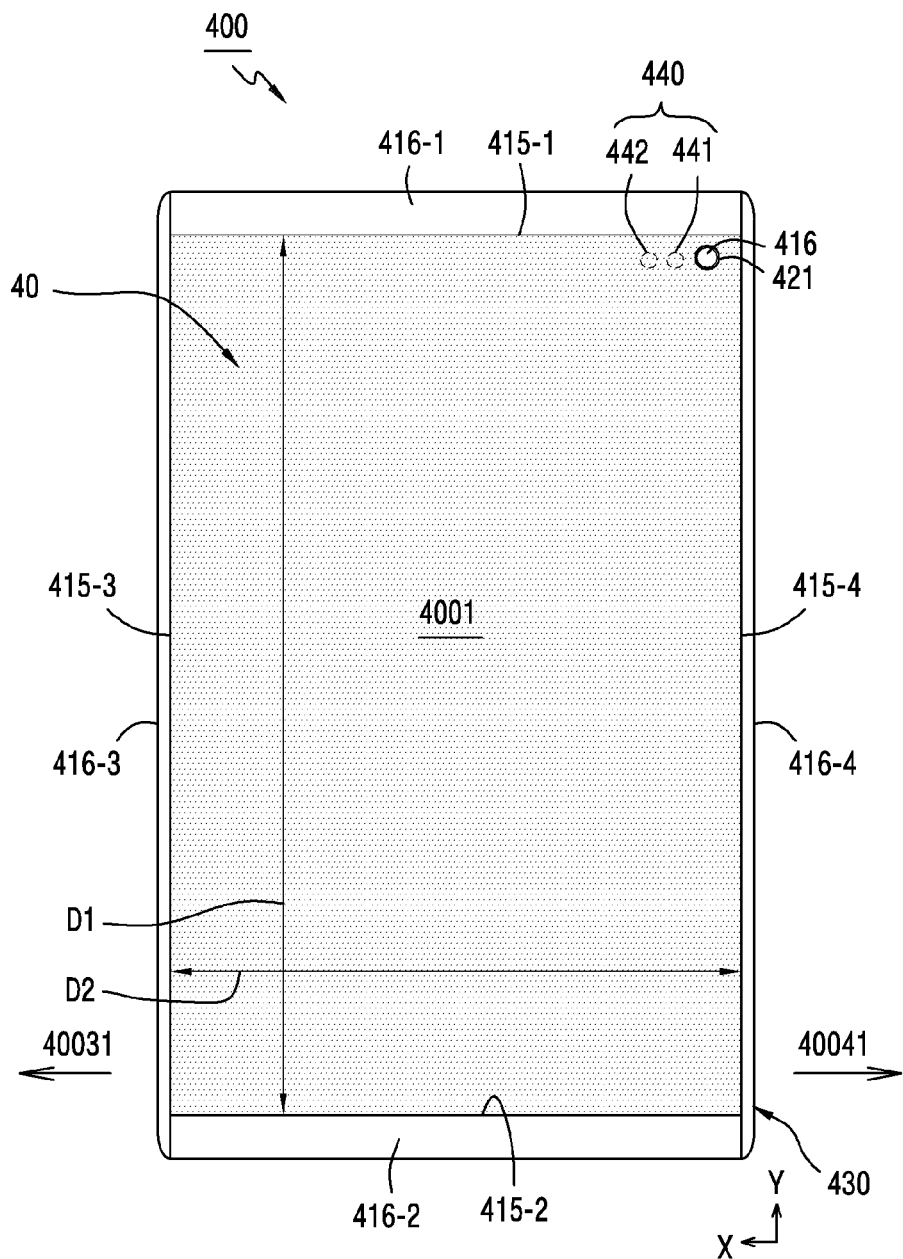
FIG. 4C is a plan view of an electronic device, seen in another direction, including a flexible display according to one embodiment of the disclosure.
Figure 4D:
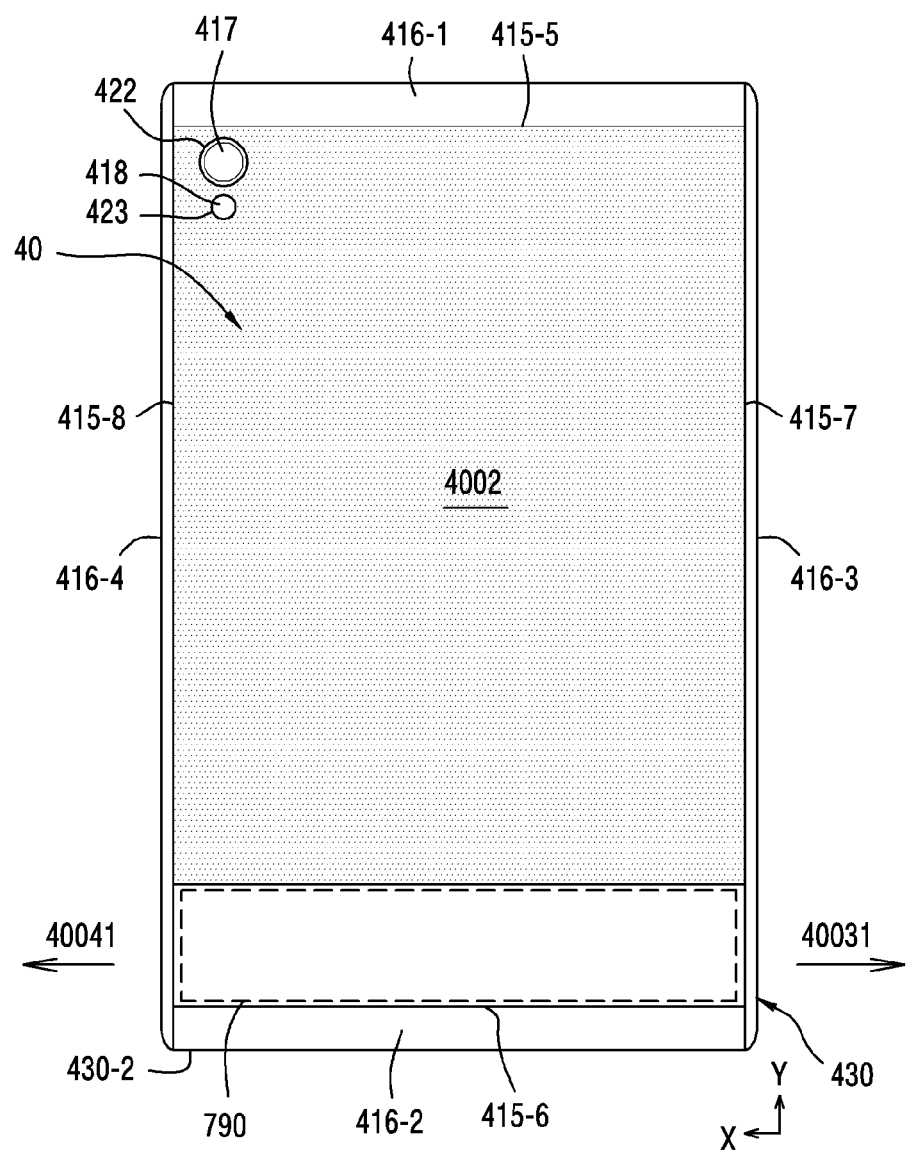
FIG. 4D a plan view of an electronic device, seen in one direction, including a flexible display according to one embodiment of the disclosure.
Figure 5:
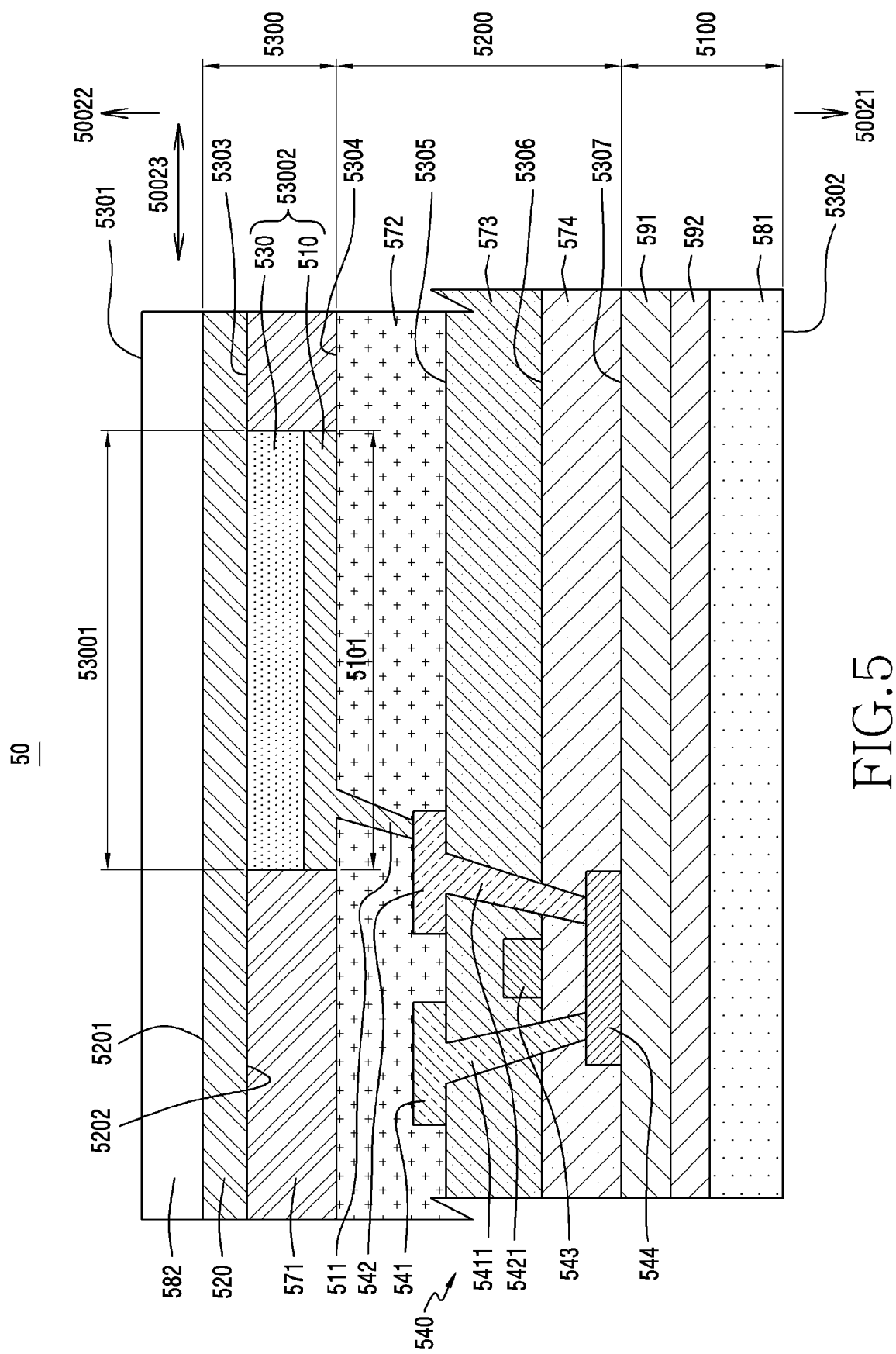
FIG. 5 is a cross-sectional view schematically illustrating a structure forming at least a part of a flexible display according to one embodiment of the disclosure.
Figure 6:
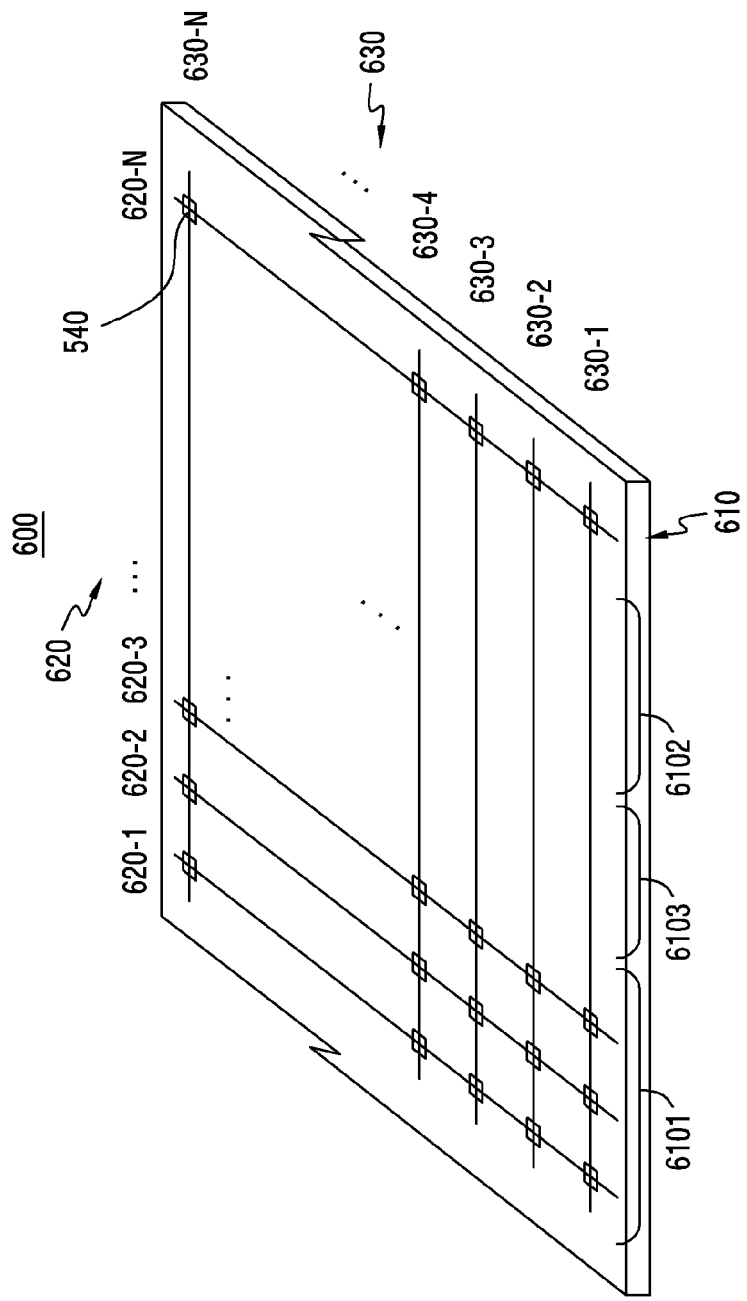
FIG. 6 illustrates a backplane substrate included in a flexible display according to various embodiments of the disclosure.
Figure 7A:
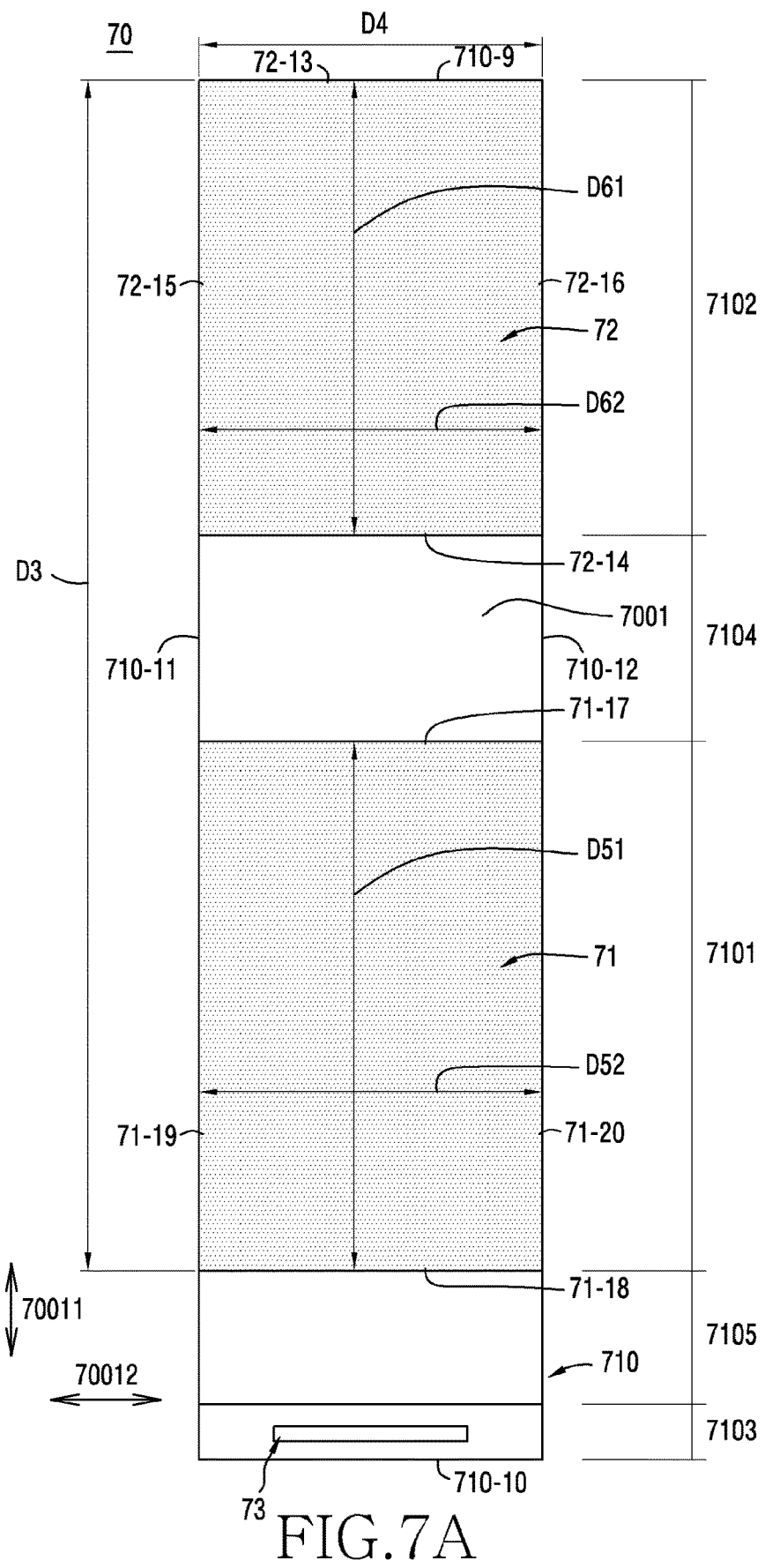
FIGS. 7A and 7B illustrate an unfolded state of a flexible display including two display panels according to one embodiment of the disclosure.
Figure 7B:
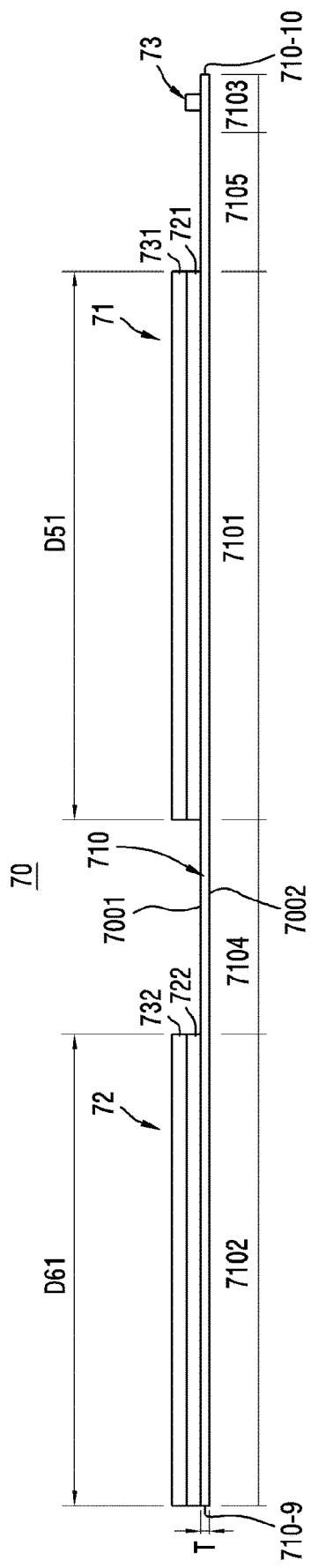
Figure 7C:
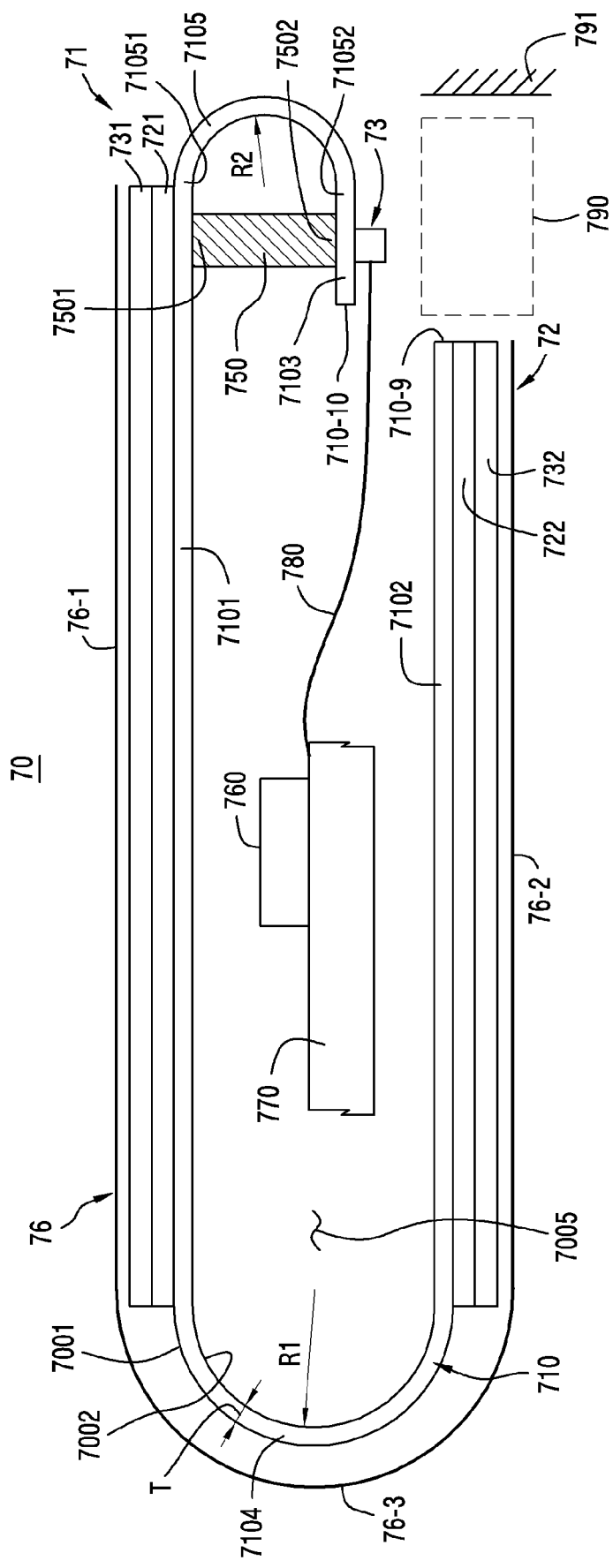
FIG. 7C illustrates a structure in which a flexible display is installed at an electronic device according to one embodiment of the disclosure.
Figure 8A:
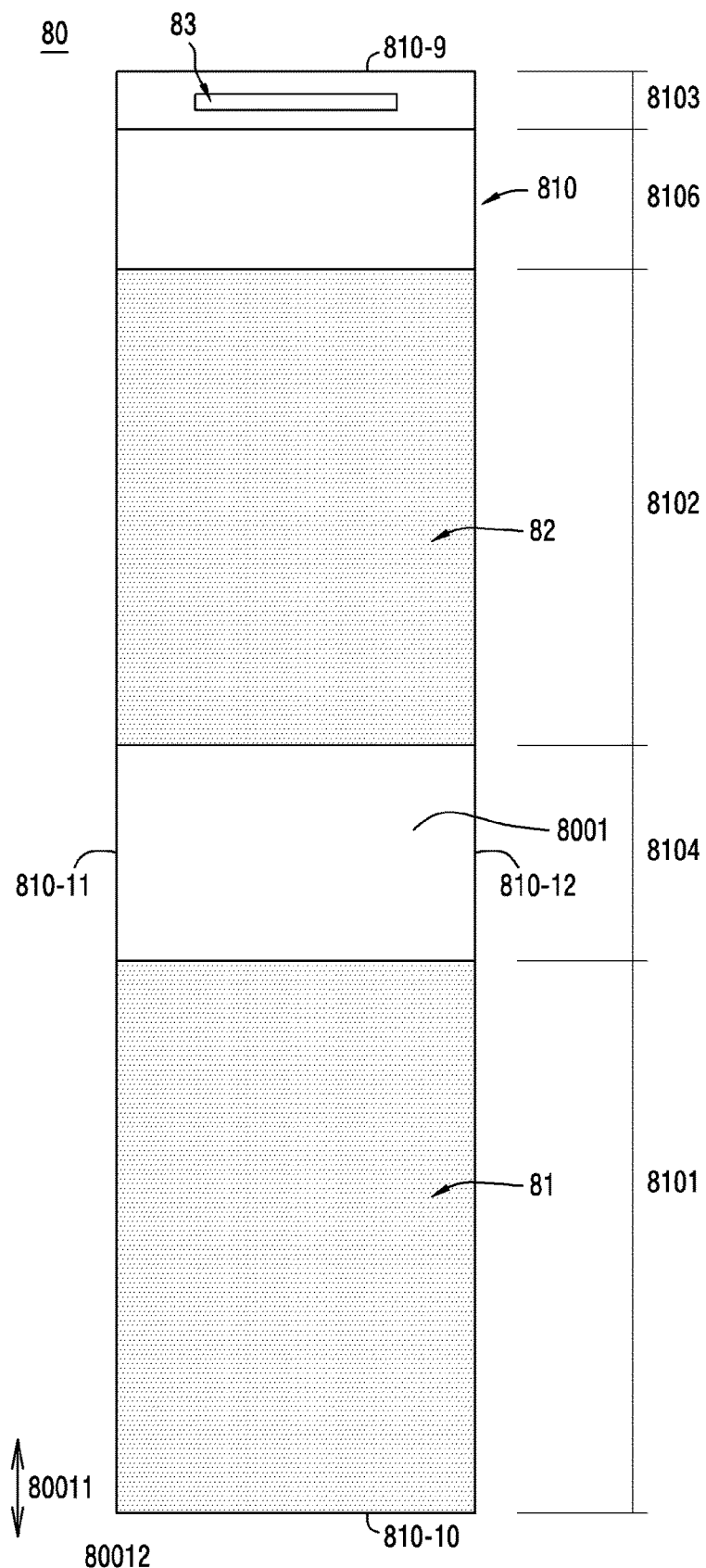
FIGS. 8A and 8B illustrate an unfolded state of a flexible display including two display panels according to another embodiment of the disclosure.
Figure 8B:
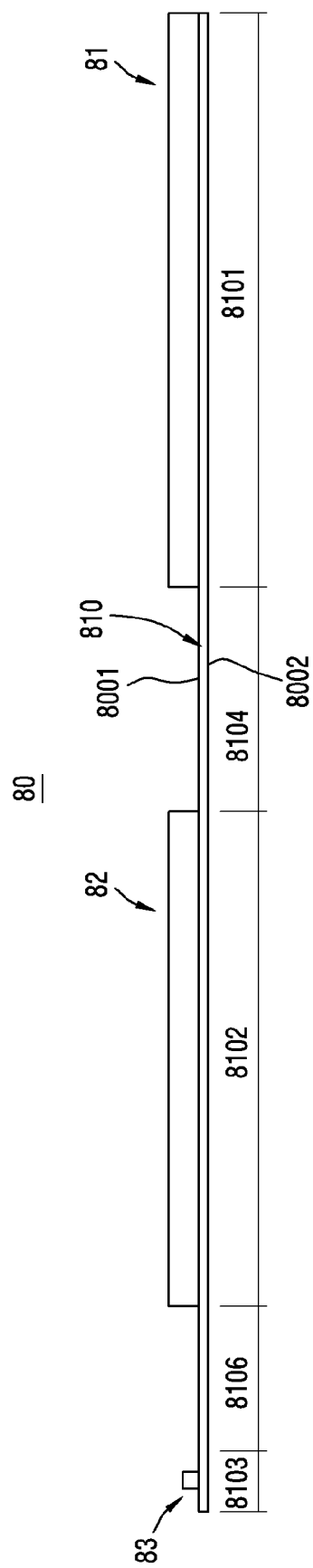
Figure 8C:
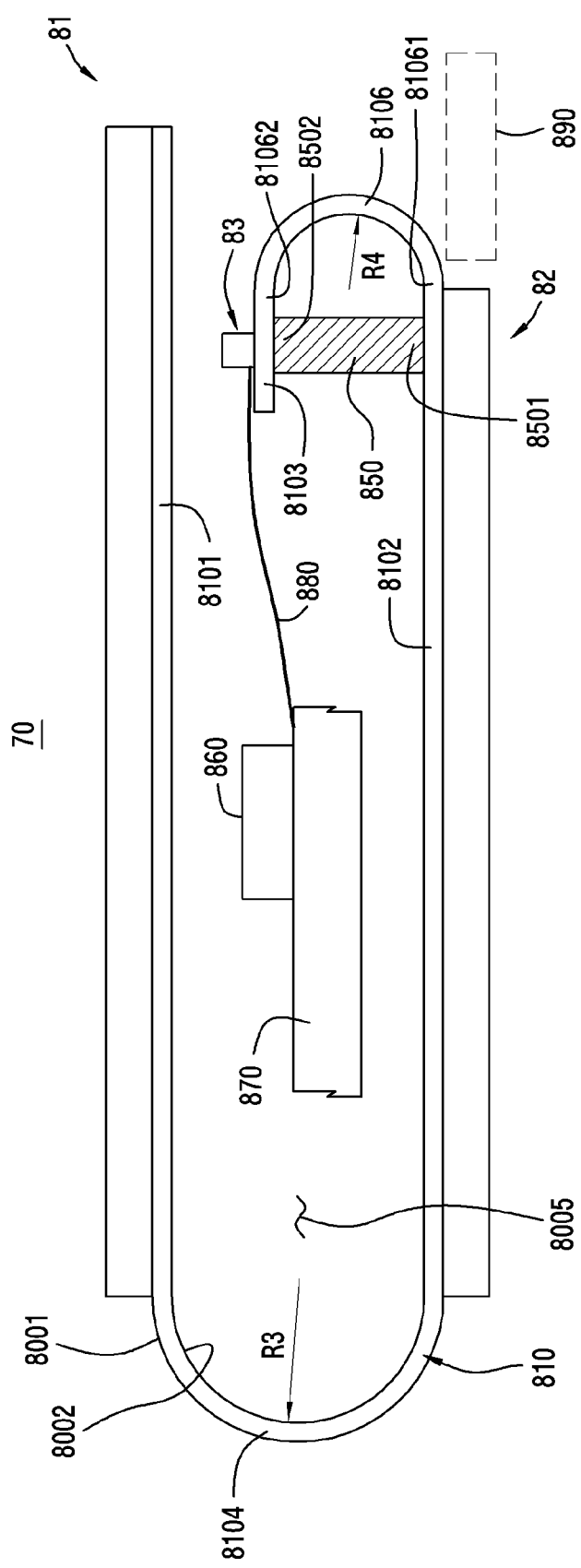
FIG. 8C illustrates a structure in which a flexible display is installed at an electronic device according to another embodiment of the disclosure.
Figure 9A:
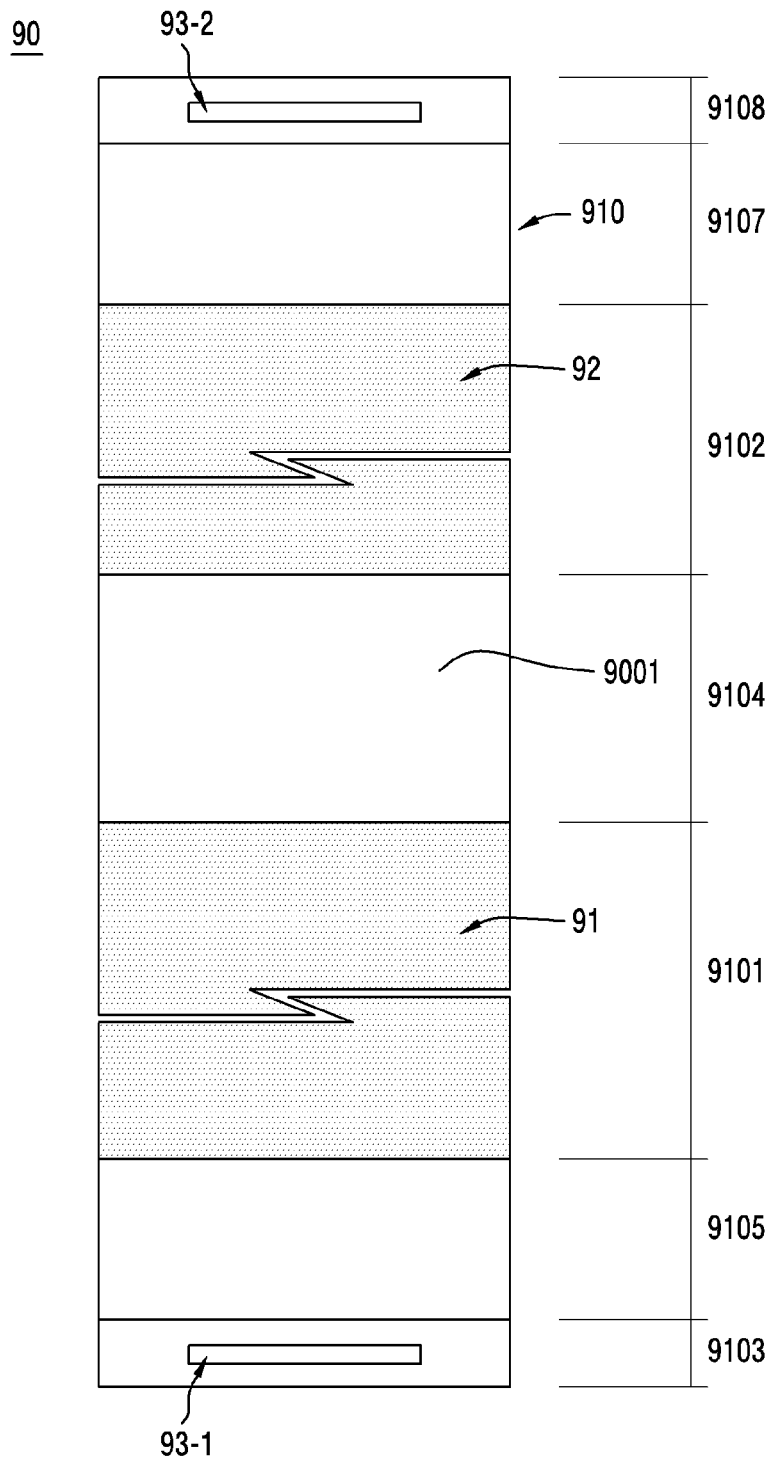
FIGS. 9A and 9B illustrate an unfolded state of a flexible display including two display panels according to various embodiments of the disclosure.
Figure 9B:
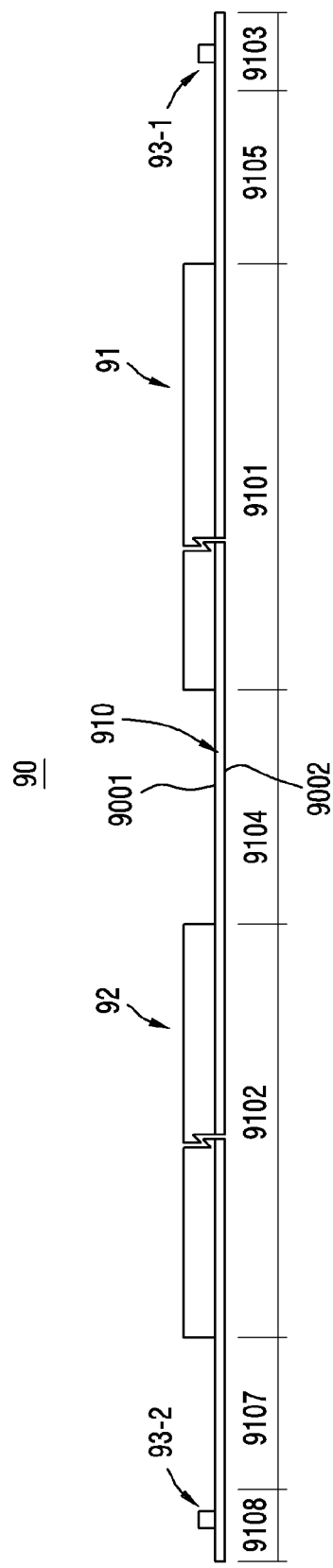
Figure 9C:
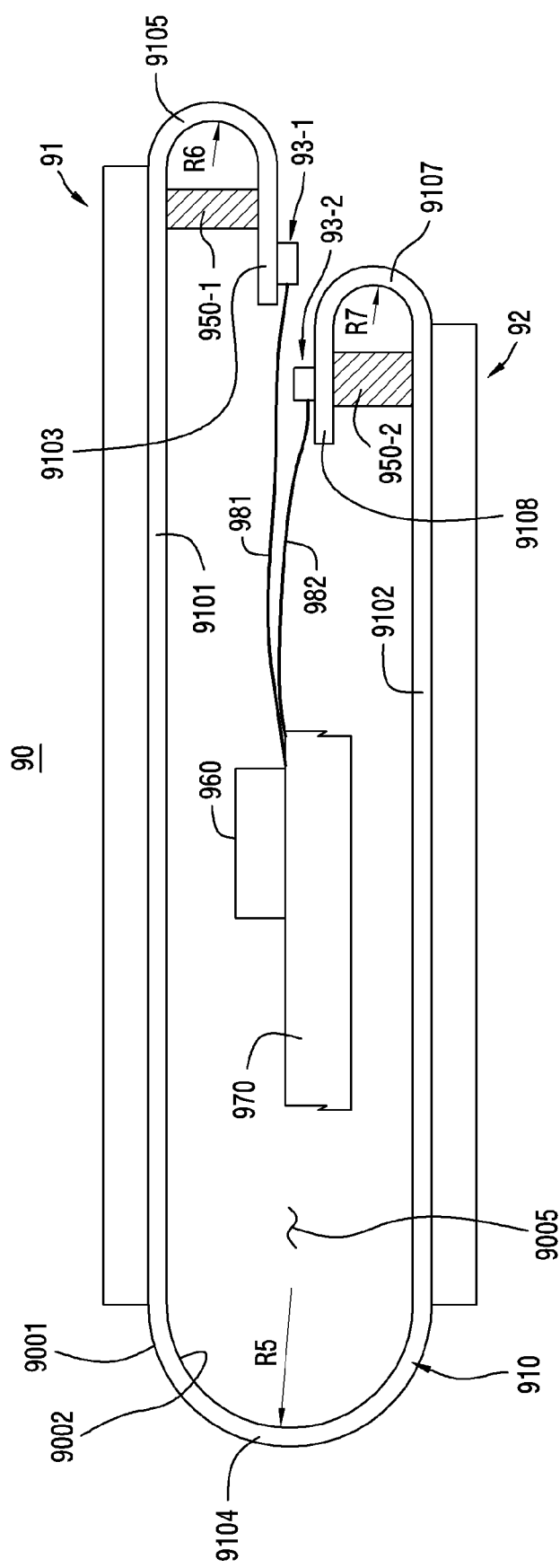
FIG. 9C illustrates a structure in which a flexible display is installed at an electronic device according to various embodiments of the disclosure.

FIGS. 4A and 4B illustrate an electronic device including a flexible display according to one embodiment of the disclosure. FIG. 4C is a plan view of an electronic device, seen in one direction, including a flexible display according to one embodiment of the disclosure. FIG. 4D is a plan view of an electronic device, seen in another direction, including a flexible display according to one embodiment of the disclosure. FIG. 5 is a cross-sectional view schematically illustrating a structure forming at least a part of a flexible display according to one embodiment of the disclosure. FIG. 6 illustrates a backplane substrate included in a flexible display according to various embodiments of the disclosure. FIGS. 7A and 7B illustrate an unfolded state of a flexible display including two display panels according to one embodiment of the disclosure. FIG. 7C illustrates a structure in which a flexible display is installed at an electronic device according to one embodiment of the disclosure. FIGS. 8A and 8B illustrate an unfolded state of a flexible display including two display panels according to another embodiment of the disclosure. FIG. 8C illustrates a structure in which a flexible display is installed at an electronic device according to another embodiment of the disclosure. FIGS. 9A and 9B illustrate an unfolded state of a flexible display including two display panels according to various embodiments of the disclosure. FIG. 9C illustrates a structure in which a flexible display is installed at an electronic device according to various embodiments of the disclosure.

According to various embodiments, the electronic device 400 may include at least some of the elements of the electronic device 101 in FIG. 1 or the electronic device 201 in FIG. 2.

Referring to FIGS. 4A, 4B, 4C, and 4D, according to one embodiment, the exterior (or housing) of an electronic device 400 may include a first surface 4001, a second surface 4002, and a third surface 4003. The first surface (or the front surface) 4001 may face a first direction 40011, and the second surface (or the rear surface) 4002 may face a second direction 40021 opposite the first direction 40011. The third surface (or the lateral surface) 4003 may be a surface enclosing a space between the first surface 4001 and the second surface 4002.

According to one embodiment, the first surface 4001 may be substantially a flat surface. According to various embodiments, the first surface 4001 may be a rectangle including a first edge 415-1, a second edge 415-2, a third edge 415-3, and a fourth edge 415-4. For example, the first edge 415-1 and the second edge 415-2 may be opposite and parallel to each other. The third edge 415-3 and the fourth edge 415-4 may be opposite and parallel to each other. According to various embodiments, the distance D1 between the first edge 415-1 and the second edge 415-2 may be longer than the distance D2 between the third edge 415-3 and the fourth edge 415-4.

According to embodiment, although not shown, the first surface 4001 may be a cured surface. For example, the first surface 4001 may be a surface which is convex in the first direction 40011.

According to one embodiment, the second surface 4002 may be substantially a flat surface. According to various embodiments, the second surface 4002 may be parallel to the first surface 4001. According to various embodiments, the second surface 4002 may be a rectangle including a fifth edge 415-5 parallel to the first edge 415-1, a sixth edge 415-6 parallel to the second edge 415-2, a seventh edge 415-7 parallel to the third edge 415-3, and an eighth edge 415-8 parallel to the fourth edge 415-4.

According to an embodiment, although not shown, the second surface 4002 may be a curved surface. For example, the second surface 4002 may be a surface which is convex in the second direction 40021.

According to one embodiment, the third surface 4003 may include a first lateral surface 416-1 connecting the first edge 415-1 and the fifth edge 415-5, a second lateral surface 416-2 connecting the second edge 415-2 and the sixth edge 415-6, a third lateral surface 416-3 connecting the third edge 415-3 and the seventh edge 415-7, and a fourth lateral surface 416-4 connecting the fourth edge 415-4 and the eighth edge 415-8.

According to one embodiment, at least one among the first lateral surface 416-1, the second lateral surface 416-2, the third lateral surface 416-3, and the fourth lateral surface 416-4 may be a curved surface. For example, the first lateral surface 416-1 may be a curved surface which is convex in a direction 40051 from the second lateral surface 416-2 toward the first lateral surface 416-1. The second lateral surface 416-2 may be a curved surface which is convex in a direction 40061 from the first lateral surface 416-1 toward the second lateral surface 416-2. The third lateral surface 416-3 may be a curved surface which is convex in a direction 40031 from the fourth lateral surface 416-4 toward the third lateral surface 416-3. The fourth lateral surface 416-4 may be a curved surface which is convex in a direction 40041 from the third lateral surface 416-3 toward the fourth lateral surface 416-4.

The electronic device 400 may include a flexible display 40 disposed along at least some among the first surface 4001, the second surface 4002, and the third surface 4003. According to one embodiment, although not shown, the flexible display 40 may be designed to have a structure in which one or more display panels (or light-emitting units) are arranged on one substrate layer. Although not shown, the display panels may be structured to include various layers, such as a layer including multiple pixels (or picture elements) (hereinafter, "pixel layer") and a layer including one or more switches for turning on or off pixels of the pixel layer (hereinafter, "switch layer"). If at least one switch of the switch layer is turned on by a processor (e.g. reference numeral "120" in FIG. 1 or reference numeral "210" in FIG. 2) of the electronic device 400, at least one pixel of the pixel layer may emit light (pixel-on). If at least one switch of the switch layer is turned off by the processor (e.g. reference numeral "120" in FIG. 1 or reference numeral "210" in FIG. 2) of the electronic device 400, at least one pixel of the pixel layer may not emit light (pixel-off).

FIG. 5 is a cross-sectional view schematically illustrating a structure forming at least a part of a flexible display 50 according to one embodiment of the disclosure. According to various embodiments, the flexible display 50 may include at least a part of the flexible display 40 in FIG. 4A. Referring to FIG. 5, at least a part of the flexible display 50 typically has the shape of a plate including two surfaces (e.g. a fourth surface 5301 and a fifth surface 5302), and may be flexible. According to one embodiment, the fourth surface 5301 may be substantially parallel to the fifth surface 5302. According to one embodiment, the flexible display 50 may be an organic light-emitting diode (OLED) display.

Referring to FIG. 5, the flexible display 50 may include a first electrode 510, a second electrode 520, an organic layer 530, and a switch 540. The first electrode 510 may be disposed to be spaced apart from the second electrode 520 in a fourth direction 50021 (e.g. in a direction from the fourth surface 5301 toward the fifth surface 5302). The organic layer 530 may be disposed between the second electrode 520 and the first electrode 510. The second electrode 520 (or a cathode electrode) corresponds to a negative electrode, and may be an electrode which emits an electron. For example, the second electrode 520 may include Al, Si, Li, Ca, Mg, or the like. The first electrode 510 (or an anode electrode) corresponds to a positive electrode, and may be an electrode which emits a hole. The second electrode 520 may be light-transmissive. For example, the second electrode 520 may be indium tin oxide (ITO), antimony tin oxide (ATO), or the like. The switch 540 may be disposed between the first electrode 510 and the fifth surface 5302.

If the switch 540 is turned on by a control circuit (e.g. the processor 120 in FIG. 1 or the processor 210 in FIG. 2), a voltage is applied to the first electrode 510 and the second electrode 520, and an electron emitted by the first electrode 510 and a hole emitted by the second electrode 520 may be combined in the organic layer 530. The combination of the electron and the hole generates exciton energy, and the exciton energy may be emitted in the form of light from the organic layer 530.

The switch 540 may be a transistor. According to one embodiment, the switch 540 may be a thin-film transistor (TFT). The TFT-type switch 540 may include a source electrode 541, a drain electrode 542, a gate electrode 543, and a semiconductor layer 544. The source electrode 541 may be an electrode for supplying an electron. The drain electrode 542 may be an electrode for supplying an electron. The gate electrode 543 may be an electrode for switching an electron movement from the source electrode 541 to the drain electrode 542. If a voltage of a predetermined level or higher is applied by the gate electrode 543, the semiconductor layer 544 may become a path through which an electron moves. The semiconductor layer 544 is an element for converting the switch 540 into a turned-on state, and may be defined as an "active layer" or "active area" of the switch 540.

If a signal (e.g. a voltage), equal to or greater than the threshold, is applied to the gate electrode 543, the semiconductor layer 544 (e.g. silicon) enters a state of being capable of moving an electron, like a conductor, and the electron may move from the source electrode 541 to the drain electrode 542 through the semiconductor layer 544. Due to the movement of the electron, a voltage may be applied to the first electrode 510 and the second electrode 520 (On-state). If a voltage is applied to the first electrode 510 and the second electrode 520, light may be generated in the organic layer 530 due to a combination of an electron emitted by the first electrode 510 and a hole emitted by the second electrode 520. For example, if a forward voltage is applied to the switch 540, electric current flows to the organic layer 530 and thus an organic light-emitting material of the organic layer 530 can emit light. As more electric current flows to the organic layer 530, the organic layer 530 may emit brighter light. If a reverse voltage is applied to the switch 540, electric current does not substantially flow to the organic layer 530 and thus the organic layer 530 cannot emit light.

The flexible display 50 may provide multiple pixels (or picture elements). A pixel may be defined as a dot, which is the minimum unit for expressing an image. The number of pixels may be determined by the resolution designed in an electronic device (e.g. reference numeral "400" in FIG. 4A). According to one embodiment, the second electrode 520 may be designed as a common electrode for the multiple pixels. The first electrode 510 and the organic layer 530 may be elements 53002 for one pixel (hereinafter, "pixel element"). The size of a pixel may be defined by the size of the pixel element 53002. Although not shown, the flexible display 50 may include multiple pixel elements corresponding to the second electrode 520. According to one embodiment, the multiple pixel elements may typically have a uniform shape, and may be arranged in the extension direction (hereinafter, "sixth direction") 50023 of the flexible display 50. The flexible display 50 may generate light by using one second electrode 520 and multiple pixel elements.

According to one embodiment, the second electrode 520 may be disposed on a first virtual surface 5303 between the fourth surface 5301 and the first electrode 510. The second electrode 520 may be shaped to follow at least a part of the first virtual surface 5303. For example, at least a part of the first virtual surface 5303 may be a surface extending typically in the sixth direction 50023, and the second electrode 520 may be a plate extending along at least a part of the first virtual surface 5303.

According to one embodiment, the second electrode 520 may be a layer extending in the sixth direction 50023 so as to cover the multiple pixel elements. For example, the second electrode 520 may include: a second electrode upper surface 5201 typically facing a fifth direction 50022 (e.g. a direction opposite the fourth direction 50021); and a second electrode lower surface 5202 typically facing the fourth direction 50021. The multiple pixel elements may be coupled to the second electrode lower surface 5202 (or the first virtual surface 5303).

According to one embodiment, the flexible display 50 may have a form in which one switch 540 is installed per pixel. For example, the flexible display 50 may be an active matrix organic light-emitting diode (AMOLED) display. The electronic device (e.g. reference numeral "400" in FIG. 4A) may individually control whether each pixel emit light, using each switch 540. According to various embodiments, the flexible display 50 may be various other types of displays, such as passive matrix organic light-emitting diodes (PMOLED), and thus the structure of the first electrode 510, the second electrode 520, the organic layer 530, or the switch 540 may be various.

According to one embodiment, the first electrode 510 may be disposed on a second virtual surface 5304 between the second electrode lower surface 5202 and the fifth surface 5302. The first electrode 510 may be shaped to follow at least a part of the second virtual surface 5304. For example, at least a part of the second virtual surface 5304 may be a surface extending typically in the sixth direction 50023, and the first electrode 510 may be a flat plate extending along at least a part of the second virtual surface 5304.

According to one embodiment, the size 5101 of the first electrode 510 extending in the sixth direction 50023 may typically be equal to that of the organic layer 530. For example, when seen in the fourth direction 50021, the organic layer ay have a size large enough to cover the first electrode 510. According to various embodiments, although not shown, the size 5101 of the first electrode 510 extending in the sixth direction 50023 may be designed to be smaller or larger than that of the organic layer 530.

According to one embodiment, the source electrode 541 and/or the drain electrode 542 may be arranged on a third virtual surface 5305 between the second virtual surface 5304 and the fifth surface 5302. The source electrode 541 and/or the drain electrode 542 may be shaped to follow at least a part of the third virtual surface 5305. For example, at least a part of the third virtual surface 5305 may be a surface extending typically in the sixth direction 50023, and the source electrode 541 and/or the drain electrode 542 may be flat plates extending along at least a part of the third virtual surface 5305.

According to one embodiment, the gate electrode 543 may be disposed on a fourth virtual surface 5306 between the second virtual surface 5304 and the fifth surface 5302. For example, the fourth virtual surface 5306 may be positioned between the third virtual surface 5305 and the fifth surface 5302. The gate electrode 543 may be shaped to follow at least a part of the fourth virtual surface 5306. For example, at least a part of the fourth virtual surface 5306 may be a surface typically extending in the sixth direction 50023, and the gate electrode 543 may be a flat plate extending along at least a part of the fourth virtual surface 5306.

According to one embodiment, the semiconductor layer 544 may be disposed between the second virtual surface 5304 and the fifth surface 5302. For example, the semiconductor layer 544 may be disposed between the fourth virtual surface 5306 and the fifth surface 5302. According to one embodiment, the semiconductor layer 544 may be disposed on a fifth virtual surface 5307 between the fourth virtual surface 5306 and the fifth surface 5302. The semiconductor layer 544 may be shaped to follow at least a part of the fifth virtual surface 5307. For example, at least a part of the fifth virtual surface 5307 may be a surface extending typically in the sixth direction 50023, and the semiconductor layer 544 may be a flat plate extending along at least a part of the fifth virtual surface 5307.

According to various embodiments, the semiconductor layer 544 may be disposed between the fourth virtual surface 5306 and the fifth virtual surface 5307.

The flexible display 50 may include at least one insulating layer disposed between the first virtual surface 5303 and the fifth virtual surface 5307. The at least one insulating layer may include various insulating materials and may prevent electric current between elements from leaking. According to one embodiment, the flexible display 50 may include a first insulating layer 571 disposed between the first virtual surface 5303 and the second virtual surface 5304. The first insulating layer 571 may be formed between multiple pixel elements. For example, the insulating layer 571 may be a layer formed by filling a space between the multiple pixel elements with an insulating material. The multiple pixel elements may be insulated from each other by the insulating layer 571. According to one embodiment, at least a part of the first insulating layer 571 may include a light-transmitting material.

According to one embodiment, the flexible display 50 may include a second insulating layer 572 disposed between the second virtual surface 5304 and the third virtual surface 5305. For example, the second insulating layer 572 may be a layer formed by filling a space between the second virtual surface 5304 and the third virtual surface 5305 with an insulating material.

According to various embodiments, the flexible display 50 may include a third insulating layer 573 disposed between the third virtual surface 5305 and the fourth virtual surface 5306. For example, the third insulating layer 573 may be a layer formed by filling a space between the third virtual surface 5305 and the fourth virtual surface 5306 with an insulating material.

According to various embodiments, the flexible display 50 may include a fourth insulating layer 574 disposed between the fourth virtual surface 5306 and the fifth virtual surface 5307. For example, the fourth insulating layer 574 may be a layer formed by filling a space between the fourth virtual surface 5306 and the fifth virtual surface 5307 with an insulating material.

At least one of the second insulating layer 572, the third insulating layer 573, or the fourth insulating lay r 574 may prevent electric current from leaking from the gate electrode 543 to the source electrode 541 and/or the drain electrode 542.

As illustrated, the first electrode 510 may be electrically connected to the drain electrode 542. According to one embodiment, the first electrode 510 may include an extension portion 511 extending to the drain electrode 542, and the first electrode 510 may be electrically connected to the drain electrode 542 through the extension portion 511. For example, the extension portion 511 may be designed in various shapes that penetrate the second insulating layer 572. According to various embodiments, although not shown, the first electrode 510 may be electrically connected to the source electrode 541 instead of the drain electrode 542. According to one embodiment, at least a part of the third insulating layer 573 may include a light-transmitting material.

The source electrode 541 may be electrically connected to the semiconductor layer 544. According to one embodiment, the source electrode 541 may include an extension portion 5411 extending to the semiconductor layer 544, and the source electrode 541 may be electrically connected to the semiconductor layer 544 through the extension portion 5411. For example, the extension portion 5411 may be designed in various shapes that penetrate the third, insulating layer 573 and the fourth insulating layer 574.

The drain electrode 542 may be electrically connected to the semiconductor layer 544. According to one embodiment, the drain electrode 542 may include an extension portion 5421 extending to the semiconductor layer 544, and the drain electrode 542 may be electrically connected to the semiconductor layer 544 through the extension portion 5421. For example, the extension portion 5421 may be designed in various shapes that penetrate the third insulating layer 573 and the fourth insulating layer 574.

According to various embodiments, when seen in a cross section, the gate electrode 543 may be disposed between the extension portion 5411 of the source electrode 541 and the extension portion 5421 of the drain electrode 542.

According to various embodiments, the flexible display 50 may include a first substrate 581 forming the fifth surface 5302. For example, the first substrate 581 may be made of a material, such as plastic, metal, carbon fiber and other fiber composites, ceramic, glass, or the like, or of a combination of these materials. According to one embodiment, at least a part of the first substrate 581 may include a light-transmitting material.

According to various embodiments, the flexible display 50 may include a buffer layer 591 disposed between the first substrate 581 and the semiconductor layer 544. For example, the fifth virtual surface 5307 may be formed by the buffer layer 591, and the semiconductor layer 544 may be disposed on the buffer layer 591. The buffer layer 591 may be made of a material, such as plastic, metal, carbon fiber and other fiber composites, ceramic, glass, or the like, or of a combination of these materials. For example, the buffer layer 591 may be made of a material, such as silicon oxide, silicon nitride, or the like. According to one embodiment, at least a part of the buffer layer 591 may include a light-transmitting material.

According to various embodiments, the flexible display 50 may include a protection layer 592 disposed between the buffer layer 591 and the first substrate 581. The protection layer 592 may be made of a material, such as plastic, metal, carbon fiber and other fiber composites, ceramic, glass, or the like, or of a combination of these materials. According to one embodiment, at least a part of the protection layer 592 may include a light-transmitting material.

According to various embodiments, the display 50 may include a second substrate 582 disposed on the second electrode 520. The second substrate 582 may form the fourth surface 5301. The second substrate 582 may be made of a material, such as plastic, metal, carbon fiber and other fiber composites, ceramic, glass, or the like, or of a combination of these materials. According to one embodiment, at least a part of the second substrate 582 may include a light-transmitting material.

According to one embodiment, a layer including the first substrate 581 may be defined as a "substrate layer" 5100. The substrate layer 5100 may include the buffer layer 591 and the protection layer 592.

According to one embodiment, a layer including the switch 540 may be defined as a "switch layer" 5200. The switch layer 5200 may include the second insulating layer 572, the third insulating layer 573, or the fourth insulating layer 574.

According to one embodiment, a layer including the pixel elements and the second electrode 520 may be defined as a "pixel layer" (or an "OLED layer") 5300. The pixel layer 5300 may include the first insulating layer 571.

According to one embodiment, an element including the pixel a 5300 and the switch layer 5200 may be defined as a "display panel".

According to one embodiment, an element including the substrate layer 5100 and the switch layer 5200 may be defined as a "backplane" or a "backplane substrate".

According to various embodiments, the substrate layer 5100, the switch layer 5200, and the pixel layer 5300 may be designed to be flexible.

According to various embodiments, the substrate layer 5100 may be designed to have a small coefficient of thermal expansion (CTE). For example, the substrate layer 5100 has a small coefficient of thermal expansion and thus can prevent damage to the substrate layer 5100 in the process of forming the switch layer 5200 on the substrate layer 5100.

According to various embodiments, the substrate layer 5100 may be designed to be made of a material having excellent surface flatness. According to various embodiments, the substrate layer 5100 may be designed to be made of a material having the excellent impact resistance.

According to one embodiment, the substrate layer 5100 may be designed to be made of various materials, such as glass, metal, or plastic. For example, the substrate layer 5100 may be designed to be made of polyimide (PI).

According to one embodiment, when the flexible display 50 is installed at the electronic device (e.g. reference numeral "400" in FIG. 4A), the fourth surface 5301 may form at least a part of the first surface 4001, the second surface 4002, or the third surface 4003 of the electronic device 400.

FIG. 6 illustrates a backplane substrate 600 included in a flexible display according to various embodiments of the disclosure. According to various embodiments, the backplane substrate 600 may be a substrate at least partially including the substrate layer 5100 and the switch layer 5200 in FIG. 5. Referring to FIG. 6, the backplane substrate 600 may include a substrate 610, and multiple gate lines 620 and multiple data lines 630, which are installed on the substrate 610. For example, the arrangement direction of the multiple gate lines 620 may be perpendicular to the arrangement direction of the multiple data lines 630. The multiple gate lines 620 may transfer a scanning signal or a gate signal. The switch 540 may be installed at each of positions at which the multiple gate lines 620 cross the multiple data lines 630.

According to one embodiment, the gate electrode (e.g. reference numeral "543" in FIG. 5) of the switch 540 may be electrically connected to the gate lines (620-N). The source electrode (e.g. reference numeral "541" in FIG. 5) of the switch 540 may be electrically connected to the data lines (630-N). The drain electrode (e.g. reference numeral "542" in FIG. 5) of the switch 540 may be electrically connected to the first electrode (e.g. reference numeral "510" in FIG. 5).

FIGS. 7A and 7B illustrate an unfolded state (e.g. a state prior to bending) of a flexible display 70 including two display panels according to one embodiment of the disclosure. The flexible display 70 may be the flexible display 40 in FIG. 4A. Referring to FIGS. 7A and 7B, the flexible display 70 may include a substrate 710, a first display panel 71, a second display panel 72, and at least one electronic component 73. The first display panel 71, the second display panel 72, and the at least one electronic component 73 may be arranged at various positions of the substrate 710.

Referring to 7B, the substrate 710 has a plate shape including two surfaces (e.g. a sixth surface 7001 and a seventh surface 7002), and may be flexible. The sixth surface 7001 and the seventh surface 7002 may be substantially parallel to each other. For example, the thickness (T) of the substrate 710 may be constant.

According to various embodiments, referring to FIG. 7A, in the state in which the flexible display 70 is unfolded, the substrate 710 may be a rectangle including a ninth edge 710-9, a tenth edge 710-10, an eleventh edge 710-11, and a twelfth edge 710-12. For example, the ninth edge 710-9 and the tenth edge 710-10 may be opposite and parallel to each other. The eleventh edge 710-11 and the twelfth edge 710-12 may be opposite and parallel to each other. Referring to FIGS. 7A and 7B, in the state in which the flexible display 70 is unfolded, the distance D3 between the ninth edge 710-9 and the tenth edge 710-10 may be longer than the distance D4 between the eleventh edge 710-11 and the twelfth edge 710-12.

The substrate 710 may be designed to include at least a part of the substrate layer 5100 in FIG. 5. According to one embodiment, the substrate 710 may be a polyimide (PI) substrate. According to an embodiment, the substrate 710 may be a backplane or backplane substrate, which includes the substrate layer 5100 and the switch layer 5200 in FIG. 5. According to an embodiment, the substrate 710 may be the substrate 610 in FIG. 6.

The first display panel 71 may be disposed on the sixth surface 7001 of the substrate 710. According to one embodiment, the first display panel 71 may include a first switch layer 721 (e.g. reference numeral "5200" in FIG. 5) coupled to the sixth surface 7001 of the substrate 710. The first display panel 71 may include a first pixel layer 731 (e.g. reference numeral "5300" in FIG. 5) coupled to the first switch layer 721. The first switch layer 721 be disposed between the first pixel layer 731 and the substrate 710. According to various embodiments, the first switch layer 721 may be a layer that includes multiple gate lines (e.g. reference numeral "620" in FIG. 6), multiple source lines (e.g. reference numeral "630" in FIG. 6), and at least one switch (e.g. reference numeral "540" in FIG. 5 or 6). According to an embodiment, if the substrate 710 is designed to include the first switch layer 721, the first switch layer 721 may be omitted in the first display panel 71. According to an embodiment, if the substrate 710 is designed to include multiple gate lines and multiple source lines, the multiple gate lines and the multiple source lines may be omitted in the first switch layer 721.

The second display panel 72 may be disposed on the sixth surface 7001 of the substrate 710. According to one embodiment, the second display panel 72 may include a second switch layer 722 (e.g. reference numeral "5200" in FIG. 5) coupled to the sixth surface 7001 of the substrate 710. The second display panel 72 may include a second pixel layer 732 (e.g. reference numeral "5300" in FIG. 5) coupled to the second switch layer 722. The second switch layer 722 may be disposed between the second pixel layer 732 and the substrate 710. According to various embodiments, the second switch layer 722 may be a layer that includes multiple gate lines (e.g. reference numeral "620" in FIG. 6), multiple source lines (reference numeral "630"), and at least one switch (e.g. reference numeral "540" in FIG. 5 or 6). According to an embodiment, if the substrate 710 is designed to include the second switch layer 722, the second switch layer 722 may be omitted in the second display panel 72. According to an embodiment, if the substrate 710 is designed to include multiple gate lines and multiple source lines, the multiple gate lines and the multiple source lines may be omitted in the second switch layer 722.

According to various embodiments, the first display panel 71 or the second display panel 72 is not limited to the structure in FIG. 5, 6, 7A, or 7B, and may be designed to have various structures, which are not shown, according to the type thereof.

According to one embodiment, the first display panel 71 or the second display panel 72 may be a light-emitting-type display panel. For example, the first display panel 71 or the second display panel 72 may be a plasma display panel (PDP), an electroluminescent display (ELD), a light-emitting diode (LED), an organic light-emitting diode (OLED), an active matrix organic light-emitting diode (AMOLED), a passive matrix organic light-emitting diode (PMOLED), a flat panel display (FED), or a vacuum fluorescent display (VFD).

According to various embodiments, the first display panel 71 or the second display panel 72 may be a light-receiving-type display panel. For example, the first display panel 71 or the second display panel 72 may be a liquid crystal display (LCD) or an electrochromic display (ECD).

According to an embodiment, the first display panel 71 or the second display panel 72 may be E-paper.

According to one embodiment, the first display panel 71 may be identical to or different from the second display panel 72 as to the type thereof. For example, each of the first display panel 71 and the second display panel 72 may be an AMOLED. For example, the first display panel 71 may be an AMOLED, and the second display panel 72 may be a PMOLED. For example, the first display panel 71 may be an OLED (e.g. an AMOLED or PMOLED), and the second display panel 72 may be an LCD. For example, the first display panel 71 may be an OLED (e.g. an AMOLED or PMOLED), and the second display panel 72 may be E-paper.

According to various embodiments, the first display panel 71 may be an AMOLED having a first attribute (e.g. including an attribute of high resolution), and the second display panel 72 may be a PMOLOD having a second attribute (e.g. a resolution lower than the resolution included in the first attribute).

According to one embodiment, the at least one electronic component 73 may be disposed on the sixth surface 7001 of the substrate 710. According to various embodiments, although not shown, the at least one electronic component 73 may be disposed on the seventh surface 7002 of the substrate 710. The at least one electronic component 73 is an element for driving the first display panel 71 and the second display panel 72, and may be electrically connected to the first display panel 71 and the second display panel 72. According to one embodiment, e at least one electronic component may include a display driver (e.g. a display driver IC (DDI)).

The DDI may be a chip-type component used to drive multiple pixels included in the first display panel 71 and multiple pixels included in the second display panel 72. For example, under the control of a processor (e.g. reference numeral "120" in FIG. 1 or reference numeral "210" in FIG. 2) of an electronic device (e.g. reference numeral "400" in FIG. 4A), the DDI may adjust a switch (e.g. a transistor) (e.g. reference numeral "540" in FIG. 5 or connected to a pixel. According to one embodiment, the DDI may include a gate integrated circuit (IC) and a source IC, which are not shown. The gate IC may have a function of turning on or off a pixel. The source IC may have a function of making a color difference by adjusting the amount of an image signal of the pixel.

According to one embodiment, the structure in which the at least one electronic component 73 (e.g. a DDI) is connected to the display 70 may be a chip-on-panel (COP) structure in which the component is directly mounted on the substrate 710 (e.g. a panel substrate, a backplane, or a backplane substrate). As described later with reference to FIG. 7C, a region of the substrate 710 in which the at least one electronic component 73 (e.g. a DDI) is installed may be disposed at the electronic device (e.g. reference numeral "400" in FIG. 4A) while being bent to the rear surface of the substrate 710.

According to another embodiment, although not shown, the structure in which the at least one electronic component 73 (e.g. the DDI) is connected to the display 70 may be a chip-on-film (COF) structure which an FPCB having the at least one electronic component 73 mounted thereon is arranged and connected to the substrate 710 (e.g. a panel substrate, a backplane, or a backplane substrate) by a flexible film. All the drawings regarding embodiments of the disclosure show a COP structure, but various structures, such as a COF structure, may be applied.

According to various embodiments, the first display panel 71, the second display panel 72, and the at least one electronic component 73 may be spaced apart from one another. For example, the substrate 710 may include a first portion 7101 on which the first display panel 71 is mounted, a second portion 7102 on which the second display panel 72 is mounted, and a third portion 7103 on which the at least one electronic component 73 is mounted. Referring to FIGS. 7A and 7B, in the state in which the flexible display 70 is unfolded, the first portion 7101 may be disposed between the second portion 7102 and the third portion 7103.

Referring to FIGS. 7A and 7B, in the state in which the flexible display 70 is unfolded, the second display panel 72 may be a rectangle including a thirteenth edge 72-13, a fourteenth edge 72-14, the fifteenth edge 72-15, and the sixteenth edge 72-16. For example, the thirteenth edge 72-13 and the fourteenth edge 72-14 may be opposite and parallel to each other. The fifteenth edge 72-15 and the sixteenth edge 72-16 may be opposite and parallel to each other. According to one embodiment, the second portion 7102 covered by the second display panel 72 may be rectangular. According to various embodiments, the second display panel 72 may be designed such that the thirteenth edge 72-13 of the second display panel 72 extends up to the ninth edge 710-9 of the substrate 710 or up to the vicinity thereof. According to various embodiments, the second display panel 72 may be designed such that the fifteenth edge 72-15 of the second display panel 72 extends up to the eleventh edge 710-11 of the substrate 710 or up to the vicinity thereof. According to various embodiments, the second display panel 72 may be designed such that the sixteenth edge 72-16 of the second display panel 72 extends up to the twelfth edge 710-12 of the substrate 710 or up to the vicinity thereof.

Referring to FIGS. 7A and 7B, the first display panel 71 may be a rectangle including a seventeenth edge 71-17, an eighteenth edge 71-18, a nineteenth edge 71-19, and a twentieth edge 71-20. For example, the seventeenth edge 71-17 and the eighteenth edge 71-18 may be opposite and parallel to each other. The nineteenth edge 71-19 and the twentieth edge 71-20 may be opposite and parallel to each other. According to one embodiment, the first portion 7101 covered by the first display panel 71 may be rectangular. According to various embodiments, the first display panel 71 may be designed such that the nineteenth edge 71-19 of the first display panel 71 extends up to the eleventh edge 710-11 of the substrate 710 or up to the vicinity thereof. According to various embodiments, the first display panel 71 may be designed such that the twentieth edge 71-20 of the first display panel 71 extends up to the twelfth edge 710-12 of the substrate 710 or up to the vicinity thereof.

According to one embodiment, the at least one electronic component 73 (e.g. a DDI) is electrically connected to the multiple gate lines (e.g. reference numeral "620" in FIG. 6) and the multiple source lines (e.g. reference numeral "630" in FIG. 6) of the first display panel 71 or the second display panel 72, and may adjust one or more switches (e.g. reference numeral "540" in FIG. 6) of the first display panel 71 under the control of the processor (e.g. reference numeral "120" in FIG. 1 or reference numeral "210" in FIG. 2). For example, a gate IC (not shown) of the at least one electronic component 73 may be electrically connected to the multiple gate lines. A source IC of the at least one electronic component 73 may be electrically connected to the multiple source lines.

According to one embodiment, the substrate 710 may be designed to include multiple gate lines and multiple source lines, which are not shown. For example, the multiple gate lines (e.g. reference numeral "620" in FIG. 6) may be arranged in a direction (hereinafter, a "seventh direction") 70011 between the ninth edge 710-9 and the tenth edge 710-10 of the substrate 710. For example, the multiple source lines (e.g. reference numeral "630" in FIG. 6) may be arranged in a direction (hereinafter, an "eighth direction") 70012 between the eleventh edge 710-11 and the twelfth edge 710-12 of the substrate 710. According to one embodiment, referring to FIG. 6, some 6201 among the gate s 620 may be arranged on the first portion 7101 or the first switch layer 721, and may be dedicated to the first display panel 71. Others 6202 among the gate lines 620 may be arranged on the second portion 7102 or the second switch layer 722, and may be dedicated to the second display panel 72. According to various embodiments, referring to FIG. 6, the multiple source lines 630 may be dedicated to the first display panel 71 as well as the second display panel 72.

According to one embodiment, the substrate 710 may include a fourth portion 7104 between the first portion 7101 and the second portion 7102. The fourth portion 7104 may be a portion to which the display panel (e.g. reference numeral "71" or "72") has not been extended. The fourth portion 7104 is a non-screen region and may be defined as a "dead space". The fourth portion 7104 may electrically connect the first display panel 71 and the second display panel 72 to each other. For example, referring to FIG. 6, the fourth portion 7104 corresponds to a portion 6204 between two portions 6201 and 6202 of the substrate 610, and may include at least one of one or more gate lines 620, one or more source lines 630, or switches 540 (e.g. low-temperature polysilicon (LTPS) TFTs).

According to one embodiment, the substrate 710 may include a fifth portion 7105 between the first portion 7101 and the third portion 7103. The fifth portion 7105 may include wires (not shown) for electrically connecting the at least one electronic component 73 to display panels 71 and 72.

FIG. 7C illustrates a structure in which the flexible display 70 is installed at an electronic device (e.g. reference numeral "400" in FIG. 4A) according to one embodiment of the disclosure. Referring to FIG. 7C, in one embodiment, the flexible display 70 may be installed at the electronic device 400 in the state in which the fourth portion 7104 is roundly bent. If the flexible display 70 as illustrated in FIG. 7C is installed at the electronic device 400, the first display panel 71 may be disposed along at least a part of the first surface (reference numeral "4001" in FIG. 4A) of the electronic device 400, and may be exposed through the first surface 4001. If the flexible display 70 as illustrated in FIG. 7C is installed at the electronic device 400, the second display panel 72 may be disposed along at least a part of the second surface (reference numeral "4002" in FIG. 4A) of the electronic device 400, and may be exposed through the second surface 4002. If the flexible display 70 as illustrated in FIG. 7C is installed at the electronic device 400, the round fourth portion 7104 of the substrate 710 may be disposed along the first lateral surface 416-1 of the electronic device 400.

Referring to FIG. 4A, the first display panel 71 may be designed to be disposed along at least a part of the first surface 4001 among the first surface 4001, the second surface 4002, and the first lateral surface 416-1 of the electronic device 400. According to various embodiments, although not shown, the first display panel 71 may be designed to be extendedly disposed along at least a part of the first lateral surface 416-1 of the electronic device 400. If the first display panel 71 is designed to be extendedly disposed along the at least a part of the first lateral surface 416-1, a part of the first display panel 71, corresponding to the first lateral surface 416-1, may be roundly bent and installed at the electronic device 400. According to various embodiments, although not shown, the first display panel 71 may be designed to be extendedly disposed along at least a part of the first lateral surface 416-1 of the electronic device 400 and at least a part of the second surface 4002 thereof.

Referring to 4B, the second display panel 72 may be designed to be disposed along at least a part of the second surface 4002 among the first surface 4001, the second surface 4002, and the first lateral surface 416-1 of the electronic device 400. According to various embodiments, although not shown, the second display panel 72 may be designed to be extendedly disposed along at least a part of the first lateral surface 416-1 of the electronic device 400. If the second display panel 72 is designed to be extendedly disposed along the at least a part of the first lateral surface 416-1, a part of the second display panel 72, corresponding to the first lateral surface 416-1, may be roundly bent and installed at the electronic device 400.

According to one embodiment, referring to FIGS. 4A and 4B, the electronic device 400 may include a support member (e.g. a frame or a bracket) 430 for supporting the flexible display 70. For example, the support member 430 is a rectangular annular shape including a hollow portion, and may include a first frame (a portion corresponding to the first lateral surface 416-1), a second frame 430-2, a third frame 430-3, and a fourth frame 430-4. The first frame and the second frame 430-2 may be arranged on opposite sides. The third frame 430-3 and the fourth frame 430-4 may be arranged on opposite sides. The third frame 430-3 may connect one end of the first frame and one end of the second frame 430-2. The fourth frame 430-4 may connect the other end of the first frame and the other end of the second frame 430-2. According to various embodiments, the distance between the first frame 430-1 and the second frame 430-2 may be shorter than the distance between the third frame 430-3 and the fourth frame 430-4. According to various embodiments, the support member 430 may be made of a metal such as magnesium or aluminum, or may be made of a nonmetal such as plastic.

For example, if the flexible display 70 as illustrated in FIG. 7C is coupled to the support member 430, the first frame of the support member 430 may be covered by the fourth portion (reference numeral "7104" in FIG. 7A, 7B, or 7C) of the flexible display 70. Referring to FIG. 4A, if the flexible display 70 as illustrated in FIG. 7C is coupled to the support member 430, the second frame 430-2 of the support member 430 may form the second lateral surface 416-2 of the electronic device 400. Referring to FIG. 4B, if the flexible display 70 as illustrated in FIG. 7C is coupled to the support member 430, the second frame 430-2 of the support member 430 may form a part of the second surface 4002 of the electronic device 400. Referring to FIG. 4B, if the flexible display 70 as illustrated in FIG. 7C is coupled to the support member 430, the third frame 430-3 of the support member 430 may form the third lateral surface 416-3 of the electronic device 400, and the fourth frame 430-4 of the support member 430 may form the fourth lateral surface 416-4 of the electronic device 400. According to various embodiments, elements forming the first surface 4001, the second surface 4002, or the third surface 4003 of the electronic device 400 may vary according to the size of the flexible display 70. For example, although not shown, if the flexible display 70 is designed to be disposed along a part of the first surface 4001 of the electronic device 400, the second frame 430-2 of the support member 430 may form a part of the first surface 4001. For example, although not shown, if the flexible display 70 is designed to be disposed along the entire second surface 4002 of the electronic device 400, the second surface 4002 of the electronic device 400 may be formed only by the flexible display 70.

Referring to FIG. 7C, in one embodiment, the flexible display 70 may be installed at the electronic device (reference numeral "400" in FIG. 4A) in the state in which the fifth portion 7105 is roundly bent. When the flexible display 70 as illustrated in FIG. 7C is installed at the electronic device 400, the fifth portion 7105, the third portion 7103, and the at least one electronic component 73 may be positioned in an inner space 7005 of the electronic device 400. For example, the fifth portion 7105, the third portion 7103, and the at least one electronic component 73 may be positioned in the hollow portion of the support member (reference numeral "430" in FIG. 4A).

According to one embodiment, the fourth portion 7104 of the substrate 710 may be bent to a first curvature radius R1 (e.g. 10 mm or less). According to one embodiment, the fifth portion 7105 of the substrate 710 may be bent to a second curvature radius R2 (e.g. 10 mm or less). According to various embodiments, the first curvature radius R1 may be different from the second curvature radius R2. For example, the first curvature radius R1 may be smaller than the second curvature radius R2.

According to various embodiments, the first frame of the support member (reference numeral "430" in FIG. 4A) may include a curved surface configured to follow the first lateral surface 416-1 of the electronic device 400, and the fourth portion 7104 of the substrate 710 may be bent along the curved surface of the first frame and may remain bent by the first frame.

According to various embodiments, the electronic device 400 may include a second support member 750 for maintaining the bent form of the fifth portion 7105 of the substrate 710. When seen in a cross section, the second support member 750 may typically have a rectangular cross section. One end 7501 of the second support member 750 may be brought into contact with or coupled to the seventh surface 7002 in a space 71051 between the first portion 7101 and the fifth portion 7105 of the substrate 710 or in the vicinity thereof. The other end 7502 of the second support member 750 may be brought into contact with or coupled to the seventh surface 7002 in a space 71052 between the third portion 7103 and the fifth portion 7105 of the substrate 710 or in the vicinity thereof.

According to one embodiment, the flexible display 70 may include a transparent substrate (e.g. a window) 76 configured to cover the region between the eighteenth edge (reference numeral "71-18" in FIG. 7A) of the first display panel 71 and the thirteenth edge (reference numeral "72-13" in FIG. 7A) of the second display panel 72. According to one embodiment, the transparent substrate 76 may form at least part of the exterior of the electronic device 400. According to one embodiment, the transparent substrate 76 may include a first region 76-1 covering the first display panel 71, a second region 76-2 covering the second display panel 72, and a third region 76-3 covering a fourth portion 7014. If the flexible display 70 as illustrated in FIG. 7C is installed in the electronic device 400, the first region 76-1 may form at least a part of the first surface 4001, the second region 76-2 may form at least a part of the second surface 4002, and the third region 76-3 may form at least a part of the first lateral surface 416-1.

According to various embodiments, the first region 76-1, the second region 76-2, and the third region 76-3 may be made of the same material or different materials. According to various embodiments, some among the first region 76-1, the second region 76-2, and the third region 76-3 may be formed to have different thicknesses.

According to one embodiment, at least a part of the first region 76-1 or the third region 76-3 may be made of a flexible material (e.g. light-transmitting polyimide (PI) or reinforced polyimide (PI)). According to one embodiment, the second region 76-2 may be made of a more rigid or more impact-resistant material (e.g. tempered glass) than that of the first region 76-1 or the third region 76-3.

According to various embodiments, the transparent substrate 76 may be the second substrate 582 in FIG. 5.

In various embodiments, the transparent substrate 76 of the flexible display 70 may help the flexible display 70 remained in the form illustrated in FIG. 7C. For example, the substrate 710 having elements 71, 72, and 73 mounted thereon may be coupled to the transparent substrate 6 by inserting the substrate 710 having the elements 71, 72, 73 mounted thereon in an inner space of the transparent substrate 76, applying an adhesive material to an inner surface of the transparent substrate 76, and then transporting a laminator (not shown) along the inner surface of the transparent substrate 76.

According to one embodiment, referring to FIG. 7A, in the seventh direction 70011, the extending length D51 of the first display panel 71 may be designed to be longer than the extending length D61 of the second display panel 72. In the eighth direction 70012, the extending length D52 of the first display panel 71 may be designed to be longer than the extending length D62 of the second display panel 72.

According to various embodiments, although not shown, in the seventh direction 70011, the extending length D51 of the first display panel 71 may be designed to be substantially equal to the extending length D61 of the second display panel 72. According to various embodiments, in the eighth direction 70012, the extending length D52 of the first display panel 71 may be designed to be different from the extending length D62 of the second display panel 72.

Referring to FIG. 7A, the first display panel 71 may be designed to have a first resolution that is defined by the number of pixels arranged by length D51 in the seventh direction 70011 and the number of pixels arranged by the length D52 in the eighth direction 70012. The second display panel 72 may be defined to have a second resolution that is defined by the number of pixels arranged at the length D61 in the seventh direction 70011 and the number of pixels arranged at the length D62 in the eighth direction 70012. According to one embodiment, the first resolution and the second resolution may be designed to be identical to or different from each other. According to various embodiments, the first resolution may be higher than the second resolution.

The electronic device (reference numeral "400" in FIG. 4A) may include a printed circuit board (PCB) 770 disposed in a space 4005 formed in the flexible display 70 as illustrated in FIG. 7C. In one embodiment, the PCB 770 may be coupled to a support member (reference numeral "430" in FIG. 4A) and may be disposed in the hollow portion of the support member 430. The PCB 770 may configure execution conditions for the electronic device 400, may maintain information thereon, and may support constituent elements in inputting/outputting and exchanging data.

The PCB 770 may be electrically connected to the at least one electronic component (e.g. a DDI) 73. According to one embodiment, the electronic device 400 may include an electrical connection means (e.g. a flexible printed circuit board (FPCB), etc.) 780 configured to electrically connect the PCB 770 and the at least one electronic component 73.

According to one embodiment, the electronic device 400 may include a control circuit 760 (e.g. the processor 120 in FIG. 1 or the processor 210 in FIG. 2) mounted on the PCB 770. The control circuit 760 may be electrically connected to the at least one electronic component 73 through the electrical connection means 780.

The control circuit 760 may transmit a signal pertaining to a display operation or the like to the at least one electronic component 73. According to one embodiment, the at least one electronic component 73 (e.g. a DDI) may control at least a part of the first display panel 71 or the second display panel 72 to emit light, based on the signal from the control circuit 760.

According to one embodiment, the at least one electronic component 73 may selectively activate at least one of the first display panel 71 and the second display panel 72 on the basis of the signal from the control circuit 760.

According to one embodiment, the at least one electronic component 73 may configure the frame rate of the first display panel 71 or the second display panel 72 on the basis of the signal from the control circuit 760.

According to one embodiment, in a first state (or mode), the first display panel 71 and the second display panel 72 may be configured to have the same frame rate. For example, the first display panel 71 and the second display panel 72 may be configured to have a frame rate of 60 Hz.

According to one embodiment, in a second state, the first display panel 71 and the second display panel 72 may be configured to have different frame rates. For example, the second display panel 72 may be configured to have a frame rate lower than that of the first display panel 71. For example, in a low-power state, the first display panel 71 may be configured to have a frame rate of 60 Hz, and the second display panel 72 may be configured to have a frame rate of 1 Hz to 30 Hz.

According to various embodiments, the first state or the second state may vary according to user input, application execution, or the state of an electronic device (e.g. a state in which the remaining battery capacity is less than the threshold value).

According to various embodiments, the third portion 7103, in which the at least one electronic component 73 is installed, may be designed to be positioned at a different place. For example, FIGS. 8A and 8B illustrate an unfolded state of a flexible display 80 including two display panels according to another embodiment of the disclosure. Referring to FIGS. 8A and 8B, the flexible display 80 may include a substrate 810, a first display panel 81, a second display panel 82, and at least one electronic component 83. According to various embodiments, the first display panel 81 is at least partially similar or identical to the first display panel 71 of the flexible display 70 in FIG. 7A, 7B, or 7C, and thus a detailed description thereof will be omitted. According to various embodiments, the second display panel 82 is at least partially similar or identical to the second display panel 72 of the flexible display 70 in FIG. 7A, 7B, or 7C, and thus a detailed description thereof will be omitted. According to various embodiments, the at least one electronic component 83 is at least partially similar or identical to the at least one electronic component 73 of the flexible display 70 in FIG. 7A, 7B, or 7C, and thus a detailed description thereof will be omitted.

The substrate 810 typically has a rectangular plate shape including two surfaces (e.g. an eighth surface 8001 and a ninth surface 8002), and may be flexible. The substrate 810 may include a first portion 8101 on which the first display panel 81 is mounted, a second portion 8102 on which the second display panel 82 is mounted, and a third portion 8103 on which the at least one electronic component 83 is mounted. The substrate 810 may include a fourth portion 8104 between the first portion 8101 and the second portion 8102. According to various embodiments, the first portion 8101 is at least partially similar or identical to the first portion 7101 of the flexible display 70 in FIG. 7A, 7B, or 7C, and thus a detailed description thereof will be omitted. According to various embodiments, the second portion 8102 is at least partially similar or identical to the second portion 7102 of the flexible display 70 in FIG. 7A, 7B, or 7C, and thus a detailed description thereof will be omitted. According to various embodiments, the fourth portion 8104 is at least partially similar or identical to the fourth portion 7104 of the flexible display 70 in FIG. 7A, 7B, or 7C, and thus a detailed description thereof will be omitted.

According to various embodiments, the substrate 810 may be designed to include multiple gate lines and multiple source lines, which are not shown. For example, the multiple gate lines (e.g. reference numeral "620" in FIG. 6) may be arranged in a direction 80011 between opposite edges 810-9 and 810-10 of the substrate 810. For example, the multiple source lines (e.g. reference numeral "630" in FIG. 6) may be arranged in a direction 80012 between opposite edges 810-11 and 810-12 of the substrate 810. According to one embodiment, referring to FIG. 6, some 6201 among the e gate lines 620 may be disposed at the first portion 8101, and may be dedicated to the first display panel 81. Others 6202 among the multiple gate lines 620 may be disposed at the second portion 8102, and may be dedicated to the second display panel 82. According to various embodiments, referring to FIG. 6, the multiple source lines 630 may be dedicated to the first display panel 81 as well as the second display panel 82.

According to various embodiments, unlike the flexible display 70 in FIG. 7A, 7B, or 7C, the third portion 8103 may be connected to the second portion 8102. According to one embodiment, the substrate 810 may include a sixth portion 8106 between the second portion 8102 and the third portion 8103. The sixth portion 8106 may include wires (now shown) electrically connecting display panels 81 and 82 and the at least one electronic component 83.

FIG. 8C illustrates a structure in which the flexible display 80 is installed at an electronic device (e.g. reference numeral "400" in FIGS. 4A and 4B) according to another embodiment of the disclosure. Referring to FIG. 8C, in one embodiment, the flexible display 80 may be installed at the electronic device (reference numeral "400" in FIG. 4A) in the state in which the fourth portion 8104 is roundly bent. If the flexible display 80 as illustrated in FIG. 8C is installed at the electronic device 400, the first display panel 81 may be disposed along at least a part of the first surface (reference numeral "4001" in FIG. 4A) of the electronic device 400 and may be exposed through the first surface 4001. If the flexible display 80 as illustrated in FIG. 8C is installed at the electronic device 400, the second display panel 82 may be disposed along at least a part of the second surface (reference numeral "4002" in FIG. 4A) of the electronic device 400 and may be exposed through the second surface 4002. If the flexible display 80 as illustrated in FIG. 8C is installed at the electronic device 400, the round fourth portion 8104 of the substrate 810 may be disposed along the first lateral surface 416-1 of the electronic device 400.

Referring to FIG. 4A, the first display panel 81 may be designed to be disposed along at least a part of the first surface 4001 among the first surface 4001, the second surface 4002, and the first lateral surface 416-1 of the electronic device 400. According to various embodiments, although not shown, the first display panel 81 may be designed to be extendedly disposed along at least a part of the first lateral surface 416-1 of the electronic device 400. If the first display panel 81 is designed to be extendedly disposed along at least a part of the first lateral surface 416-1, a part of the first display panel 81, corresponding to the first lateral surface 416-1, may be roundly bent and installed at the electronic device 400. According to various embodiments, although not shown, the first display panel 81 may also be designed to be extendedly disposed along at least a part of the first lateral surface 416-1 of the electronic device 400 and along a part of the second surface 4002 of the electronic device 400.

Referring to FIG. 4B, the second display panel 82 may be designed to be disposed along at least a part of the second surface 4002 among the first surface 4001, the second surface 4002, and the first lateral surface 416-1 of the electronic device 400. According to various embodiments, although not shown, the second display panel 82 may be designed to be extendedly disposed along at least a part of the first lateral surface 416-1 of the electronic device 400. If the second display panel 82 is designed to be extendedly disposed along at least a part of the first lateral surface 416-1, a part of the second display panel 82, corresponding to the first lateral surface 416-1, may be roundly bent and installed at the electronic device 400.

Referring to FIG. 8C, in one embodiment, the flexible display 80 may installed at the electronic device (reference numeral "400" in FIGS. 4A and 4B) in the state in which the sixth portion 8106 is roundly bent. When the flexible display 80 as illustrated in FIG. 8C is installed at the electronic device 400, the sixth portion 8106, the third portion 8103, and the at least one electronic component 83 mounted on the third portion 8103 may be positioned in the inner space (e.g. reference numeral "8005") of the electronic device 400. For example, the sixth portion 8106, the third portion 8103, and the at least one electronic component 83 may be positioned in the hollow portion of the support member (reference numeral "430" in FIGS. 4A and 4B).

According to one embodiment, the fourth portion 8104 of the substrate 810 may be bent to a third curvature radius R3 (e.g. 10 mm or less). According to one embodiment, the sixth portion 8106 of the substrate 810 may be bent to a fourth curvature radius R4 (e.g. 10 mm or less). According to various embodiments, the laird curvature radius R3 may be different from the fourth curvature radius R4. For example, the third curvature radius R3 may be smaller than the fourth curvature radius R4.

According to various embodiments, the electronic device 400 may include a third support member 850 for maintaining the bent form of the sixth portion 8106 of the substrate 810. When seen in a cross section, the third support member 850 may typically have a rectangular cross section. One end 8501 of the third support member 850 may be brought into contact with or coupled to the ninth surface 8002 in a space 81061 between the second portion 8102 and the sixth portion 8106 of the substrate 810 or in the vicinity thereof. The other end 8502 of the third support member 850 may be brought into contact with or coupled to the ninth surface 8002 in a space 81062 between the third portion 8103 and the sixth portion 8106 of the substrate 810 or in the vicinity thereof.

The electronic device (reference numeral "400" in FIG. 4A) may include a PCB 870 disposed in a space 8005 formed by the flexible display 80 as illustrated in FIG. 8C. In one embodiment, referring to FIGS. 4A and 4B, the PCB 870 may be coupled to the support member 430 and may be disposed in the hollow portion of the support member 430.

The PCB 870 may be electrically connected to the at least one electronic component (e.g. a DDI) 83. According to one embodiment, the electronic device 400 may include an electrical connection means e.g., a flexible printed circuit board (FPCB)) 880 which electrically connects the PCB 870 and the at least one electronic component 83.

The electronic device 400 may include a control circuit 860 (e.g. the processor 120 in FIG. 1 or the processor 210 in FIG. 2) mounted on the PCB 870. The control circuit 860 may be electrically connected to the at least one electronic component 83 through the electrical connection means 880.

According to various embodiments, FIG. 9A, 9B or 9C illustrates a flexible display having another structure. Referring to FIG. 9A, 9B or 9C, a substrate 910 may be designed to have a structure in which at least one electronic component is mounted on each of both sides thereof. Referring to FIGS. 9A and 9B, a flexible display 90 may include the substrate 910, a first display panel 91, a second display panel 92, at least one first electronic component 93-1, and at least one second electronic component 93-2. According to various embodiments, the first display panel 91 is at least partially similar or identical to the first display panel 71 of the flexible display 70 in FIG. 7A, 7B, or 7C, and thus a detailed description thereof will be omitted. According to various embodiments, the second display panel 92 is at least partially similar or identical to the second display panel 72 of the flexible display 70 in FIG. 7A, 7B, or 7C, and thus a detailed description thereof will be omitted.

The substrate 910 typically has a rectangular plate shape including two surfaces (e.g. a tenth surface 9001 and an eleventh surface 9002), and may be flexible. The substrate 910 may include a first portion 9101 on which the first display panel 91 is mounted, a second portion 9102 on which the second display panel 92 is mounted, a third portion 9103 on which the at least one first electronic component 93-1 is mounted, and an eighth portion 9108 on which the at least one second electronic component 93-2 is mounted. The substrate 910 may include a fourth portion 9104 between the first portion 9101 and the second portion 9102. The substrate 910 may include a fifth portion 9105 between the first portion 9101 and the third portion 9103. The substrate 910 may include a seventh portion 9107 between the second portion 9102 and the eighth portion 9108.

The at least one first electronic component 93-1 mounted on the third portion 9103 may be electrically connected to the first display panel 91 mounted on the first portion 9101 through the fifth portion 9105. For example, the fifth portion 9105 may include wires for electrically connecting the first portion 9101 and the third portion 9103. The at least one second electronic component 93-2 mounted on the eighth portion 9108 may be electrically connected to the second display panel 92 mounted on the second portion 9102 through the seventh portion 9107. For example, the seventh portion 9107 may include wires for electrically connecting the second portion 9102 and the eighth portion 9108.

The at least one first electronic component 93-1 may be a DDI configured to drive the first display panel 91, and the at least one second electronic component 93-2 may be a DDI configured to drive the second display panel 92. According to various embodiments, the first portion 9101 may include multiple gate lines and multiple source lines, which are not shown, for the first display panel 91. The second portion 9102 may include multiple gate lines and multiple source lines, which are not shown, for the second display panel 92. According to various embodiments, if the at least one first electronic component 93-1 and the second electronic component 93-2 are DDIs for driving the respective display panels, the fourth portion 9104 may not include a wire for electrically connecting the first portion 9101 and the second portion 9102.

FIG. 9C illustrates a structure in which the flexible display 90 is installed at an electronic device (reference numeral "400" in 4A) according to another embodiment of the disclosure. Referring to FIG. 9C, in one embodiment, the flexible display 90 may be installed at the electronic device (reference numeral "400" in FIG. 4A) in the state in which the fourth portion 9104 is roundly bent. If the flexible display 90 as illustrated in FIG. 9C is installed at the electronic device 400, the first display panel 91 may be disposed along at least a part of the first surface (reference numeral "4001" in FIG. 4A) of the electronic device 400 and may be exposed through the first surface 4001. If the flexible display 90 as illustrated in FIG. 9C is installed at the electronic device 400, the second display panel 92 may be disposed along at least a part of the second surface (reference numeral "4002" in FIG. 4A) of the electronic device 400, and may be exposed through the second surface 4002. If the flexible display 90 as illustrated in FIG. 9C is installed at the electronic device 400, the round fourth portion 9104 of the substrate 910 may be disposed along the first lateral surface 416-1 of the electronic device 400.

Referring to FIG. 4A, the first display panel 91 may be designed to be disposed along at least a part of the first surface 4001 among the first surface 4001, the second surface 4002, and the first lateral surface 416-1 of the electronic device 400. According to various embodiments, although not shown, the first display panel 91 may also be designed to be extendedly disposed along at least a part of the first lateral surface 416-1 of the electronic device 400. If the first display panel 91 is designed to be extendedly disposed along the at least a part of the first lateral surface 416-1, a part of the first display panel 91, corresponding to the first lateral surface 416-1, may be roundly bent and installed at the electronic device 400. According to various embodiments, although not shown, the first display panel 91 may also be designed to be extendedly disposed along at least a part of the first lateral surface 416-1 of the electronic device 400 and along a part of the second surface 4002 thereof.

Referring to FIG. 4B, the second display panel 92 may be designed to be disposed along at least a part of the second surface 4002 among the first surface 4001, the second surface 4002, and the first lateral surface 416-1 of the electronic device 400. According to various embodiments, although not shown, the second display panel 92 may also be designed to be extendedly disposed along at least a part of the first lateral surface 416-1 of the electronic device 400. If the second display panel 92 is designed to be extendedly disposed along the at least a part of the first lateral surface 416-1, a part of the second display panel 92, corresponding to the first lateral surface 416-1, may be roundly bent and installed at the electronic device 400.

Referring to FIG. 9C, in one embodiment, the flexible display 90 may be installed at an electronic device (reference numeral "400" in FIG. 4A) in the state in which the fifth portion 9105 and the seventh portion 9107 are roundly bent. When the flexible display 90 as illustrated in FIG. 9C is installed at the electronic device 400, the fifth portion 9105, the third portion 9103, and the at least one first electronic component 93-1 may be positioned in an inner space 9005 of the electronic device 400. When the flexible display 90 as illustrated in FIG. 9C is installed at the electronic device 400, the seventh portion 9107, the eighth portion 9108, and the at least one second electronic component 93-2 may be positioned in the inner space 9005 of the electronic device 400. For example, the third portion 9103, the fifth portion 9105, the seventh portion 9107, the eighth portion 9108, the at least one first electronic component 93-1, and the at least one second electronic component 93-2 may be positioned in the hollow portion of the support member (reference numeral "430" in FIGS. 4A and 4B).

According to one embodiment, the fourth portion 9104 of the substrate 910 may be bent to a fifth curvature radius R5 (e.g. 10 mm or less). The fifth portion 9105 of the substrate 910 may be bent to a sixth curvature radius R6 (e.g. 10 mm or less). The seventh portion 9107 of the substrate 910 may be bent to a seventh curvature radius R7 (e.g. 10 mm or less). According to various embodiments, the fifth curvature radius R5 may be larger than the sixth curvature radius R6 or the seventh curvature radius R7. According to various embodiments, the sixth curvature radius R6 may be designed to be substantially identical to or different from the seventh curvature radius R7.

According to various embodiments, the electronic device 400 may include a fourth support member 950-1 for maintaining the bent form of the fifth portion 9105 of the substrate 910. The electronic device 400 may include a fifth support member 950-2 for maintaining the bent form of the seventh portion 9107 of the substrate 910. According to various embodiments, the fourth support member 950-1 is similar or identical to the second support member 750 in FIG. 7C, and thus a detailed description thereof will be omitted. According to various embodiments, the fifth support member 950-2 is similar or identical to the third support member 850 in FIG. 8C, and thus a detailed description thereof will be omitted.

The electronic device (reference numeral "400" in FIG. 4A) may include a PCB 970 disposed in the inner space 9005 formed by the flexible display 90 as illustrated in FIG. 9C. In one embodiment, referring to FIGS. 4A and 4B, the PCB 970 is coupled to the support member 430 and may be disposed in the hollow portion of the support member 430.

The electronic device 400 may include a first electrical connection means (e.g. a FPCB 981) which electrically connects the PCB 970 (or a control circuit 960 mounted on the PCB 970) and the at least one first electronic component 93-1. The electronic device 400 may include a second electrical connection means (e.g. an FPCB 982) which electrically connects the PCB 970 (or the control circuit 960) and the at least one second electronic component 93-2.

According to various embodiments, the electronic device 400 may include a first conductive pattern (not shown) disposed between a transparent substrate (e.g. reference numeral "76" in FIG. 7C or the second substrate 582 in FIG. 5) and a display panel (e.g. the first display panel 71, 81, or 91 or the second display panel 72, 82, or 92). For example, the first conductive pattern may be used to sense a touch input or a hovering input.

According to various embodiments, the first conductive pattern may be disposed in the display panel (e.g. the first display panel 71, 81, or 91 or the second display panel 72, 82, or 92). For example, the first display panel 71, 81, or 91 or the second display panel 72, 82, or 92 may be an on-cell TSP (touch screen panel) AMOLED (OCTA) or Y-OCTA display panel. According to various embodiments, the first conductive pattern may at least partially include aluminum (Al), copper (Cu), silver (Ag), graphene, indium-tin-oxide (ITO), or indium-zinc-oxide (IZO).

The electronic device 400 may include a touch/hovering input sensing circuit (not shown) electrically connected to the first conductive pattern. According to one embodiment, the touch/hovering input sensing circuit may be included in the PCB 770, 870, or 970. According to various embodiments, the at least one electronic component 73, 83, 93-1, or 93-2 may include the touch/hovering input sensing circuit. The touch/hovering input sensing circuit may activate at least a part of the first conductive pattern on the basis of a signal from the control circuit 760, 860, or 960. The touch/hovering input sensing circuit may sense a signal pertaining to a touch input or a hovering input through be first conductive pattern, and may provide the signal to the control circuit 760, 860, or 960. The control circuit 760, 860, or 960 may sense the touch input or the hovering input on the basis of the signal acquired from the touch/hovering input sensing circuit.

According to various embodiments, the electronic device 400 may include a second conductive pattern (not shown) disposed along at least some among the first surface 4001, the second surface 4002, and the third surface 4003. According to one embodiment, the second conductive pattern may be disposed along at least a part of the flexible display (e.g. reference numeral "40" in FIG. 4A). According to various embodiments, the second conductive pattern may be disposed along at least a part of the rear surface (e.g. the fifth surface 5302 in FIG. 5) of the flexible display (e.g. reference numeral "40" in FIG. 5).

The electronic device 400 may include a pressure-sensing circuit (not shown) electrically connected to the second conductive pattern. According to one embodiment, the pressure-sensing circuit may be included in the PCB 770, 870, or 970. According to various embodiments, the at least one electronic component 73, 83, 93-1, or 93-2 may include the pressure-sensing circuit. The pressure-sensing circuit may activate at least a part of the second conductive pattern on the basis of a signal from the control circuit 760, 860, or 960. The pressure-sensing circuit may sense a signal pertaining to pressure through the second conductive pattern and may provide the signal to the control circuit 760, 860, or 960. For example, the second conductive pattern may include multiple first electrodes and multiple second electrodes. The multiple first electrodes may be arranged on one layer, and the multiple second electrodes may be arranged on another layer. According to various embodiments, the second electrodes may be provided in various types to the electronic device 400. For example, the second electrodes may include a ground installed in the electronic device 400. The pressure-sensing circuit (not shown) may apply a voltage to the multiple first electrodes and the multiple second electrodes, and thus capacitance may be generated between the first electrodes and the second electrodes. For example, if pressure is applied to the outer surface of the electronic device 400, the distance between the first electrodes and the second electrode may decrease and capacitance may be changed (e.g. capacitance may increase). The pressure-sensing circuit may provide a signal according to the change in capacitance to the control circuit 760, 860, or 960. The control circuit 760, 860 or 960 may sense the generation position of pressure and the size thereof on the basis of the signal acquired from the pressure-sensing circuit.

According to various embodiments, the electronic device 400 may include a third conductive pattern (not shown) disposed along at least some among the first surface 4001, the second surface 4002, and the third surface 4003. According to one embodiment, the third conductive pattern may be disposed along at least a part of a flexible display (e.g. reference numeral "40" in FIG. 4A). According to various embodiments, the third conductive pattern may be disposed between the transparent substrate 76 (e.g. the second substrate 582 in FIG. 5) and the first conductive pattern. According to various embodiments, the third conductive pattern may also be disposed between the first conductive pattern and the display panel (e.g. the first display panel 71, 81, or 91 or the second display panel 72, 82, or 92).

According to one embodiment, the third conductive pattern may include an electrode pattern having a mesh structure. The electrode pattern having a mesh structure may be defined as a "metal mesh pattern". The metal mesh pattern may include openings. Light generated in the flexible display (e.g. reference numeral "40" in FIG. 4A) may be emitted to the outside through the openings in the metal mesh pattern. According to various embodiments, the mesh shape of the metal mesh pattern may be various. The mesh shape may be, for example, quadrangular, hexagonal, or the like. According to various embodiments, the mesh shape of the metal mesh pattern ay be designed to be completely uniform or partially different. According to various embodiments, the mesh size of the metal mesh pattern may be designed to be completely uniform or partially different. According to various embodiments, the thickness of the metal mesh pattern may be designed to be completely uniform or partially different.

The electronic device 400 may include a wireless communication circuit (e.g. the communication module 220 in FIG. 2) electrically connected to the third conductive pattern. The wireless communication circuit may be included in the PCB 770, 870, or 970. According to various embodiments, the at least one electronic component 73, 83, 93-1, or 93-2 may also include the wireless communication circuit. The wireless communication circuit may activate at least a part of the third conductive pattern on the basis of a signal from the control circuit 760, 860, or 960. The wireless communication circuit may wirelessly transmit a signal from the control circuit 760, 860, or 960 to the outside by using the third conductive pattern. The wireless communication circuit may receive a signal from the outside through the conductive pattern and may provide the signal to the control circuit.

According to various embodiments, the electronic device 400 may include at least one optical sensor 440 disposed in at least a part of the rear surface (e.g. the fifth surface 5302 in FIG. 5) of the flexible display (e.g. reference numeral "40" in FIG. 4A). For example, the at least one optical sensor 440 may be disposed adjacent to the fifth surface (reference numeral "5302" in FIG. 5) (e.g. 10 mm or less). The at least one optical sensor 440 may measure the intensity of light in various wavelength bands, and the electronic device 400 may analyze a material quantitatively or qualitatively by using measured data from the at least one optical sensor 440. The at least one optical sensor 440 may include a light-receiving unit 441 and a light-emitting unit 442. The light-emitting unit 442 may generate light in one or more wavelength bands. The light-receiving unit 441 may receive light (or an optical signal) scattered or reflected from an object, and may generate an electrical signal (or a digital value) on the basis of the received light. The electronic device 400 may include an analog-to-digital converter (ADC). The ADC may generate a detection value (or a digital value or an ADC value) corresponding to the amount of light received by the light-receiving unit 441 (e.g. quantization).

According to one embodiment, at least a part of the flexible display (e.g. reference numeral "40" in FIG. 4A) may be designed to be transmitted by light. For example, light output from the light-emitting unit 442 may be emitted to the outside through the flexible display 40. Light scattered or reflected from an object may be introduced into the light-receiving unit 441 through the flexible display 40.

According to one embodiment, the light-receiving unit 441 may include one or more photodetectors (or sensors) (e.g. photodiodes), which are not shown, capable of detecting light in one or more wavelength bands.

According to various embodiments, the light-receiving unit 441 may include multiple photodetectors and the multiple photodetectors may detect light in at least one different wavelength band. For example, one photodetector may detect light in a first wavelength band, and another photodetector may detect light in a second wavelength band different from the first wavelength band.

According to various embodiments, the light-receiving unit 441 may include multiple photodetectors, and the multiple photodetectors may detect light in at least one similar or identical wavelength band. For example, one photodetector may detect light in a first wavelength band, and another photodetector may detect light in a first wavelength band in addition to light in a second wavelength band different from the first wavelength band. Another photodetector may detect light in a first wavelength band in addition to light in a third wavelength band different from the first and second wavelength bands. Another photodetector may detect light in a first wavelength band in addition to light in a fourth wavelength band different from the first, second, and third wavelength bands.

For example, the light-receiving unit 441 may detect light in a proximity detection wavelength band (e.g. a maximum-sensitivity wavelength of 940 nm or 950 nm). For example, in a proximity detection mode, if an object (e.g. a user's face) is moved near (e.g. 10 cm or less) to the at least one optical sensor 440 toward the first surface (e.g. reference numeral "4001" in FIG. 4A) of the electronic device 400, light in a proximity detection wavelength band, output from the light-emitting unit 442, may be scattered or reflected by the object. The scattered or reflected light in a proximity detection wavelength band is introduced into the light-receiving unit 441, and the light-receiving unit 441 may generate an electrical signal pertaining to the approach of the object or the approach distance of the object, from the scattered or reflected light that has been introduced. For example, as the distance between the at least one optical sensor 440 and the object decreases, the amount of light scattered or reflected from the object and introduced to the light-receiving unit 441 increases, and an ADC value may increase. As the distance between the at least one optical sensor 440 and the object ease, the amount of reflected light, introduced into the light-receiving unit 441, decreases and the ADC value may decrease.

For example, the light-receiving unit 441 may detect light in a gesture detection wavelength band (e.g. a maximum-sensitivity wavelength of 940 nm). For example, in a gesture detection mode, if a user's hand moves near (e.g. 10 cm or less) the first surface (e.g. reference numeral "4001" in FIG. 4A) of the electronic device 400, light in a gesture detection wavelength band, output from the light-emitting unit 442, may be scattered or reflected by the user's hand. The scattered or reflected light in a gesture detection wavelength band is introduced into the light-receiving unit 441, and the light-receiving unit 441 may generate an electrical signal pertaining to the gesture of the user's hand from the scattered or reflected light that has been introduced.

For example, the light-receiving unit 441 may detect light in an object analysis wavelength band. For example, in a biometric detection mode, if a user's body moves near 10 cm or less) to the at least one optical sensor 440 toward the first surface (e.g. reference numeral "4001" in FIG. 4A) of the electronic device 400, light in a biometric detection wavelength band, output from the light-emitting unit 442, may be reflected by e user's body. The scattered or reflected light in a biometric detection wavelength band is introduced into the light-receiving unit 441, and the light-receiving unit 441 may generate an electrical signal pertaining to biometric characteristics (e.g. skin moisture, skin melanin, skin temperature, cardiac rate, blood flow velocity, iris, etc.) of the user's body from the scattered or reflected light that has been introduced. For example, in a skin moisture detection mode, the light-receiving unit 441 may be designed to detect light in a wavelength band including a maximum-sensitivity wavelength of 880 nm and/or in a wavelength band including a maximum-sensitivity wavelength of 970 nm. For example, in a skin melanin detection mode, the light-receiving unit 441 may be designed to detect light in a wavelength band including a maximum-sensitivity wavelength of 660 nm and/or a maximum-sensitivity wavelength of 880 nm. For example, in an erythema detection mode, the light-receiving unit 441 may be designed to detect light in a wavelength band including a maximum-sensitivity wavelength of 568 nm and/or in a wavelength band including a maximum-sensitivity wavelength of 880 nm. According to various embodiments, in an iris recognition mode, the light-receiving unit 441 may be designed to detect light in a pertinent wavelength band. According to various embodiments, in a fingerprint recognition mode, the light-receiving unit 441 may be designed to detect light in a pertinent wavelength band.

For example, the light-receiving unit 441 may detect light in an external environment measurement wavelength band. For example, in an illuminance detection mode, the light-receiving unit 441 may receive external light and may generate an electrical signal pertaining to the illuminance from the received external light.

According to various embodiments, the electronic device 400 may provide various detection modes. For example, the detection modes may be variously provided as a proximity detection mode, a gesture detection mode, a biometric detection mode, an illuminance detection mode, etc. For example, the detection modes may include various sub-detection-modes. For example, the biometric detection mode may include various sub-detection-modes, such as a skin moisture detection mode, a skin melanin detection mode, a skin temperature detection mode, etc. According to one embodiment, the control circuit 760, 860, or 960 may selectively activate at least a part of the light-receiving unit 441 according to a selected detection mode. For example, in the proximity detection mode, the control circuit 760, 860, or 960 may select and activate at least one photodetector for proximity detection from among multiple photodetectors of the light-receiving portion 441. For example, in the biometric detection mode, the control circuit may select and activate at least one photodetector for biometric detection from among the multiple photodetectors of the light-receiving portion 441.

The light-emitting unit 442 may include at least one light emitter (or light source) capable of generating light in one or more wavelength bands. According to one embodiment, the light-emitting unit 442 may include a light emitter capable of generating light in all wavelength bands in which the light can be detected. For example, the light-emitting unit 442 may be designed as a single light emitter. The single light emitter may be a light-emitting device capable of generating light in a broad wavelength band. According to various embodiments, the light-emitting unit 442 may be designed to selectively generate light in a pertinent wavelength band under the control of the control circuit 760, 860, or 960. For example, in the proximity detection mode, the control circuit may control the light-emitting unit 442 to generate light in a proximity detection wavelength band. For example, in the biometric detection mode, the control circuit may control the light-emitting unit 442 to generate light in a biometric detection wavelength band.

According to one embodiment, the light-emitting unit 442 includes multiple light emitters, and the multiple light emitters may generate light in at least one different wavelength band. For example, one light emitter may generate light in a first wavelength band, and another light emitter may generate light in a second wavelength band different from the first wavelength band. For example, in the proximity detection mode, the control circuit 760, 860, or 960 may select and activate at least one light emitter for generating light in a proximity detection wavelength band from among the multiple light emitters of the light-emitting unit 442. For example, in the biometric detection mode, the control circuit may select and activate at least one light emitter for generating light in a biometric detection wavelength band from among the multiple light emitters of the light-emitting unit 442.

According to various embodiments, the light-emitting unit 442 may include various types of light-emitting devices. For example, the light-emitting unit 442 may include a light-emitting diode (LED).

According to various embodiments, the optical sensor 440 may be provided as a single module in a package (e.g. a system-in-package (SIP).

According to various embodiments, the light-receiving unit 441 or light-emitting unit 442 may be mounted on the PCB (e.g. reference numeral "770" in FIG. 7C). One end of the light-receiving unit 441 may be electrically connected to a ground member of the electronic device 400 (e.g. a ground of the PCB), and the other end of the light-receiving unit 441 may be electrically connected to the control circuit (e.g. reference numeral "760" in FIG. 7C, reference numeral "860" in FIG. 8C, or reference numeral "960" in FIG. 9C). The light-receiving unit 441 may detect light, may generate an electrical signal on the basis of the detected light (or may convert the detected light into an electrical signal), and may transfer the generated electrical signal to the control circuit 760, 860, or 960.

According to various embodiments, referring to FIGS. 4A and 4C, if the flexible display 40 is designed to extend to the second edge 415-2 of the first surface 4001, the electronic device 400 may display a software home button 417 through the flexible display 40 (e.g. the first display panel (reference numeral "71" in FIG. 7A)). For example, if the software home button 417 is selected by a touch input or a hovering input, the electronic device 400 may display a main home screen. The main home screen may be a first screen displayed on the flexible display 40 when the electronic device 400 is turned on. When multiple home screens are provided in the form of changeable pages, the main home screen may display icons for executing applications, or the time or date. According to various embodiments, the home screens may display the state of the electronic device 400, such as the battery charge state, the intensity of a reception signal, or the current time. According to another embodiment, if the software home button 417 is selected, the electronic device 400 may enter a sleep mode or a low-power mode. In the sleep mode or the low-power mode, the electronic device 400 may perform only configured basic operations, such as an operation of periodically picking up a wireless signal from the outside. In the sleep mode or the low-power mode, the electronic device 400 may perform an operation of deactivating at least one element (e.g. the flexible display 40). The sleep mode or the low-power mode may include an operation of deactivating at least a part of the control circuit 760, 860, or 969. According to various embodiments, if the software home button 417 is selected, the electronic device 400 may change the sleep mode or the low-power mode into a wake-up-mode. For example, in the wake-up-mode, the electronic device 400 may activate the flexible display 40.

According to various embodiments, the electronic device 400 may determine whether the software home button 417 has been selected, based on a signal generated from a pressure sensor positioned to be aligned with the software home button 417. According to one embodiment, the pressure sensor may include at least a part of the second conductive pattern electrically connected to the pressure-sensing circuit.

According to various embodiments, although not shown, the flexible display 40 may be designed so as not to extend to at least a part of the second edge 415-2 of the first surface 4001. The electronic device 400 may include a hardware home button (not shown) installed between the second edge 415-2 and the flexible display 40.

According to various embodiments, the electronic device 400 may display an indicator (not shown) indicating various states of the electronic device 400 through the flexible display 40. The display position of the indicator may be variously designed. For example, if the flexible display 40 is designed to extend to the first edge 415-1 of the electronic device 400, the electronic device 400 may display an indicator through one region of the flexible display 40, which is positioned near the first edge 415-1. For example, when the remaining battery capacity is insufficient, the electronic device 400 may display an indicator. According to various embodiments, the electronic device 400 may display an indicator only when the screen is turned, off. According to various embodiments, if the electronic device 400 is connected to a wired charger or a wireless charger, the electronic device 400 may display an indicator. According to various embodiments, the electronic device 400 may display an indicator in various types or colors corresponding to various states of the electronic device 400.

According to various embodiments, the electronic device 400 may include a receiver for outputting, as sound, a voice signal received from a counterpart device during communication. According to one embodiment, if the flexible display 40 is designed to extend to the first edge 415-1, although not shown, the flexible display 40 may include a through-hole formed at a position aligned with the receiver.

According to various embodiments, although not shown, the flexible display 40 may be designed so as not to extend to at least a part of the first edge 415-1 of the first surface 4001 of the electronic device 400. The electronic device 400 may include a receiver installed between the first edge 415-1 and the flexible display 40.

According to various embodiments, if the flexible display 40 is designed to extend to the first edge 415-1 of the first surface 4001, a bone-conduction-type receiver may be installed in the electronic device 400. If the bone-conduction-type receiver is installed, a through-hole for discharging sound from the receiver may be omitted.

According to various embodiments, the electronic device 400 may include a first camera (or a front camera). In one embodiment, referring to FIGS. 4A and 4C, if the flexible display 40 is designed to extend to the first edge 415-1, the flexible display 40 may include a light-transmitting region 421 or a through-hole formed at a position aligned with the first camera 416.

According to various embodiments, although not shown, the flexible display 40 may be designed so as not to extend to at least a part of the first edge 415-1 of the first surface 4001 of the electronic device 400. The first camera may be installed between the first edge 415-1 and the flexible display 40.

According to various embodiments, the electronic device 400 may include a second camera (or a rear camera). In one embodiment, referring to FIGS. 4B and 4D, if the flexible display 40 is designed to extend to the fifth edge 415-5, the flexible display 40 may include a light-transmitting region 422 or a through-hole formed at a position aligned with the second camera 417.

According to various embodiments, although not shown, the flexible display 40 may be designed so as not to extend to at least a part of the fifth edge 415-5 of the second surface 4002 of the electronic device 400. The second camera may be installed between the fifth edge 415-5 and the flexible display 40.

According to various embodiments, the electronic device 400 may include a flash. In one embodiment, referring to FIGS. 4B and 4D, if the flexible display 40 is designed to extend to the fifth edge 415-5, the flexible display 40 may include a light-transmitting region 423 or a through-hole formed at a position aligned with a flash 418.

According to various embodiments, although not shown, the flexible display 40 may be designed so as not to extend to at least a part of the fifth edge 415-5 of the second surface 4002 of the electronic device 400. The flash may be installed between the fifth edge 415-5 and the flexible display 40.

According to various embodiments, the support member 430 (e.g. the second frame 430-2) may include multiple through-holes 4191 for supporting a speaker (not shown). Sound from the speaker installed in the electronic device 400 may be emitted to the outside through the multiple through-holes 4191.

According to various embodiments, the support member 430 (e.g. the second frame 430-2) may include a through-hole 4193 for supporting a microphone (not shown). Sound from the outside may be introduced into the microphone installed in the electronic device 400 through the through-hole 4193.

According to various embodiments, the support member 430 (e.g. the second frame 430-2) may include a through-hole 4192 for supporting a connector (not shown). A connector of an external device may be connected to the connector installed in the electronic device 400 through the through-hole 4192.

According to various embodiments, the support member 430 (e.g. the third frame 430-3 or the fourth frame 430-4) may include through-holes for supporting buttons 4194, 4195, and 4196.

According to various embodiments, the electronic device 400 may be designed to include various other components which are not shown.

Referring to FIG. 7C, in one embodiment, the length (reference numeral "D51" in FIGS. 7A and 7B) of the first display panel (e.g. reference numeral "71" in FIG. 7C) may be designed to be longer than the length (reference numeral "D61" in FIGS. 7A and 7B) of the second display panel (e.g. reference numeral "72" in FIG. 7C). A space 790 may be formed between the end of the second display panel 72 (e.g. the ninth edge 710-9 of the substrate 710) and a structure 791 opposite thereto (e.g. the second frame 430-2 of the support member (reference numeral "430" in FIG. 4A)). Referring to FIG. 4D, the electronic device 400 may include various electronic components (not shown) installed in the space 790. According to various embodiments, it is also possible to make a design for installing the second camera 417 or the flash 418 in the space 790, and the second frame 430-2 of the support member 430 may include a light-transmitting region or a through-hole aligned with the second camera 417 or the flash 418. Although not shown, various other electronic components may be installed in the space 790. Also, in the example of FIG. 8C, a similar space 890 may be formed, and it is possible to make a design for installing various electronic components in the space 890.

According to various embodiments, although not shown, the fourth portion 7104 of the flexible display (reference numeral "70" in FIG. 7C) may be designed to include a light-transmitting region or a through-hole for supporting at least one electronic component installed in the space 7005. For example, electronic components, such a camera, a connector (e.g. a connector for battery charging, data communication, etc., or an ear jack) or the like, may be aligned with a through-hole formed through the fourth portion 7104. According to various embodiments, although not shown, the transparent substrate 76 may be designed to include a through-hole corresponding to the through-hole of the fourth portion 7104. Although not shown, in the example of FIG. 8C, the fourth portion 8104 may also be designed to include a light-transmitting region or a through-hole for supporting various electronic components.

Figure 10:
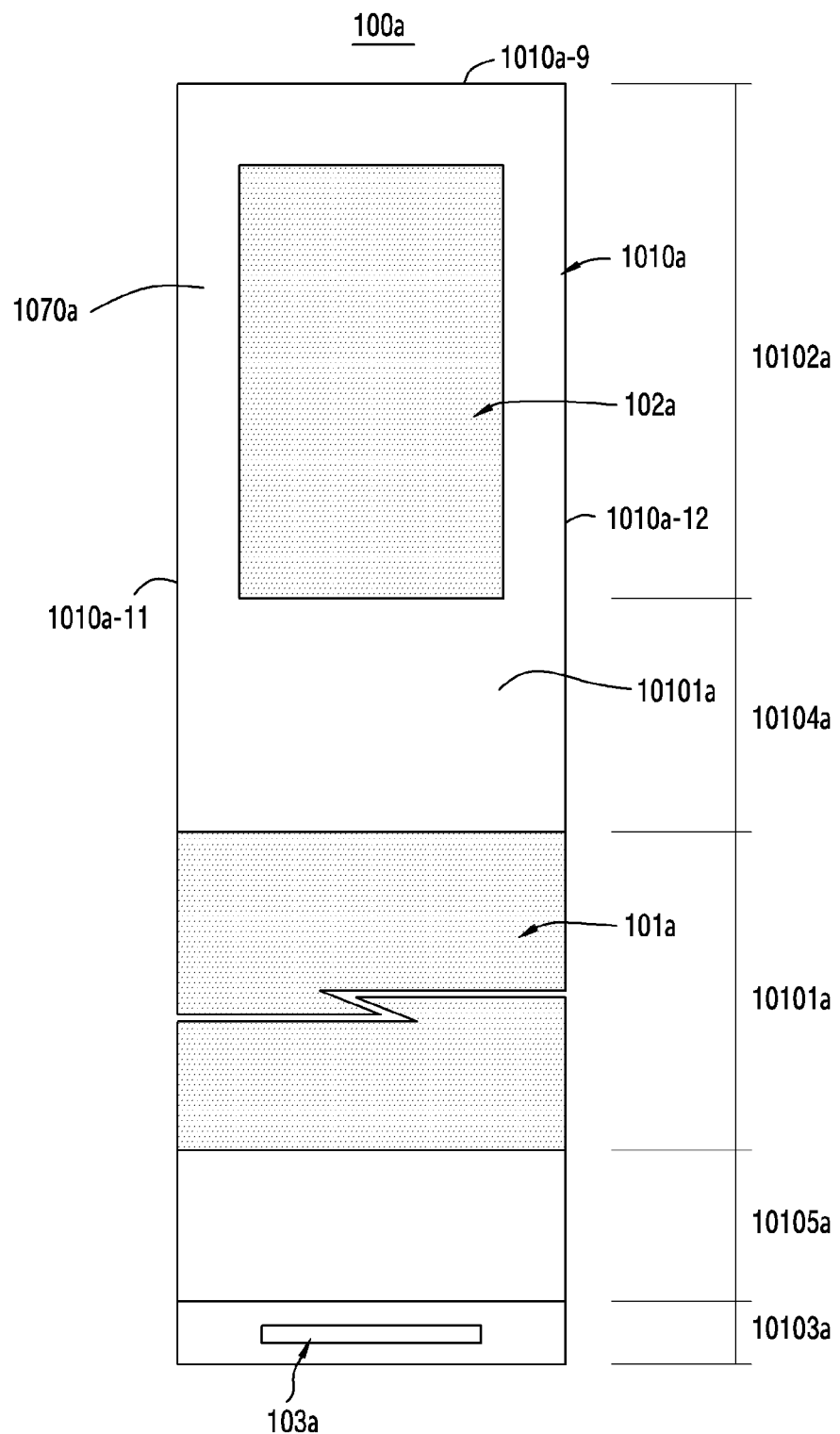
FIG. 10 illustrates various structures of a flexible display according to various embodiments of the disclosure.

FIG. 10 illustrates various structures of a flexible display according to various embodiments of the disclosure.

Referring to FIG. 10, a flexible display 100a may include a substrate 1010a, a first display panel 101a, a second display panel 102a, and at least one electronic component 103a, According to various embodiments, the first display panel 101a is at least partially similar or identical to the first display panel 71 of the flexible display 70 in FIG. 7A, 7B, or 7C, and thus a detailed description thereof will be omitted. According to various embodiments, the second display panel 102a is at least partially similar or identical to the second display panel 72 of the flexible display 70 in FIG. 7A, 7B, or 7C, and thus a detailed description thereof will be omitted. According to various embodiments, the at least one electronic component 103a is at least partially similar or identical to the at least one electronic component 73 of the flexible display 70 in FIG. 7A, 7B, or 7C, and thus a detailed description thereof will be omitted.

The substrate 1010a has a rectangular plate shape, and may be flexible. The substrate 1010a may include a first portion 10101a on which the first display panel 101a is mounted, a second portion 10102a on which the second display panel 102a is mounted, and a third portion 10103a on which the at least one electronic component 103a is mounted. The substrate 1010a may include a fourth portion 10104a between the first portion 10101a and the second portion 10102a. The substrate 1010a may include a fifth portion 10105a between the first portion 10101a and the third portion 10103a. According to various embodiments, like the flexible display 70 as illustrated in FIG. 7C, the flexible display 100a may be installed at an electronic device (e.g. reference numeral "201" in FIG. 2) in the state in which the fourth portion 10104a and the fifth portion 10105a are roundly bent.

According to one embodiment, the second display panel 102a may be designed to cover a part of the second portion 10102a. For example, the second display panel 102a is typically rectangular, and a region 1070a, which is not covered by the second display panel 102a, may be formed around the second display panel 102a.

According to various embodiments, the region 1070a, which is not covered by the second display panel 102a, may include at least one conductive pattern which is not shown. If the flexible display 100a is installed at the electronic device (e.g. reference numeral "201" in FIG. 2), the at least one conductive pattern may be connected to a wireless communication circuit (e.g. the communication module 220 in FIG. 2) installed in the electronic device 201, and may be used as an antenna radiator for supporting various types of communication.

According to various embodiments, the at least one electronic component 103a may be electrically connected to the at least one conductive pattern through a wire (not shown) included in the substrate 1010a. The at least one electronic component 103a may include one or more contacts. If the flexible display 100a is installed at the electronic device (e.g. reference numeral "201" in FIG. 2), the one or more contacts or a connector may be electrically connected to the PCB (e.g. reference numeral "770" in FIG. 7C) installed in the electronic device 201. The wireless communication circuit mounted on the PCB may be electrically connected to the at least one conductive pattern.

According to various embodiments, the at least one conductive pattern may extend to the fourth portion 10104a. Although not shown, in various embodiments, if the first display panel 101a is designed to cover a part of the first portion 10101a, a region that is not covered by the first display panel 101a may also include east one conductive pattern used as an antenna radiator.

According to various embodiments, although not shown, the region 1070a, which is not covered by the second display panel 102a, may include at least one through-hole or light-transmitting region for supporting various electronic components installed in the electronic device (e.g. reference numeral "201" in FIG. 2). For example, the camera may detect light from the outside through the through-hole or the light-transmitting region formed in the region 1070a. For example, the at least one optical sensor (e.g. at least some of the sensor modules 240 in FIG. 2) (e.g. an image sensor, a proximity sensor, an illuminance sensor, a spectral sensor, etc.) may detect light from the outside through the through-hole or the light-transmitting region formed in the region 1070a. For example, the speaker may emit sound through the through-hole formed in the region 1070a. According to various embodiments, the through-hole or the light-transmitting region may be arranged near an edge 1010a-9 of the substrate 1010a. According to various embodiments, the through-hole or the light-transmitting region may be arranged at the center between two edges 1010a-11 and 1010a-12.

According to various embodiments, although not shown, the fourth portion 10104a may include at least one through-hole or light-transmitting region for supporting various electronic components (a camera, at least one sensor, a connector, etc.) installed in the electronic device (e.g. reference numeral "201" in FIG. 2). For example, a connector of an external device may be connected to the connector installed in the electronic device (e.g. reference numeral "201" in FIG. 2) through the through-hole formed in the fourth portion 10104a.

Figure 11:
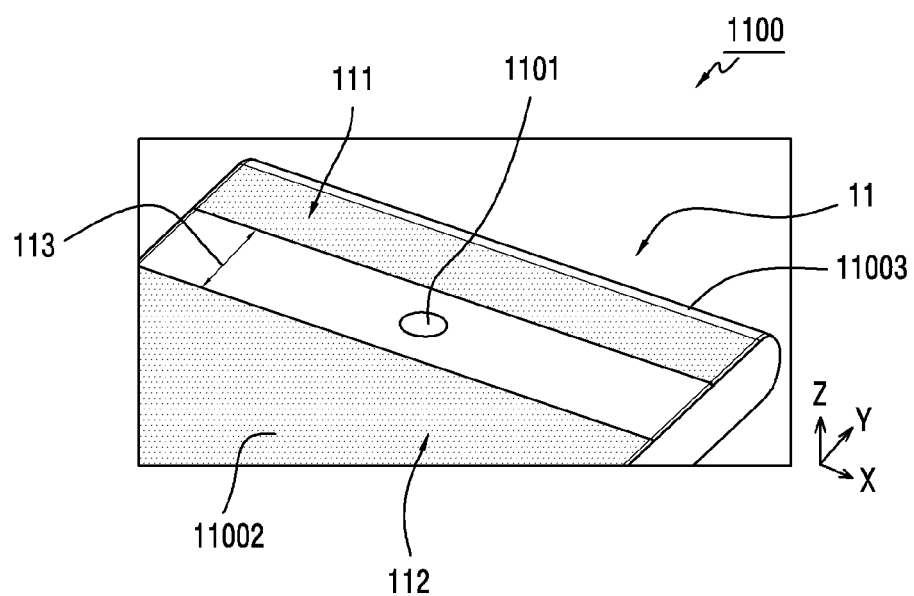
FIG. 11 illustrates various structures of a flexible display according to various embodiments of the disclosure.

FIG. 11 illustrates an electronic device including a flexible display according to various embodiments of the disclosure.

Referring to FIG. 11, an electronic device 1100 may include a flexible display 11 in which a first display panel 111 and a second display panel 112 are arranged on one substrate. According to one embodiment, the first display panel 111 (e.g. reference numeral "71" in FIG. 7A) may extend so as to be disposed along a part of a second surface 11002 (e.g. reference numeral "4002" in FIG. 4B) in addition to a first lateral surface 11003 (e.g. reference numeral "416-1" in FIG. 4A). The second display panel 112 may be disposed along a part of the second surface 11002.

According to one embodiment, the electronic device 1100 may include at least one electronic component 1101 (e.g. a camera, a sensor, etc.) installed in a space 113 between the first display panel 111 and the second display panel 112.

Figure 12A:
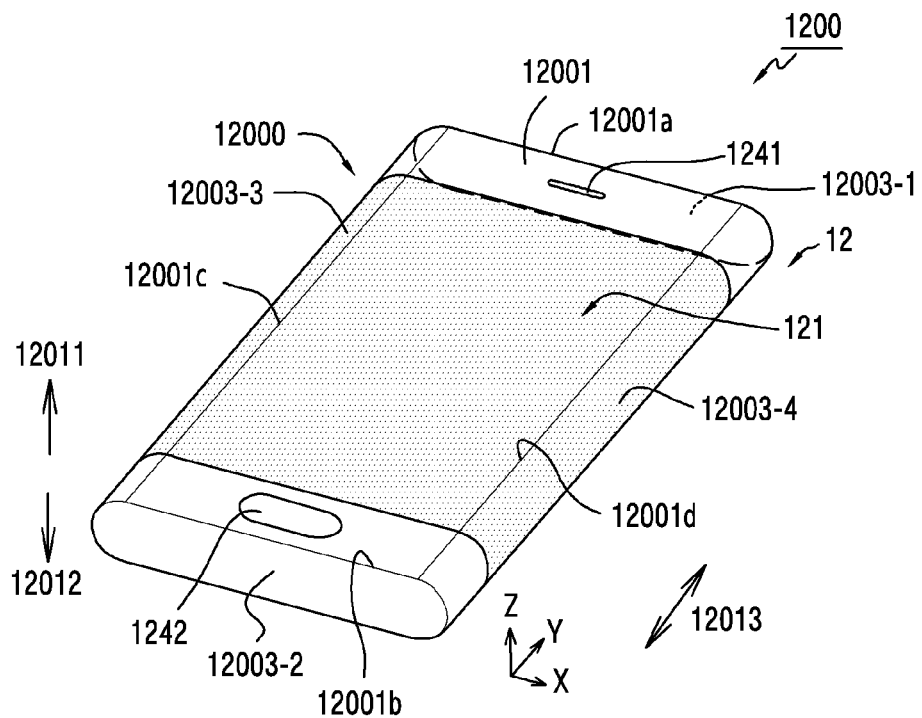
FIGS. 12A to 12C illustrate an electronic device including a flexible display according to various embodiments of the disclosure.
Figure 12B:
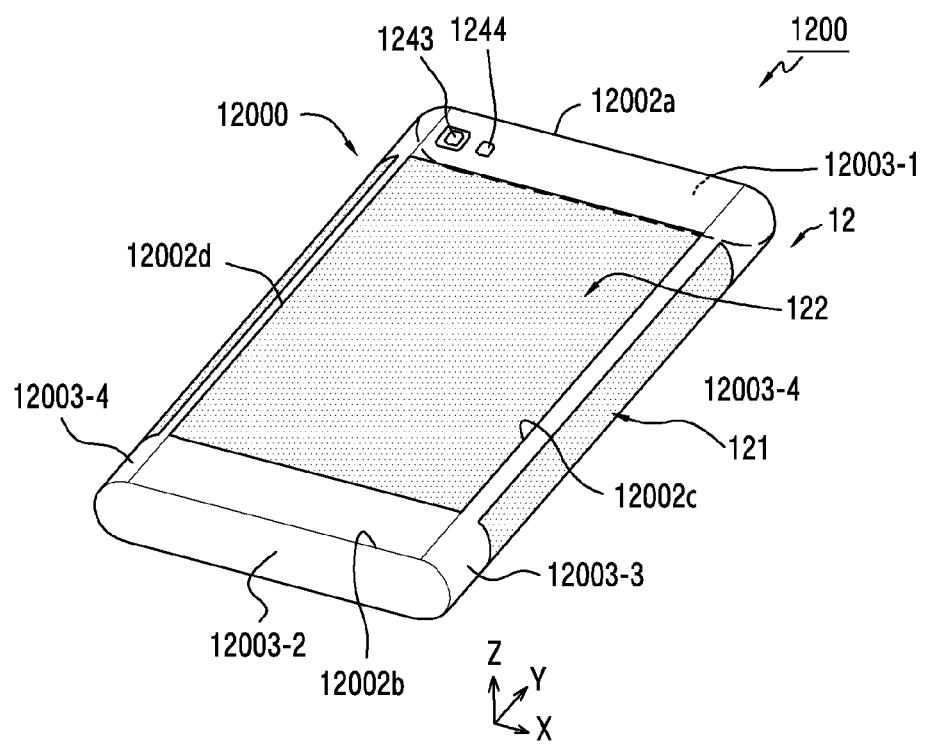
Figure 12C:
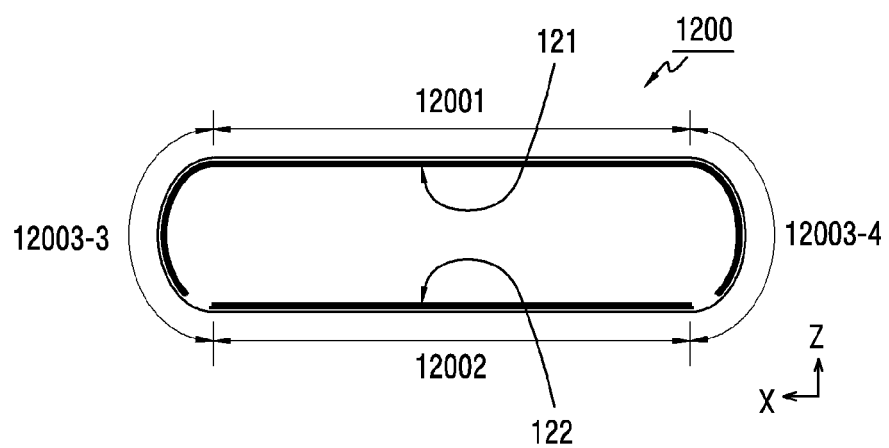
Figure 13A:
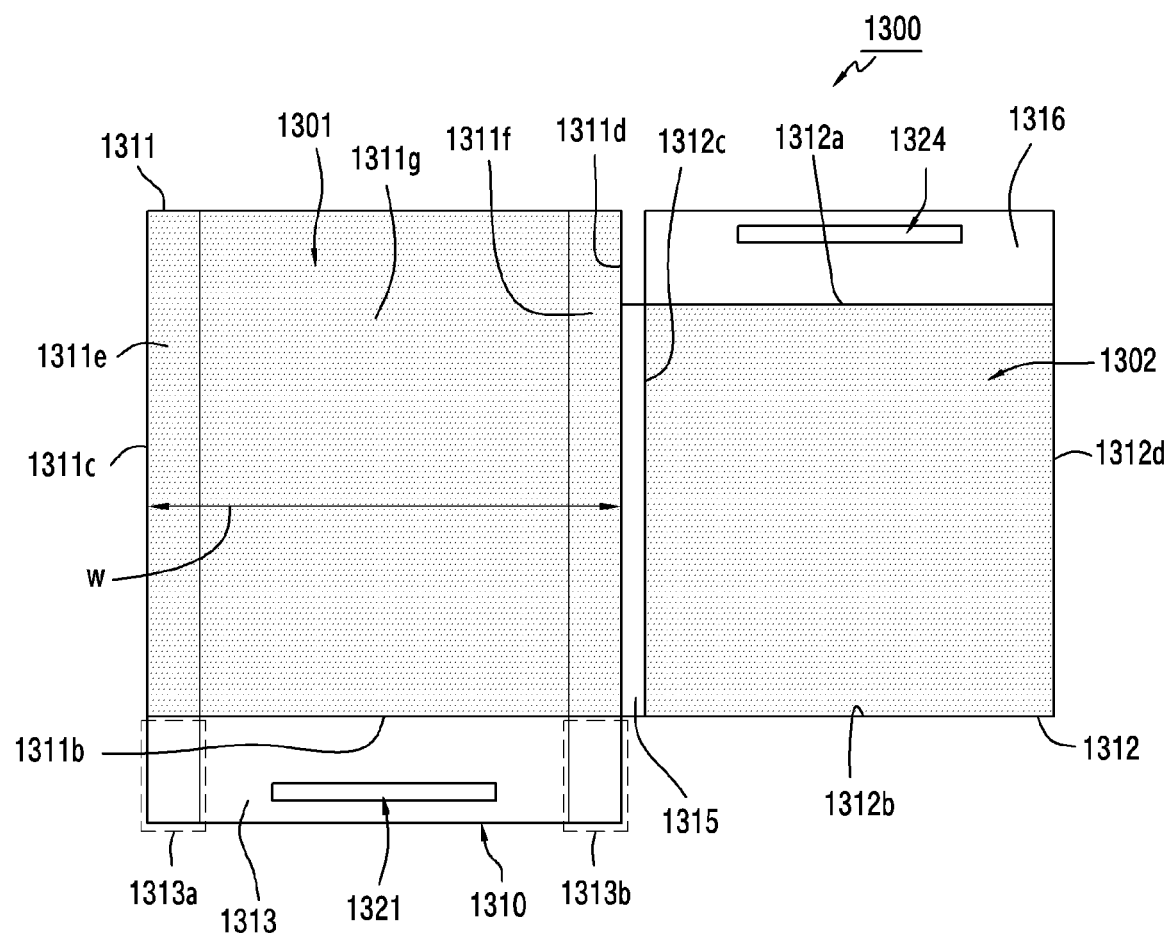
FIGS. 13A and 13B illustrate an electronic device including a flexible display according to one embodiment of the disclosure.
Figure 13B:
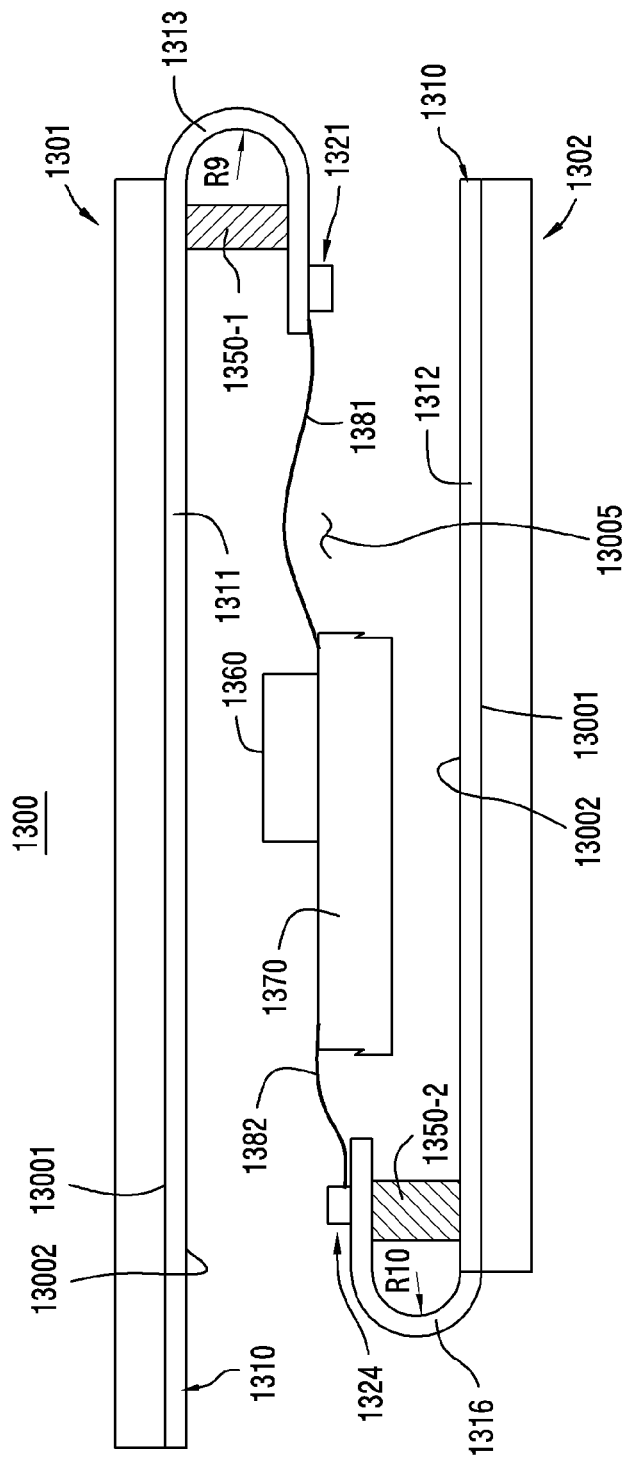
Figure 14A:
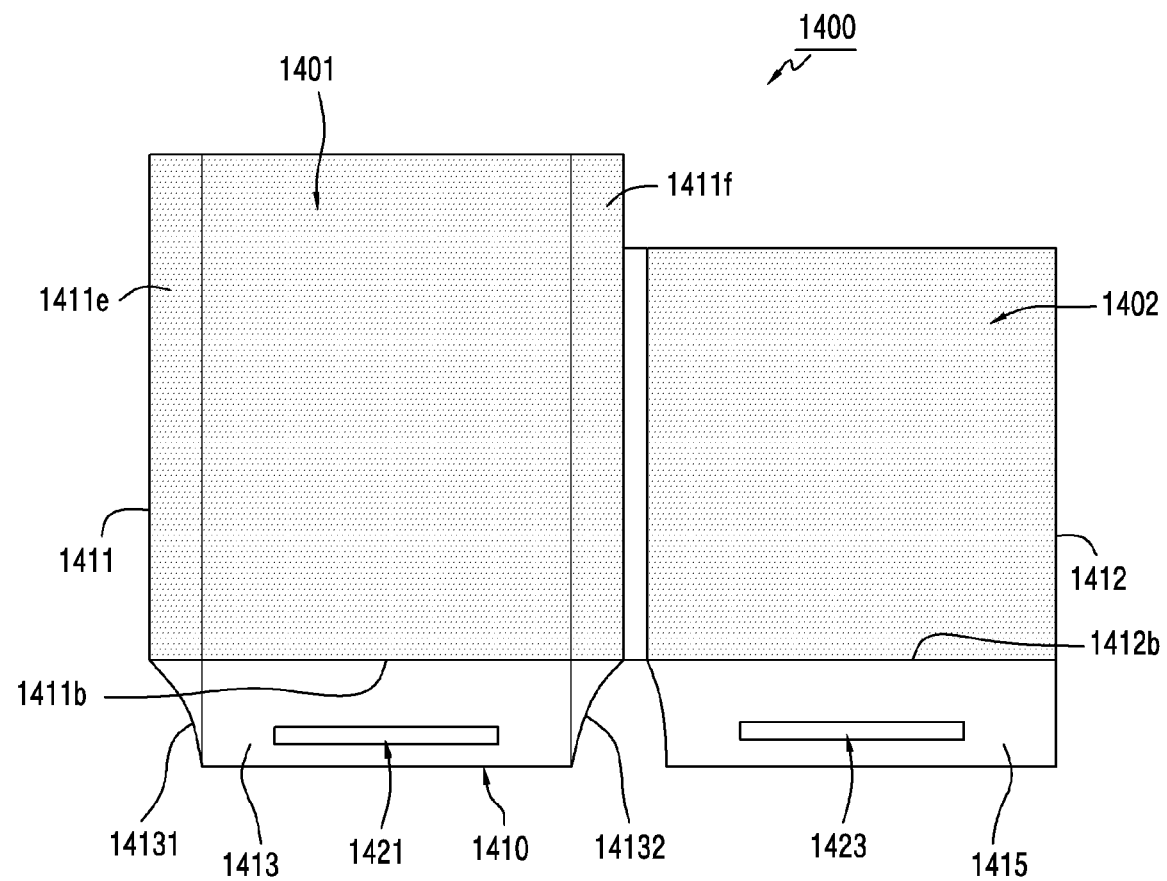
FIG. 14A illustrates an unfolded state of a flexible display including two display panels according to one embodiment of the disclosure.
Figure 14B:
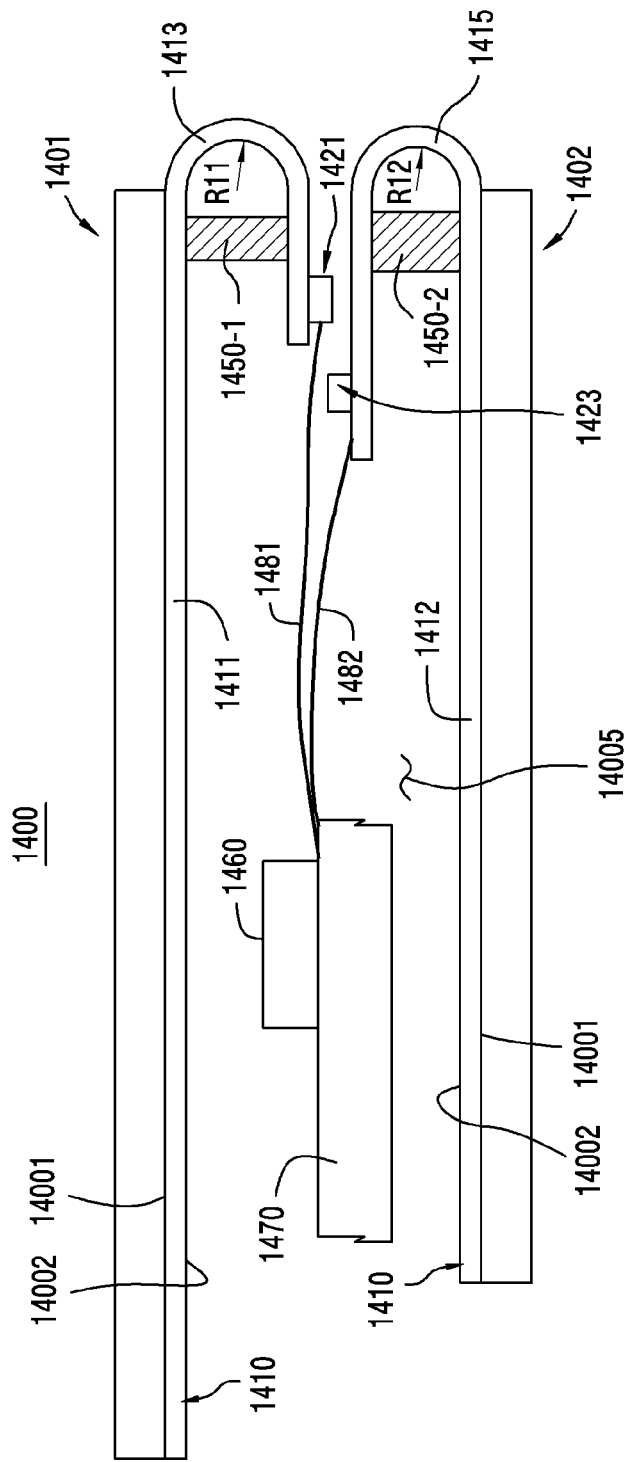
FIG. 14B illustrates a structure in which a flexible display is installed at an electronic device according to one embodiment of the disclosure.
Figure 15A:
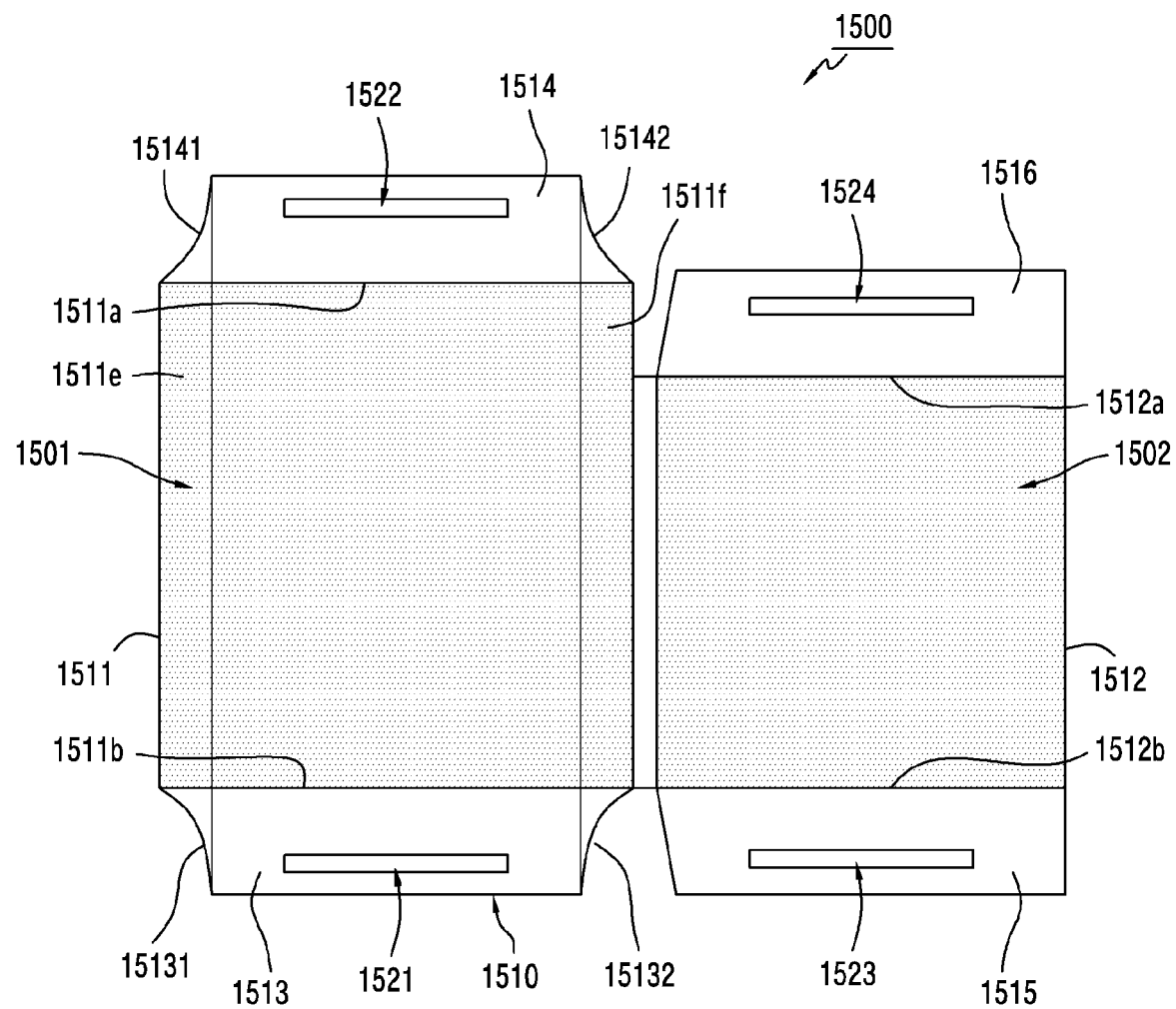
FIG. 15A illustrates an unfolded state of a flexible display including two display panels according to another embodiment of the disclosure.
Figure 15B:
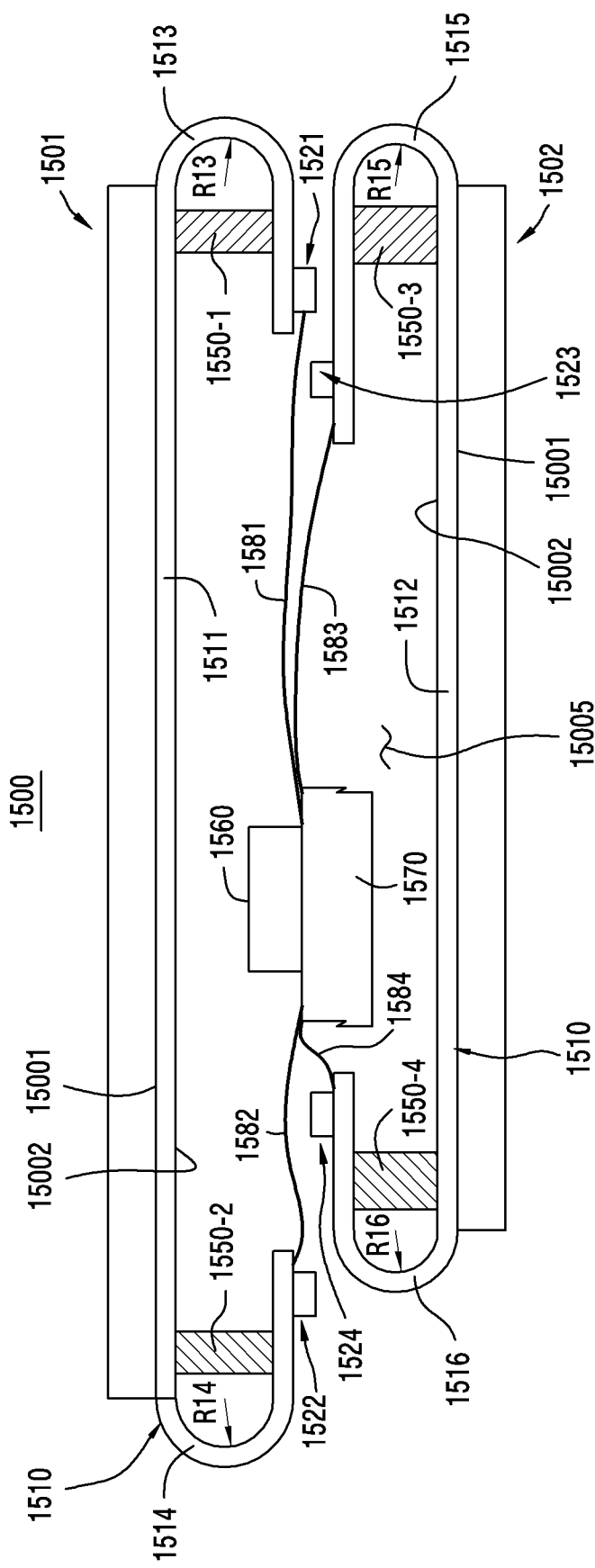
FIG. 15B illustrates a structure in which a flexible display is installed at an electronic device according to another embodiment of the disclosure.

FIGS. 12A and 12B illustrate an electronic device including a flexible display according to one embodiment of the disclosure. FIG. 12C is a schematic cross-sectional view of an electronic device including a flexible display according to one embodiment of the disclosure. FIG. 13A illustrates an unfolded state of a flexible display including two display panels according to one embodiment of the disclosure. FIG. 13B illustrates a structure in which a flexible display is installed at an electronic device according to one embodiment of the disclosure. FIG. 14A illustrates an unfolded state of a flexible display including two display panels according to another embodiment of the disclosure. FIG. 14B illustrates a structure in which a flexible display is installed at an electronic device according to another embodiment of the disclosure. FIG. 15A illustrates an unfolded state of a flexible display including display panels according to various embodiments of the disclosure. FIG. 15B illustrates a structure in which a flexible display is installed at an electronic device according to various embodiments of the disclosure.

Referring to FIGS. 12A, 12B, and 12C, an electronic device 1200 may include a housing 12000 forming the exterior thereof. The housing 12000 may include a first surface 12001 facing a first direction 12011 and a second surface 12002 facing a second direction 12012 opposite the first direction 12011. The housing 12000 may include a third surface 12003 surrounding the space between the first surface 12001 and the second surface 12002.

The first surface 12001 may be substantially flat. According to various embodiments, although not shown, the first surface 12001 may be a curved surface which is convex in the first direction 12011.

The first surface 12001 may be a rectangle including a first edge 12001a, a second edge 12001b, a third edge 12001c, and a fourth edge 12001d. For example, the first edge 12001a may be parallel to the second edge 12001b, and the third edge 12001c may be parallel to the fourth edge 12001d.

The second surface 12002 may be substantially flat. For example, the second surface 12002 may be parallel to the first surface 12001. According to various embodiments, although not shown, the second surface 12002 may be a curved surface which is convex in the second direction 12012.

The second surface 12002 may be a rectangle including a fifth edge 12002a, a sixth edge 12002b, a seventh edge 12002c, and an eighth edge 12002d. For example, the fifth edge 12002a may be parallel to the sixth edge 12002b, and the seventh edge 12002c may be parallel to the eighth edge 12002d.

The third surface 12003 may include a first lateral surface 12003-1 connecting the first edge 12001a and the fifth edge 12002a. The third surface 12003 may include a second lateral surface 12003-2 connecting the second edge 12001b and the sixth edge 12002b. The third surface 12003 may include a third lateral surface 12003-3 connecting the third edge 12001c and the seventh edge 12002c. The third surface 12003 may include a fourth lateral surface 12003-4 connecting the fourth edge 12001d and the eighth edge 12002d.

According to one embodiment, the third lateral surface 12003-3 or the fourth lateral surface 12003-4 may be a curved surface. According to one embodiment, the first lateral surface 12003-1 or the second lateral surface 12003-2 may be flat. According to various embodiments, although not shown, the first lateral surface 12003-1 or the second lateral surface 12003-2 may be a curved surface.

The electronic device 1200 may include a flexible display 12 disposed along at least some among the first surface 12001, the second surface 12002, and the lateral surface 12003. According to one embodiment, the flexible display 12 may be installed at the electronic device 1200 in a wrap-around manner in which the flexible display 12 is disposed along the third lateral surface 12003-3, the first surface 12001, the fourth lateral surface 12003-4, and the second surface 12002. For example, the flexible display 12 may include a first display panel 121 disposed along the third lateral surface 12003-3, the first surface 12001, and the fourth lateral surface 12003-4. The flexible display 12 may include a second display panel 122 disposed along the second surface 12002. According to various embodiments, the first display panel 121 may be separate from the second display panel 122.

Although not shown, when the flexible display 12 is seen while being unfolded (e.g. before being transformed), the first display panel 121 or the second display panel 122 may be rectangular. According to various embodiments, the width of the first display panel 121 may be designed to be identical to or different from the width of the second display panel 122 in a direction 12013 between the first edge 12001*a* and the second edge 12001*b*. For example, the space between the second display panel 122 and the fifth edge 12002*a* may be wider than the space between the first display panel 121 and the first edge 12001*a*.

According to various embodiments, the electronic device 1200 may include various electronic components (e.g. a receiver 1241, a camera, a sensor, etc.) installed between the first display panel 121 and the first edge 12001*a*. According to various embodiments, the electronic device 1200 may include various electronic components (e.g, a home button 1242, etc.) installed between the first display panel 121 and the second edge 12001*b*. According to various embodiments, the electronic device 1200 may include various electronic components (e.g. a camera 1243, a flash 1244, etc.) installed between the second display panel 122 and the fifth edge 12002*a*. Various other electronic components (not shown) may be installed at the electronic device 1200.

The flexible display 12 may be designed to have a structure in which the first display panel 121 and the second display panel 122 are arranged on one substrate. In one embodiment, referring to FIGS. 13A and 13B, a flexible display 1300 (e.g. the flexible display 12 in FIG. 12A) may include a substrate 1310, a first display panel 1301, a second display panel 1302, at least one first electronic component 1321, and at least one fourth electronic component 1324.

The substrate 1310 has a plate shape including two surfaces 13001 and 13002, and may be flexible. The substrate 1310 may include a first portion 1311 on the first display panel 1301 is mounted, and a second portion 1312 on which the second display panel 1302 is mounted. According to one embodiment, the first display panel 1301 and the second display panel 1302 may be mounted on the same surface 13001.

According to one embodiment, the first portion 1311 may typically be a rectangle including a first edge 1311*a*, a second edge 1311*b*, a third edge 1311*c*, and a fourth edge 1311*d*. According to one embodiment, the second portion 1312 may typically be a rectangle including a fifth edge 1312*a*, a sixth edge 1312*b*, a seventh edge 1312*c*, and an eighth edge 1312*d*. According to one embodiment, the substrate 1310 may include a portion 1315 connecting the fourth edge 1311*d* and the seventh edge 1312*c*.

The first portion 1311 may include a first edge region 1311*e* adjacent to the third edge 1311*c* and a second edge region 1311*f* adjacent to the fourth edge 1311*d*. The first portion 1311 may include a central region 1311*g* between the first edge region 1311*e* and the second edge region 1311*f*.

According to one embodiment, the substrate 1310 may include a third portion 1313 extending from the second edge 1311*b* of the first portion 1311. The at least one first electronic component 1321 may be mounted on the third portion 1313. According to one embodiment, the substrate 1310 may include a sixth portion 1316 extending from the fifth edge 1312*a* of the second portion 1312. The at least one fourth electronic component 1324 may be mounted on the sixth portion 1316. The at least one first electronic component 1321 or fourth electronic component 1324 may be mounted on one of the two surfaces (reference numerals "13001" and "13002" in FIG. 13B) of the substrate 1310.

Referring to FIG. 13B, in one embodiment, the flexible display 1300 may be installed at an electronic device e.g, reference numeral "1200" in FIG. 12A) in a wrap-around manner. A part of the first display panel 1301, which covers the first edge region 1311*e*, may be disposed along at least a part of the third lateral surface (e.g. reference numeral "12003-3" in FIG. 12A), and may be exposed through the third lateral surface (e.g. reference numeral "12003-3" in FIG. 12A). A part of the first display panel 1301, which covers the second edge region 1311*f*, may be disposed along at least a part of the fourth lateral surface (e.g. reference numeral "12003-4" in FIG. 12A), and may be exposed through the fourth lateral surface (e.g. reference numeral "12003-4" in FIG. 1.2A). A part of the first display panel 1301, which covers the central region 1311*g*, may be disposed along the first surface (e.g. reference numeral "12001" in FIG. 12A), and may be exposed through the first surface 12001. The second display panel 1302, which covers the second portion 1312, may be disposed along the second surface (e.g. reference numeral "12002" in FIG. 12A), and may be exposed through the second surface (e.g. reference numeral "12002" in FIG. 12A).

Referring to FIG. 13B, in one embodiment, the third portion 1313 and the sixth portion 1316 may be roundly bent and inserted in the inner space of an electronic device (e.g. reference numeral "1200" in FIG. 12A). Therefore, the at least one first electronic component 1321 mounted on the third portion 1313 and the at least one fourth electronic component 1324 mounted on the sixth portion 1316 are also positioned in the inner space of the electronic device 1200.

According to one embodiment, the third portion 1313 may be bent to a ninth curvature radius R9 (e.g. 10 mm or less). The sixth portion 1316 may be bent to a tenth curvature radius R10 (10 mm or less). According to various embodiments, the ninth curvature radius R9 and the tenth curvature radius R10 may be designed to be identical to or different from each other.

According to various embodiments, the electronic device (e.g. reference numeral "1200" in FIG. 12A) may include a support member 1350-1 for maintaining the bent form of the third portion 1313. The electronic device (reference numeral "1200" in FIG. 12A) may include a support member 1350-2 for maintaining the bent form of the sixth portion 1316. According to various embodiments, the support members 1350-1 and 1350-2 are similar or identical to the second support member 750 in FIG. 7C, and thus a detailed description thereof will be omitted.

According to one embodiment, the third portion 1313 may be a rectangle having the same width as the width (reference numeral "W" in FIG. 13*a*) of the first portion 1311 and extending from the second edge 1311*b*. The third portion 1313 may include a third edge region 1313*a* connected to the first edge region 1311*e* and a fourth edge region 1313*b* connected to the second edge region 1311*f*. The first edge region 1311*e* and a part of the first display panel 1301 covering the same are arranged as curved surfaces along the third lateral surface 12003-3 of the electronic device (e.g, reference numeral "1200" in FIG. 12A). Thus, the third edge region 1313*a* of the third portion 1313 may make it difficult to roundly bend the third portion 1313 and insert the third portion into the inner space of the electronic device 1200. The second edge region 1311*f* and a part of the first display panel 1301 covering the same are arranged as curved surfaces along the fourth lateral surface 12003-4 of the electronic device 1200. Thus, the fourth edge region 1313*b* of the bird portion 1313 may make it difficult to roundly bend the third portion 1313 and insert the third portion into the inner space of the electronic device 1200. According to various embodiments, if the third portion 1313 is inserted into the inner space of the electronic device 1200, the third edge region 1313*a* and the fourth edge region 1313*b* may be distorted, and thus it may be difficult to arrange the third portion 1313 in a bent form with a preconfigured curvature radius. According to one embodiment, although not shown, by making a design for removing a part of each of the third edge region 1313*a* and the fourth edge region 1313*b*, the third portion 1313 can be roundly bent and easily inserted into the inner space of the electronic device 1200.

The electronic device (e.g. reference numeral "1200" in FIG. 12A) may include a PCB 1370 disposed in a space 13005 formed by the flexible display 1300 as illustrated in FIG. 13B. The electronic device 1200 may include an electrical connection means (e.g. an FPCB 1381) for electrically connecting the PCB 1370 (or a control circuit 1360 mounted on the PCB 1370) and the at least one first electronic component 1321. The electronic device 1200 may include an electrical connection means an FPCB 1382) for electrically connecting the PCB 1370 (or a control circuit 1360) and the at least one fourth electronic component 1324.

According to one embodiment, the at least one first electronic component 1321 (e.g. the DDI) may control the operation of the first display panel 1301, based on a signal from the control circuit 1360. For example, the at least one fourth electronic component 1324 (e.g. the DDI) may control the operation of the second display panel 1302, based on a signal from the control circuit 1360.

According to another embodiment, referring to FIGS. 14A and 14B, a flexible display 1400 (e.g. the flexible display 12 in FIG. 12A) may include a substrate 1410, a first display panel 1401, a second display panel 1402, at least one first electronic component 1421, and at least one third electronic component 1423.

The substrate 1410 has a plate shape including two surfaces 14001 and 14002, and may be flexible. The substrate 1410 may include a first portion 1411 on the first display panel 1401 is mounted, and a second portion 1412 on which the second display panel 1402 is mounted. According to one embodiment, the first display panel 1401 and the second display panel 1402 may be mounted on the same surface 14001.

According to various embodiments, the first portion 1411 is similar or identical to the first portion 1311 of the flexible display 1300 in FIGS. 13A and 13B, and thus a detailed description thereof will be omitted. According to various embodiments, the second portion 1412 is similar or identical to second portion 1312 of the flexible display 1300 in FIGS. 13A and 13B, and thus a detailed description thereof will be omitted.

According to various embodiments, the substrate 1410 may include a third portion 1413 extending from a second edge 1411*b* of the first portion 1411. The at least one first electronic component 1421 may be mounted on the third portion 1413.

According to one embodiment, the substrate 1410 may include a fifth portion 1415 extending a sixth edge 1412*b* of the second portion 1412. The at least one third electronic component 1423 may be mounted on the fifth portion 1415. The at least one first electronic component 1421 or third electronic component 1423 may be mounted on one of the two surfaces (reference numerals "14001" and "14002" in FIG. 14B) of the substrate 1410.

Referring to FIG. 14B, in one embodiment, the flexible display 1400 may be installed at the electronic device (e.g. reference numeral "1200" in FIG. 12A) in a wrap-around manner. The third portion 1413 and the fifth portion 1415 may be roundly bent and inserted into the inner space of the electronic device (e.g. reference numeral "1200" in FIG. 12A). Therefore, the at least one first electronic component 1421 mounted on the third portion 1413 and the at least one third electronic component 1423 mounted on the fifth portion 1415 may also be positioned in the inner space of the electronic device 1200.

According to one embodiment, the third portion 1413 may be bent to an eleventh curvature radius R11 (e.g. 10 mm or less). The fifth portion 1415 may be bent to a twelfth curvature radius R12 (10 mm or less). According to various embodiments, the eleventh curvature radius R11 and the twelfth curvature radius R12 may be designed to be identical to or different from each other.

According to various embodiments, the electronic device (e.g. reference numeral "1200" in FIG. 12A) may include a support member 1450-1 (e.g. reference numeral "1350-1" in FIG. 13B) for maintaining the bent form of the third portion 1413. The electronic device 1200 may include a support member 1450-2 for maintaining the bent form of the fifth portion 1415.

According to one embodiment, referring to FIG. 14A, the third portion 1413 may be designed to have a structure 14131 in which at least a part of the region thereof connected to a first edge region 1411*e* (e.g. reference numeral "1311*e*" in FIG. 13A) is removed. The third portion 1413 may be designed to have a structure 14132 in which at least a part of the region thereof connected to a second edge region 1411*f* (e.g. reference numeral "1311*f*" in FIG. 13A) is removed. These structures 14131 and 14132 may make it easy to roundly bend the third portion 1413 to a preconfigured curvature radius and insert the same into the inner space of the electronic device 1200.

The electronic device (e.g. reference numeral "1200" in FIG. 12A) may include a PCB 1470 disposed in a space 14005 formed by the flexible display 1400 as illustrated in FIG. 1413. The electronic device 1200 may include an electrical connection means (e.g, an FPCB 1481) for electrically connecting the PCB 1470 (or a control circuit 1460) and the at least one first electronic component 1421. The electronic device 1200 may include an electrical connection means (e.g. an FPCB 1482) for electrically connecting the PCB 1470 (or the control circuit 1460) and the at least one third electronic component 1423.

According to one embodiment, the at least one first electronic component 1421 (e.g. a DDI) may control the operation of the first display panel 1401, based on a signal from the control circuit 1460. The at least one third electronic component 1423 (e.g. a DDI) may control the operation of the second display panel 1402, based on a signal from the control circuit 1460.

According to various embodiments, referring to FIGS. 15A and 15B, a flexible display 1500 (e.g. the flexible display 12 in FIG. 12A) may include a substrate 1510, a first display panel 1501, a second display panel 1502, at least one first electronic component 1521, at least one second electronic component 1522, at least one third electronic component 1523, and at least one fourth electronic component 1524.

The substrate 1510 has a plate shape including two surfaces 15001 and 15002, and may be flexible. The substrate 1510 may include a first portion 1511 on which the first display panel 1501 is mounted, and a second portion 1512 on which the second display panel 1502 is mounted. According to one embodiment, the first display panel 1501 and the second display panel 1502 may be mounted on the same surface 15001.

According to various embodiments, the first portion 1511 is similar or identical to the first portion 1311 of the flexible display 1300 in FIGS. 13A and 13B, and thus a detailed description thereof will be omitted. According to various embodiments, the second portion 1512 is similar or identical to the second portion 1312 of the flexible display 1300 in FIGS. 13A and 13B, and thus a detailed description thereof will be omitted.

According to various embodiments, the substrate 1510 may include a third portion 1513 extending from a second edge 1511b of the first portion 1511. The at least one first electronic component 1521 may be mounted on the third portion 1513.

According to one embodiment, the substrate 1510 may include a fourth portion 1514 extending from a first edge 1511a of the first portion 1511. The at least one second electronic component 1522 may be mounted on the fourth portion 1514.

According to one embodiment, the substrate 1510 may include a fifth portion 1515 extending a sixth edge 1512b of the second portion 1512. The at least one third electronic component 1523 may be mounted on the fifth portion 1515.

According to one embodiment, the substrate 1510 may include a sixth portion 1516 extending from a fifth edge 1512a of the second portion 1512. The at least one fourth electronic component 1524 may be mounted on the sixth portion 1516.

According to various embodiments, the at least one first electronic component 1521, the at least one second electronic component 1522, and the at least one third electronic component 1523, and the at least one fourth electronic component 1524 may be mounted on one of the two surfaces 15001 and 15002 of the substrate 1510.

Referring to FIG. 15B, in one embodiment, the flexible display 1500 may be installed at the electronic device (e.g. reference numeral "1200" in FIG. 12A) in a wrap-around manner. The third portion 1513, the fourth portion 1514, the fifth portion 1515, and the sixth portion 1516 may be roundly bent and inserted into the inner space of the electronic device (e.g. reference numeral "1200" in FIG. 12A). Therefore, the electronic components 1521, 1522, 1523, and 1524 mounted on the third portion 1513, the fourth portion 1514, the fifth portion 1515, and the sixth portion 1516, respectively, may also be positioned in the inner space of the electronic device 1200.

According to one embodiment, the third portion 1513 may be bent to a thirteenth curvature radius R13. The fourth portion 1514 may be bent to a fourteenth curvature radius 1214 (e.g. 10 mm or less). The fifth portion 1515 may be bent to a fifteenth curvature radius 1215. The sixth portion 1516 may be bent to a sixteenth curvature radius R16. At least some among the thirteenth curvature radius R13, the fourteenth curvature radius R14, the fifteenth curvature radius R15, and the sixteenth curvature radius R16 may be designed to be identical to or different from each other.

According to various embodiments, the electronic device (e.g. reference numeral "1200" in FIG. 12A) may include a support member 1550-1 for maintaining the bent form of the third portion 1513. The electronic device 1200 may include a support member 1550-2 for maintaining the bent form of the fourth portion 1514. The electronic device 1200 may include a support member 1550-3 for maintaining the bent form of the fifth portion 1515. The electronic device 1200 may include a support member 1550-4 for maintaining the bent form of the sixth portion 1516.

According to one embodiment, referring to FIG. 15B, the third portion 1513 may be designed to have a structure 15131 in which at least a part of the region thereof connected to a first edge region 1511e (e.g. reference numeral "1311e" in FIG. 13A) is removed. The third portion 1513 may be designed to have a structure 15132 in which at least a part of the region thereof connected to a second edge region 1511f (e.g. reference numeral "1311f" in FIG. 13A) is removed. These structures 15131 and 15132 may make it easy to roundly bend the third portion 1513 to a preconfigured curvature radius and insert the same into the inner space of the electronic device 1200.

According to one embodiment, the fourth portion 1514 may be designed to have a structure 15141 in which at least a part of the region thereof connected to the first edge region 1511e (e.g, reference numeral "1311e" in FIG. 13A) is removed. The fourth portion 1514 may be designed to have a structure 15142 in which at least a part of the region thereof connected to the second edge region 1511f (e.g. reference numeral "1311f" in FIG. 13A) is removed. These structures 15141 and 15142 may make it easy to roundly bend the fourth portion 1514 to a preconfigured curvature radius and insert the same into the inner space of the electronic device 1200.

The electronic device (e.g. reference numeral "1200" in FIG. 12A) may include a PCB 1570 disposed in a space 15005 formed by the flexible display 1500 as illustrated in FIG. 15B. The electronic device 1200 may include an electrical connection means (e.g. an FPCB 1581) for electrically connecting the PCB 1570 (or a control circuit 1560) and the at least one first electronic component 1521. The electronic device 1200 may include an electrical connection means (e.g. an FPCB 1582) for electrically connecting the PCB 1570 (or the control circuit 1560) and the at least one second electronic component 1522. The electronic device 1200 may include an electrical connection means (e.g. an FPCB 1583) for electrically connecting the PCB 1570 (or the control circuit 1560) and the at least one third electronic component 1523. The electronic device 1200 may include an electrical connection means (e.g. an FPCB 1584) for electrically connecting the PCB 1570 (or the control circuit 1560) and the at least one fourth electronic component 1524.

According to one embodiment, the at least one first electronic component 1521 (e.g. a DDI) or the at least one second electronic component 1522 (e.g. a DDI) may control the operation of the first display panel 1501, based on a signal from the control circuit 1560. The at least one third electronic component 1523 (e.g, a DDI) or the at least one fourth electronic component 1524 (e.g. a DDI) may control the operation of the second display panel 1502, based on a signal from the control circuit 1560.

According to one embodiment of the disclosure, an electronic device may include: a housing; and a display received in at least a part of the housing. The display may include a flexible substrate. The display may include a first light-emitting unit, and the first light-emitting unit may be disposed in a first region on the substrate, may have a first attribute, and may include multiple first pixels. The display may include a second light-emitting unit, and the second light-emitting unit may be disposed in a second region on the substrate, may have a second attribute different from the first attribute, and may include multiple second pixels.

According to one embodiment of the disclosure, the first light-emitting unit may be disposed such that the multiple first pixels have a first resolution as at least a part of the first attribute. The second light-emitting unit may be disposed such that the multiple second pixels have a second resolution, as at least a part of the second attribute, lower than the first resolution.

According to one embodiment of the disclosure, the housing may include: a first surface facing a first direction; a second surface facing a second direction opposite the first direction; and a third surface including a curved surface and surrounding a space between the first surface and the second surface. The substrate may be disposed along at least a part of the housing. The first light-emitting unit may be disposed between the first surface of the housing and the first region on the substrate. The second light-emitting unit may be disposed between the second surface of the housing and the second region on the substrate.

According to one embodiment of the disclosure, the display may include at least one display driver configured to control the first light-emitting unit and the second light-emitting unit. The at least one display driver may be disposed in a third region other than the first region and the second region on the substrate.

According to one embodiment of the disclosure, the third region may extend to be bent from the first region or the second region and may be disposed in the space between the first surface and the second surface.

According to one embodiment of the disclosure, the substrate may be disposed along the third surface of the housing, and may further include a fourth region connecting the first region and the second region.

According to one embodiment of the disclosure, the first light-emitting unit may be further disposed between the third surface of the housing and the fourth region on the substrate.

According to one embodiment of the disclosure, the first light-emitting unit, the second light-emitting unit, and the at least one display driver may all be arranged on one of both surfaces of the substrate.

According to one embodiment of the disclosure, the display may further include a through-hole formed in the fourth region, and the electronic device may further include an electronic component disposed in the housing and aligned with the through-hole.

According to one embodiment of the disclosure, the curvature radius of the third region on the substrate may be smaller than the curvature radius of the fourth region on the substrate.

According to one embodiment of the disclosure, the electronic device may include a processor disposed in the housing and electrically connected to the at least one display driver. The at least one display driver may be configured to, based at least on a signal from the processor, drive a first light-emitting unit at a first frame rate as at least a part of the first attribute and derive the second light-emitting unit at a second frame rate, as at least a part of the second attribute, lower than the first frame rate.

According to one embodiment of the disclosure, the electronic device may further include: a touch-sensing circuit disposed in the housing; and a conductive pattern electrically connected to the touch-sensing circuit and disposed in the display or between the display and a transparent substrate forming at least a part of the housing.

According to one embodiment of the disclosure, the electronic device may further include a wireless communication circuit disposed in the housing. The electronic device may include a conductive pattern electrically connected to the wireless communication circuit and disposed in the display or between the display and the transparent substrate forming the at least a part of the housing.

According to one embodiment of the disclosure, the conductive pattern may be arranged in a mesh type along the first region or the second region.

According to one embodiment of the disclosure, the electronic device may include at least one optical sensor disposed on at least a part of the rear surface of the display.

According to one embodiment of the disclosure, the electronic device may include a pressure sensor disposed in the display or on at least a part of the rear surface of the display.

According to one embodiment of the disclosure, the first light-emitting unit or the second light-emitting unit may include an OLED.

Meanwhile, the above-mentioned embodiments of the disclosure may be established as a program which can be executed in a computer, and may be implemented in a generic-purpose digital computer which operates the program, using a computer-readable recording medium. Further, the structure of data used in the above-mentioned embodiments of the disclosure can be recorded in the computer-readable recording medium through multiple means. The computer-readable recording medium includes storage media, such as a magnetic storage medium (e.g. ROM, a floppy disk, a hard disk, or the like) and an optical readable medium (e.g. a CD-ROM, a DVD, or the like).

The disclosure has been described above with reference to preferred embodiments thereof. A person skilled in the art to which the disclosure belongs will understand that the disclosure may be implemented in modified forms without departing from the essential characteristics of the disclosure. Therefore, the embodiments disclosed herein should be considered from an illustrative point of view rather than a limitative point of view. The scope of the disclosure is found not in the above description but in the accompanying claims, and all differences falling within the scope equivalent to the claims should be construed as being included in the disclosure.

The invention claimed is:

1. An electronic device comprising:
   a housing comprising a first surface facing a first direction, a second surface facing a second direction opposite the first direction, and a third surface surrounding a space between the first surface and the second surface; and
   a display received in at least a part of the housing, wherein the display comprises:
   a flexible substrate;
   a first light-emitting unit which is disposed in a first region on the substrate, has a first attribute, and comprises multiple first pixels, the first region being disposed along at least a part of the first surface;
   a second light-emitting unit which is disposed in a second region on the substrate, has a second attribute different from the first attribute, and comprises multiple second pixels, the second region being disposed along at least a part of the second surface; and
   at least one display driver which is disposed in a third region on the substrate and configured to control the first light-emitting unit and the second light-emitting unit,
   wherein a fourth region of the substrate electrically connects the first light-emitting unit and the second light-emitting unit and extends to be bent from the first region to the second region along at least a part of the third surface, and
   wherein a fifth region of the substrate electrically connects the first light-emitting unit and the at least one display driver and extends to be bent from the first region to the third region such that the third region and the fifth region are disposed in the space between the first surface and the second surface.

2. The electronic device of claim 1, wherein the first light-emitting unit is disposed such that the multiple first pixels have a first resolution as at least a part of the first attribute, and the second light-emitting unit is disposed such that the multiple second pixels have a second resolution, as at least a part of the second attribute, lower than the first resolution.

3. The electronic device of claim 1, wherein the third surface comprising a curved surface
the first light-emitting unit is disposed between the first surface of the housing and the first region of the substrate, and
the second light-emitting unit is disposed between the second surface of the housing and the second region on the substrate.

4. The electronic device of claim 3, wherein the first light-emitting unit is further disposed between the third surface of the housing and the fourth region on the substrate.

5. The electronic device of claim 1, wherein the first light-emitting unit, the second light-emitting unit, and the at least one display driver are all arranged on one of both surfaces of the substrate.

6. The electronic device of claim 1, further comprising:
a through-hole formed in the fourth region of the substrate; and
an electronic component disposed in the housing and aligned with the through-hole.

7. The electronic device of claim 1, wherein a curvature radius of the third region of the substrate is smaller than a curvature radius of the fourth region of the substrate.

8. The electronic device of claim 1, further comprising a processor disposed in the housing and electrically connected to the at least one display driver,
wherein, the at least one display driver is configured to, based at least on a signal from the processor, drive the first light-emitting unit at a first frame rate as at least a part of the first attribute and drive the second light-emitting unit at a second frame rate, as at least a part of the second attribute, lower than the first frame rate.

9. The electronic device of claim 1, further comprising:
a touch-sensing circuit disposed in the housing; and
a conductive pattern electrically connected to the touch-sensing circuit and disposed in the display or between the display and a transparent substrate forming at least a part of the housing.

10. The electronic device of claim 1, further comprising:
a wireless communication circuit disposed in the housing; and
a conductive pattern electrically connected to the wireless communication circuit and disposed in the display or between the display and a transparent substrate forming the at least a part of the housing.

11. The electronic device of claim 1, further comprising a pressure sensor disposed in the display or on at least a part of a rear surface of the display.

12. The electronic device of claim 1, wherein the first light-emitting unit or the second light-emitting unit comprises an OLED.

13. The electronic device of claim 9, further comprising a processor disposed in the housing and electrically connected to the touch-sensing circuit,
wherein the touch-sensing circuit is configured to activate at least a part of the conductive pattern based on a signal from the processor.

14. The electronic device of claim 10, wherein the conductive pattern is disposed in a sixth region on the substrate, and
wherein the sixth region is separate from the first region and the second region.

15. The electronic device of claim 10, wherein the conductive pattern is arranged in a mesh type along the first region or the second region.

16. The electronic device of claim 1, further comprising at least one optical sensor disposed in at least a part of a rear surface of the display.

17. The electronic device of claim 16, wherein the at least one optical sensor is configured to detect light from an outside through a through-hole or a light-transmitting region formed in a sixth region of the substrate.

* * * * *